(12) United States Patent
Amo

(10) Patent No.: US 10,211,348 B2
(45) Date of Patent: Feb. 19, 2019

(54) SEMICONDUCTOR DEVICE AND A MANUFACTURING METHOD THEREOF

(71) Applicant: Renesas Electronics Corporation, Koutou-ku, Tokyo (JP)

(72) Inventor: Atsushi Amo, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/914,196

(22) Filed: Mar. 7, 2018

(65) Prior Publication Data

US 2018/0198001 A1    Jul. 12, 2018

Related U.S. Application Data

(60) Continuation of application No. 15/661,649, filed on Jul. 27, 2017, now Pat. No. 9,954,120, which is a
(Continued)

(30) Foreign Application Priority Data

Mar. 11, 2015    (JP) ................................ 2015-048719

(51) Int. Cl.
     *H01L 29/94*      (2006.01)
     *H01L 27/06*      (2006.01)
     (Continued)

(52) U.S. Cl.
CPC ........ *H01L 29/945* (2013.01); *G11C 16/0466* (2013.01); *H01L 27/0629* (2013.01);
(Continued)

(58) Field of Classification Search
CPC ............ H01L 27/11573; H01L 27/115; H01L 27/11526; H01L 27/11536;
(Continued)

(56) References Cited

U.S. PATENT DOCUMENTS 6,479,852 B1 * 11/2002 Wu .................... H01L 27/10876
                                                                         257/301
6,829,127 B1 * 12/2004 Liu ...................... H01L 27/115
                                                                         257/296
(Continued)

FOREIGN PATENT DOCUMENTS

| JP | 2001-085633 A | 3/2001 |
|----|---------------|--------|
| JP | 2003-309182 A | 10/2003 |
| JP | 2009-088241 A | 4/2009 |
| JP | 2014-154790 A | 8/2014 |

OTHER PUBLICATIONS

Extended European Search Report, dated Jan. 18, 2017, in European Application No. 16159656.4.
(Continued)

*Primary Examiner* — Walter H Swanson
(74) *Attorney, Agent, or Firm* — Shapiro, Gabor and Rosenberger, PLLC

(57) ABSTRACT

In a semiconductor device including a split gate type MONOS memory, and a trench capacitor element having an upper electrode partially embedded in trenches formed in the main surface of a semiconductor substrate, merged therein, the flatness of the top surface of the upper electrode embedded in the trench is improved. The polysilicon film formed over the semiconductor substrate to form a control gate electrode forming a memory cell of the MONOS memory is embedded in the trenches formed in the main surface of the semiconductor substrate in a capacitor element formation region, thereby to form the upper electrode including the polysilicon film in the trenches.

4 Claims, 40 Drawing Sheets

Related U.S. Application Data division of application No. 15/011,510, filed on Jan. 30, 2016, now Pat. No. 9,755,086.

(51) Int. Cl.
  *H01L 29/66* (2006.01)
  *H01L 29/423* (2006.01)
  *H01L 27/11573* (2017.01)
  *G11C 16/04* (2006.01)
  *H01L 29/792* (2006.01)

(52) U.S. Cl.
  CPC .. *H01L 27/11573* (2013.01); *H01L 29/42344* (2013.01); *H01L 29/66181* (2013.01); *H01L 29/66833* (2013.01); *H01L 29/792* (2013.01)

(58) Field of Classification Search
  CPC ......... H01L 27/11541; H01L 27/11565; H01L 27/15168; H01L 27/10876; H01L 27/10879; H01L 29/945; H01L 29/66181
  See application file for complete search history.

(56) References Cited

U.S. PATENT DOCUMENTS

| | | | |
|---|---|---|---|
| 7,015,090 | B2 | 3/2006 | Okazaki et al. |
| 8,932,925 | B1 | 1/2015 | Hong et al. |
| 2004/0038492 | A1 | 2/2004 | Okazaki et al. |
| 2006/0192243 | A1* | 8/2006 | Bhattacharyya ...... H01L 27/115 257/315 |
| 2006/0249773 | A1* | 11/2006 | Kai ................... H01L 21/02178 257/301 |
| 2010/0025753 | A1 | 2/2010 | Terai |
| 2010/0232212 | A1 | 9/2010 | Anderson et al. |
| 2010/0238728 | A1 | 9/2010 | Leung |
| 2011/0260228 | A1 | 10/2011 | Kawashima |
| 2016/0064397 | A1* | 3/2016 | Hayashi .............. H01L 27/1157 438/275 |

OTHER PUBLICATIONS

Office Action, dated Jul. 31, 2018, in Japanese Patent Application No. 2015-048719.

* cited by examiner

FIG. 41

| | OPERATION METHOD WRITE / ERASE | WRITE OPERATION VOLTAGE (V) Vmg/Vs/Vcg/Vd/Vb | ERASE OPERATION VOLTAGE (V) Vmg/Vs/Vcg/Vd/Vb | READ OPERATION VOLTAGE (V) Vmg/Vs/Vcg/Vd/Vb |
|---|---|---|---|---|
| A | SSI (WRITE) / BTBT (ERASE) | 10/5/1/0.5/0 | -6/6/0/open/0 | 0/0/1.5/1.5/0 |
| B | SSI (WRITE) / FN (ERASE) | 10/5/1/0.5/0 | 12/0/0/0/0 | 0/0/1.5/1.5/0 |
| C | FN (WRITE) / BTBT (ERASE) | -12/0/0/0/0 | -6/6/0/open/0 | 0/0/1.5/1.5/0 |
| D | FN (WRITE) / FN (ERASE) | -12/0/0/0/0 | 12/0/0/0/0 | 0/0/1.5/1.5/0 |

SEMICONDUCTOR DEVICE AND A MANUFACTURING METHOD THEREOF

CROSS-REFERENCE TO RELATED APPLICATIONS

The disclosure of Japanese Patent Application No. 2015-048719 filed on Mar. 11, 2015 including the specification, drawings and abstract is incorporated herein by reference in its entirety.

BACKGROUND

The present invention relates to a semiconductor device and a manufacturing method thereof. The present invention is applicable to, for example, manufacturing of a semiconductor device having a nonvolatile memory and a capacitor element.

As an electrically writable/erasable nonvolatile semiconductor storage device, an EEPROM (Electrically Erasable and Programmable Read Only Memory) has been widely used. Such a storage device has a conductive floating gate electrode surrounded by an oxide film, or a trapping insulation film under the gate electrode of a MISFET. The storage device uses the charge accumulation state at the floating gate or the trapping insulation film as stored information, and read out the information as a threshold value of the transistor.

The trapping insulation film denotes an insulation film capable of accumulating electric charges. As one example thereof, mention may be made of a silicon nitride film. Implantation/discharge of electric charges into such a charge accumulation region causes each MISFET to be shifted in threshold value and to operate as a storage element. The nonvolatile storage devices using a trapping insulation film include a split gate type cell using a MONOS (Metal Oxide Nitride Oxide Semiconductor) film.

Whereas, as the formation method of a gate electrode, a so-called gate-last process is known in which after forming a dummy gate electrode over a substrate, the dummy gate electrode is replaced with a metal gate electrode, or the like. When the gate-last process is used, it is difficult to form a capacitor element in which the lower electrode is formed at the same height as that of the gate electrode, and the upper electrode is formed over the lower electrode.

In contrast, a capacitor element in which the semiconductor substrate is used as the lower electrode, and the upper electrode is formed at the same height as that of the gate electrode can be merged with a storage element, and the like formed using the gate-last process over the semiconductor substrate. In such a capacitor element, the upper electrode is partially embedded in the trenches formed in the main surface of the semiconductor substrate, so that the facing area of the upper electrode and the semiconductor substrate can be increased. This can increase the capacitance.

Patent Document 1 (Japanese Unexamined Patent Application Publication No. 2001-85633) describes a capacitor element in which a capacitance is generated between a substrate and a first gate over the substrate, and further, a capacitance is generated between the first gate and a second gate over the first gate.

Patent Document 2 (Japanese Unexamined Patent Application Publication No. 2003-309182) describes as follows: in a capacitor element for generating a capacitance between a substrate and an electrode over the substrate, the electrode is partially embedded in trenches in the top surface of the substrate.

Patent Document 3 (Japanese Unexamined Patent Application Publication No. 2014-154790) describes that a memory cell is formed using the gate-last process.

[Patent Document 1] Japanese Unexamined Patent Application Publication No. 2001-85633

[Patent Document 2] Japanese Unexamined Patent Application Publication No. 2003-309182

[Patent Document 3] Japanese Unexamined Patent Application Publication No. 2014-154790

SUMMARY

In a capacitor element in which trenches are formed in the main surface of the semiconductor substrate, and the electrode is partially embedded in the trenches, when the electrode has a small film thickness, embedding is incomplete. This causes the generation of residues, foreign matters, or the like.

Other objects and novel features will be apparent from the description of this specification and the accompanying drawings.

Summaries of the representative ones of the inventions disclosed in the present application will be described in brief as follows.

With a method for manufacturing a semiconductor device of one embodiment, the control gate electrode of a MONOS memory and the upper electrode in the trenches of a trench capacitor element are formed of the same conductor film.

Further, in a semiconductor device of another embodiment, the control gate electrode of the MONOS memory, and the upper electrode forming the trench capacitor element, and filling the insides of the trenches are formed of the same-layer film.

In accordance with one embodiment, it is possible to improve the reliability of the semiconductor device.

BRIEF DESCRIPTION OF THE DRAWINGS

FIG. 41 is a table showing one example of the application conditions of voltages to respective sites of a selection memory cell at the times of "write", "erase", and "read".

DETAILED DESCRIPTION

Figure 1:
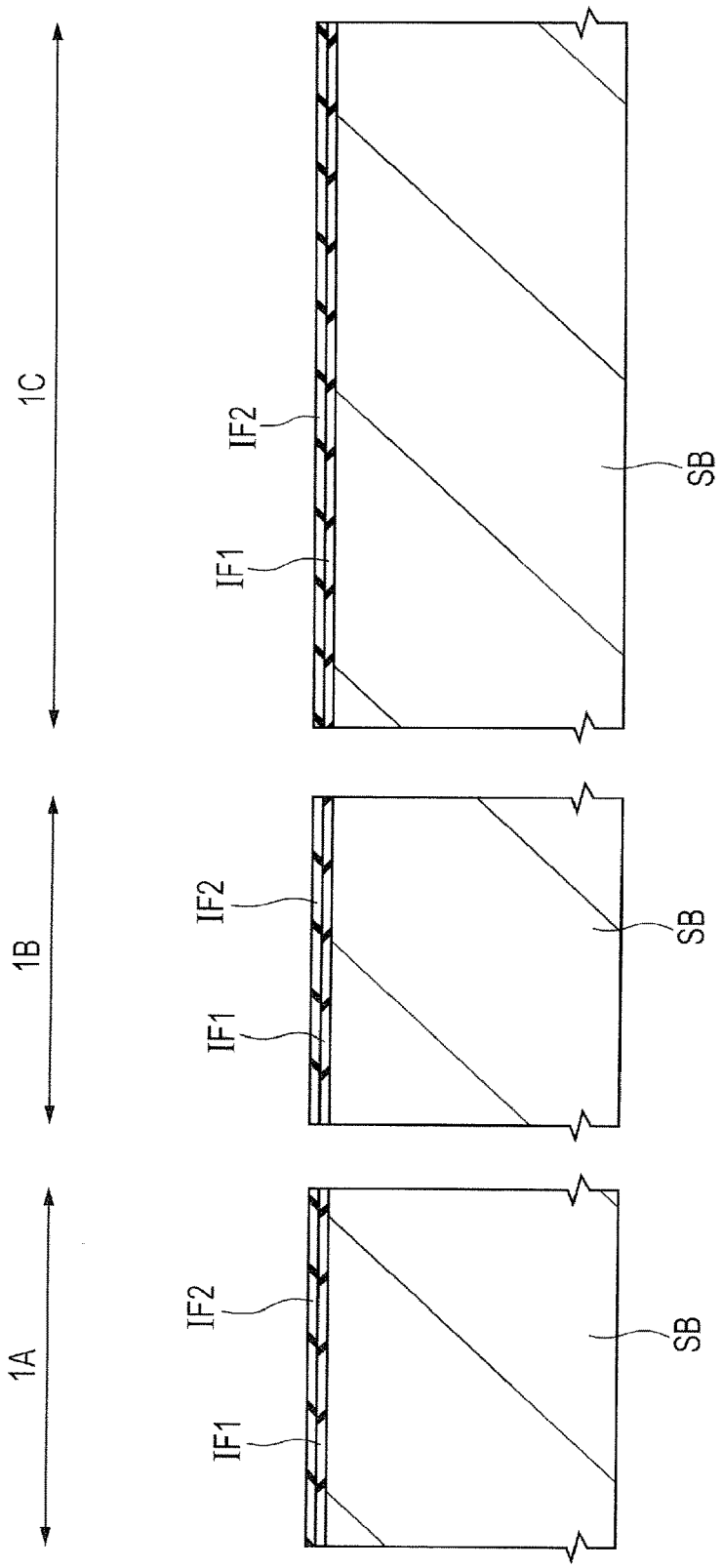
FIG. 1 is a cross sectional view of a semiconductor device of First Embodiment during a manufacturing step.

Below, the embodiments will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar part will not be repeated in principle unless otherwise required.

First Embodiment

Each semiconductor device of the present embodiment and the following embodiments is a semiconductor device including a nonvolatile memory (nonvolatile storage element, flash memory, or nonvolatile semiconductor storage device), and a capacitor element. In the present embodiment and the following embodiments, a nonvolatile memory will be described with reference to a memory cell based on an n channel type MISFET (MISFET: Metal Insulator Semiconductor Field Effect Transistor).

Further, the polarities (the polarity of each applied voltage and the polarity of carriers for write/erase/read) in the present embodiment and the following embodiments are for describing the operation in the case of a memory cell based on an n channel type MISFET. When a memory cell is based on a p channel type MISFET, by inverting all the polarities of applied potentials, the conductivity type of carriers, and the like, it is possible to obtain the same operation in principle.

<Regarding a Method for Manufacturing a Semiconductor Device>

A method for manufacturing a semiconductor device of the present embodiment will be described by reference to FIGS. 1 to 17.

FIGS. 1 to 15, and 17 are each a cross sectional view of the semiconductor device of the present embodiment during a manufacturing step. FIG. 16 is a planar layout of the semiconductor device of the present embodiment during a manufacturing step. FIGS. 1 to 15, and 17 each show cross sectional views of a memory cell region 1A, a peripheral circuit region 1B, and a capacitor element region 1C sequentially from the left side to the right side of each drawing. Respective drawings show how the memory cell of a nonvolatile memory is formed in the memory cell region 1A, how a low breakdown voltage MISFET is formed in the peripheral circuit region 1B, and how a trench type capacitor element is formed in the capacitor element region 1C, respectively. The memory cell region 1A, the peripheral circuit region 1B, and the capacitor element region 1C are regions arranged in a direction along the main surface of the semiconductor substrate.

Incidentally, the operation of the nonvolatile memory also requires a high breakdown voltage MISFET. However, the high breakdown voltage MISFET is not different from the low breakdown voltage MISFET except that the gate insulation film of the high breakdown voltage MISFET is equal in film thickness to the insulation film of the trench type capacitor element, and except that various implantation conditions may be different for respective optimizations. Accordingly, below, a description on the high breakdown voltage MISFET will be omitted in principle.

Herein, a description will be given to the case where n channel type MISFETs (a control transistor and a memory transistor) are formed in the memory cell region 1A. However, p channel type MISFETs (a control transistor and a memory transistor) can also be formed in the memory cell region 1A by inverting the conductivity type.

Similarly, herein, a description will be given to the case where an n channel type MISFET is formed in the peripheral circuit region 1B. However, a p channel type MISFET can also be formed in the peripheral circuit region 1B by inverting the conductivity type. Alternatively, both of an n channel type MISFET and a p channel type MISFET, namely, a CMISFET (Complementary Metal Insulator Semiconductor) can also be formed in the peripheral circuit region 1B.

Similarly, herein, a description will be given to the case where a capacitor element including a lower electrode (first electrode) including an n type well in the main surface of the semiconductor substrate, and an upper electrode (second electrode) formed of an n type semiconductor film formed over the semiconductor substrate is formed in the capacitor element region 1C. However, a capacitor element including a lower electrode including a p type well, and an upper electrode formed of a p type semiconductor film may also be formed.

In the manufacturing step of a semiconductor device, first, as shown in FIG. 1, a semiconductor substrate (semiconductor wafer) SB formed of, for example, a p type single crystal silicon (Si) having a specific resistance of about 1 to 10 Ωcm is provided. Subsequently, for example, a heat treatment is performed, thereby to form an insulation film IF1 formed of a silicon oxide film entirely over the main surface of the semiconductor substrate SB. Then, an insulation film IF2 formed of, for example, a silicon nitride film is formed over the insulation film IF1 using, for example, a CVD (Chemical Vapor Deposition) method.

Figure 2:
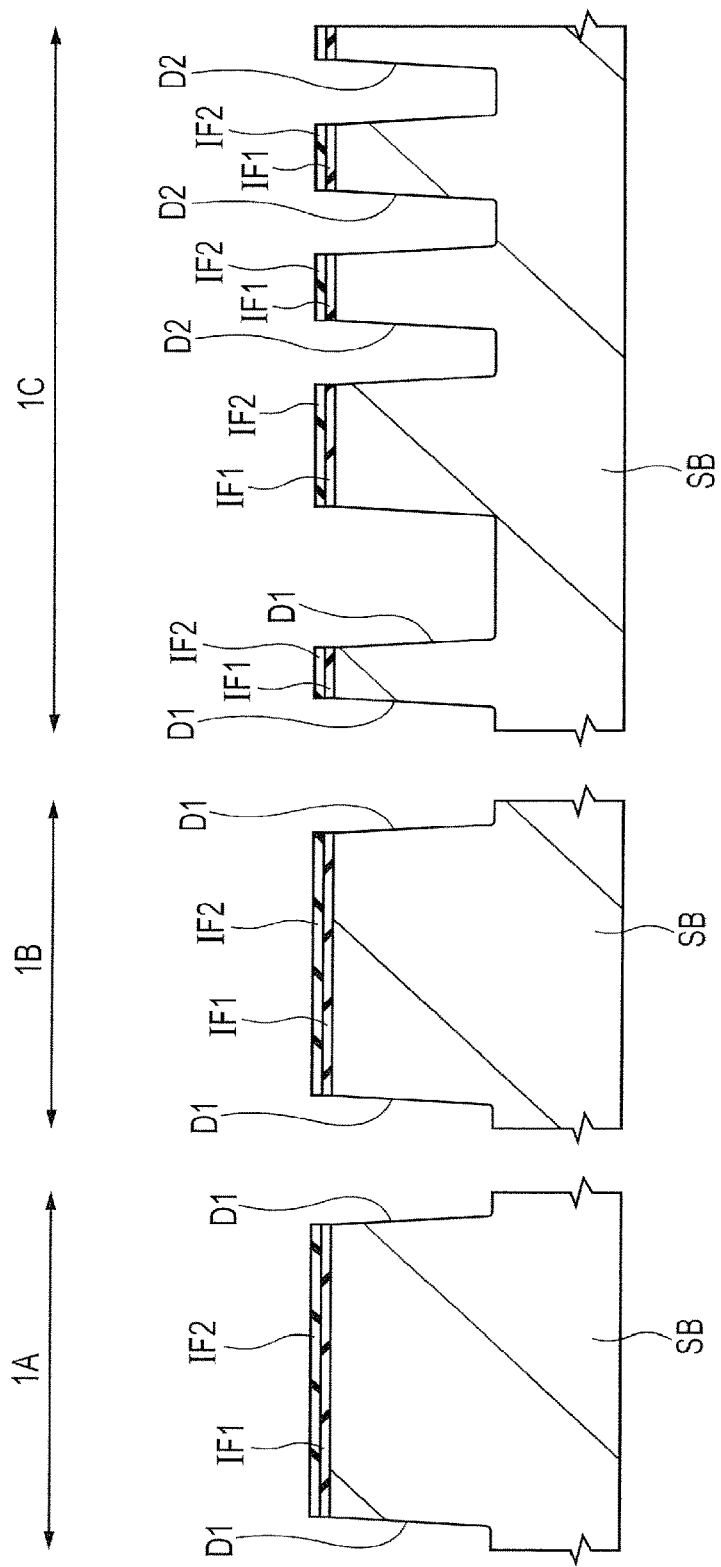
FIG. 2 is a cross sectional view of the semiconductor device during a manufacturing step following FIG. 1.

Then, as shown in FIG. 2, using a photolithography technology and a dry etching method, the insulation films IF2 and IF1, and the top surface of the semiconductor substrate SB are partially removed. In other words, openings penetrating through the lamination film formed of the insulation films IF2 and IF1 at a plurality of portions are formed. Thus, portions of the top surface of the semiconductor substrate SB immediately under the openings are removed. As a result, a plurality of trenches (concave parts or pit parts) D1 and a plurality of trenches D2 are formed in the top surface of the semiconductor substrate SB. The trenches D1 are formed in the memory cell region 1A, the peripheral circuit region 1B, and the capacitor element region 1C, respectively, and the trenches D2 are formed only in the capacitor element region 1C.

Each trench D2 extends in a first direction along the main surface of the semiconductor substrate SB. A plurality of trenches D2 are arranged side by side along the main surface of the semiconductor substrate SB, and in a second direction orthogonal to the first direction. In other words, a plurality of trenches D2 are formed in stripes. Incidentally, the layout of the trenches D2 is not limited to the shape of stripes, but may have the shape of dots, the shape of parallel crosses, or the like.

The trenches D1 and D2 are the concave parts formed in the same step, and reach to a depth of some midpoint in the semiconductor substrate SB. At this point, the top surface of the semiconductor substrate SB adjacent to the trench D1, and the top surface of the semiconductor substrate SB adjacent to the trench D2 are situated at the same height. Herein, it can be considered that the corner part of the interface between the bottom surface and the sidewall of each of the trenches D1 and D2 has roundness. However, the roundness of the corner part is relatively smaller.

Incidentally, herein, the insulation films IF2 and IF1, and the semiconductor substrate SB are processed, respectively, by one etching step. However, the following is also acceptable: for example, after processing the insulation film IF2 by a dry etching method, the insulation film IF1 is processed by a wet etching method; as a result, the top surface of the semiconductor substrate SB is exposed; subsequently, the trenches D1 and D2 are formed using a dry etching method.

Figure 3:
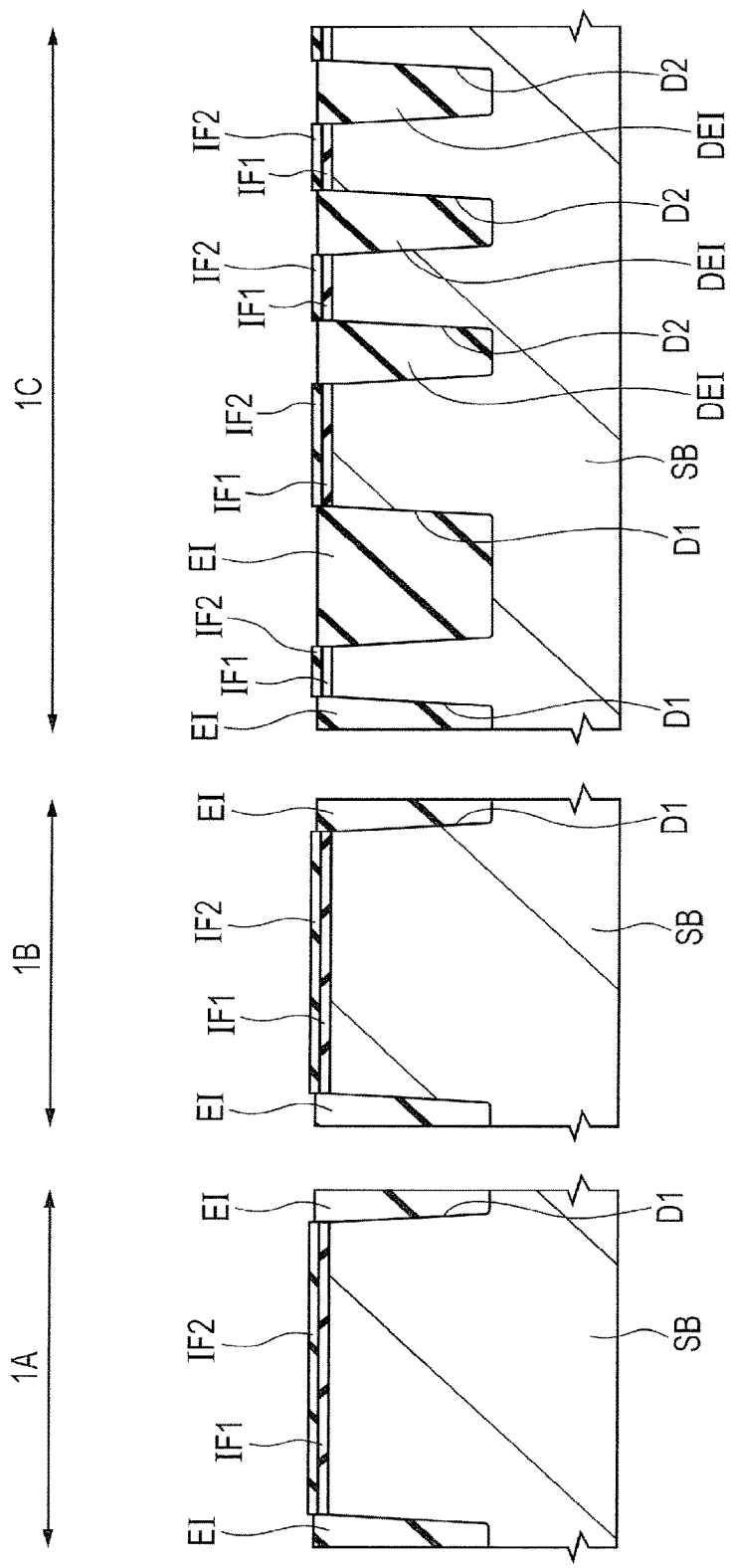
FIG. 3 is a cross sectional view of the semiconductor device during a manufacturing step following FIG. 2.

Then, as shown in FIG. 3, respective sidewalls of the trenches D1 and D2 are oxidized. Then, over the semiconductor substrate SB, a silicon oxide film is formed using, for example, a CVD method, and fully fills respective insides of the trenches D1 and D2. Subsequently, a heat treatment is performed, thereby to perform densification of the silicon oxide film. Then, by a CMP (Chemical Mechanical Polishing) method, the top surface of the silicon oxide film is polished, so that the top surface of the insulation film IF2 is exposed. As a result, the silicon oxide films embedded in respective insides of a plurality of trenches D1 and D2 are separated from one another, respectively.

Then, the top surface of the silicon oxide film is etched back, thereby to be retreated. However, the height of each top surface of the silicon oxide films embedded in respective insides of the plurality of trenches D1 and D2 is at a higher position that that of the main surface of the semiconductor substrate SB. In each trench D1, an element isolation region EI formed of the silicon oxide film is formed. In each trench D2, a dummy element isolation region DEI formed of the silicon oxide film is formed. The dummy element isolation region DEI is the insulation film to be removed in a later step.

Figure 4:
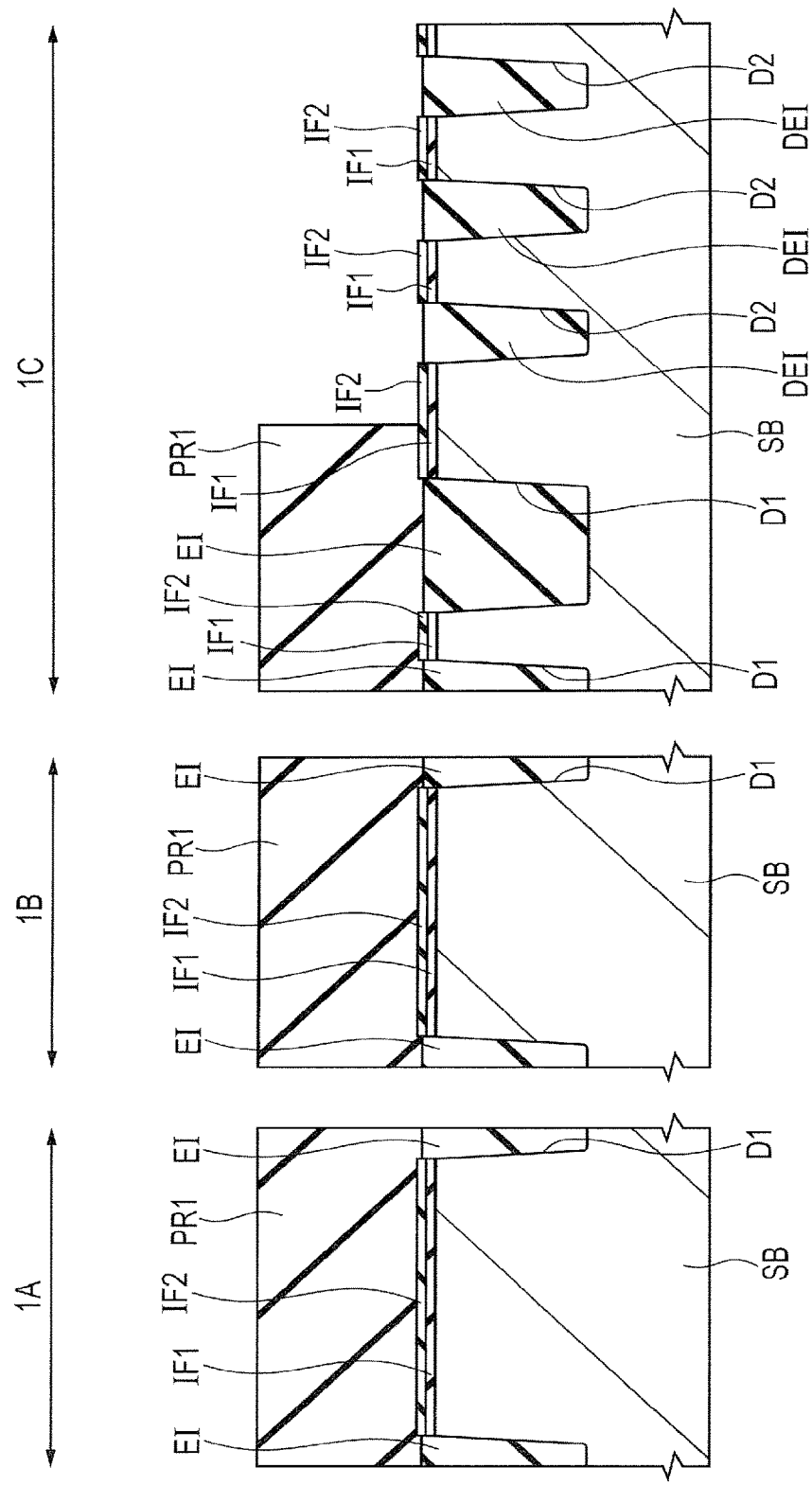
FIG. 4 is a cross sectional view of the semiconductor device during a manufacturing step following FIG. 3.

Then, as shown in FIG. 4, using a photolithography technology, a pattern of a photoresist film PR1 is formed over the semiconductor substrate SB. The photoresist film PR1 is a mask pattern covering the memory cell region 1A and the peripheral circuit region 1B, and exposing a part of the capacitor element region 1C. In the capacitor element region 1C, the element isolation region EI is covered with the photoresist film PR1, and the dummy element isolation region DEI is exposed from the photoresist film PR1. The photoresist film PR1 is terminated immediately over the insulation film IF1 between the element isolation region EI and the dummy element isolation region DEI adjacent to each other in the capacitor element region 1C.

Figure 5:
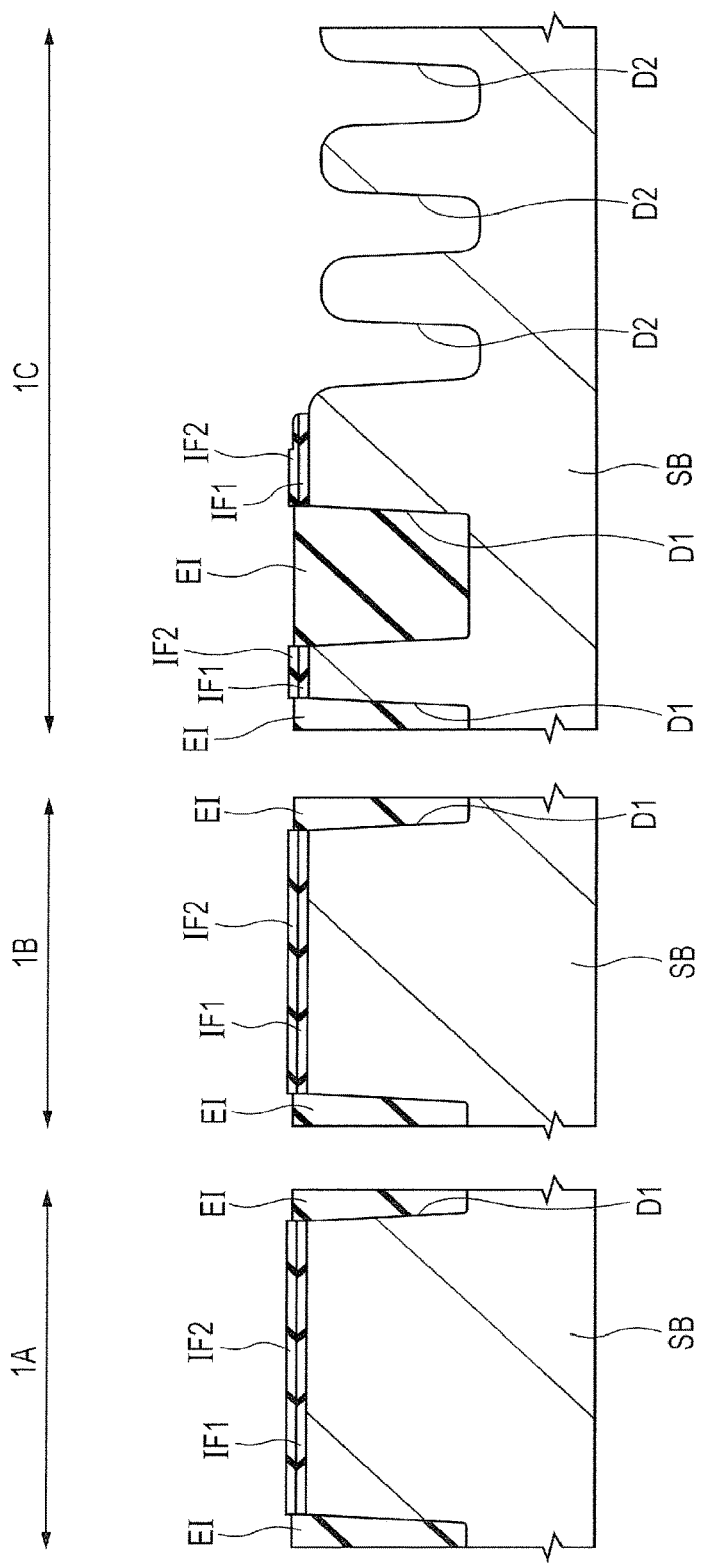
FIG. 5 is a cross sectional view of the semiconductor device during a manufacturing step following FIG. 4.

Then, as shown in FIG. 5, with the element isolation region EI covered with the photoresist film PR1, dry etching is performed using the photoresist film PR1, and the insulation films IF1 and IF2 as a mask. As a result, the dummy element isolation region DEI is removed. Then, the photoresist film PR1 is removed by asking or the like. However, the etching step removes the insulation films IF1 and IF2 used as a mask in the region in the vicinity of the trenches D2 including the region between the adjacent trenches D2. Accordingly, the top surface of the semiconductor substrate SB in the region is exposed. In the present embodiment, the dummy element isolation region DEI is removed, and the sidewall and the bottom surface of the trench D2 are exposed. For this reason, the dummy element isolation region DEI can be regarded as a pseudo element isolation region.

The insulation films IF1 and IF2 in the vicinity of the trench D2 are removed. As a result, the corner part of the interface between the sidewall of the trench D2 and the main surface of the semiconductor substrate SB thereover is cut away and rounded by the etching. Whereas, the central part of the bottom surface of the trench D2 in the direction along the main surface of the semiconductor substrate SB (which may be hereinafter simply referred to as a transverse direction) is more likely to be etched than the end of the bottom surface close to the sidewall of the trench D2. For this reason, the corner part of the interface between the sidewall and the bottom surface of the trench D2 is largely rounded, so that the surfaces between the sidewall and the bottom surface of the trench D2 are smoothly connected.

Accordingly, the corner part of the bottom surface end of the trench D2 is more rounded than the corner part of the bottom surface end of the trench D1. Whereas, the corner part of the sidewall upper end of the trench D2 is more rounded than the corner part of the sidewall upper end of the trench D1. In other words, the radius of curvature of the bottom surface end of the trench D2 is larger than the radius of curvature of the corner part of the bottom surface end of the trench D1. Whereas, the radius of curvature of the corner part of the sidewall upper end of the trench D2 is larger than the radius of curvature of the corner part of the sidewall upper end of the trench D1.

Further, by the etching step, the top surface of the semiconductor substrate SB between the adjacent trenches D2 is etched, back, and hence is lower in height than the main surface of the semiconductor substrate SB in other regions (e.g., regions adjacent to the trench D1). Similarly, the bottom surface of the trench D2 is etched back by the etching step. Accordingly, the height of the bottom surface of the trench D2 is lower than the height of the bottom surface of the trench D1. In other words, the trench D2 is deeper than the trench D1.

In other words, with the position of the main surface of the semiconductor substrate SB between the adjacent trenches D1 in the memory cell region 1A as a reference, the top surface of the semiconductor substrate SB between the adjacent trenches D2 is situated below the position of the reference in a direction perpendicular to the main surface of the semiconductor substrate SB (which will be hereinafter simply referred to as a perpendicular direction). Whereas, the distance between the position of the reference and the position of the bottom surface of the trench D2 in the perpendicular direction is larger than the distance between the position of the reference and the position of the bottom surface of the trench D1 in the perpendicular direction. In other words, the position of the main surface of the semiconductor substrate SB in the vicinity of the trench D2 is lower than the position of the main surface of the semiconductor substrate SB in the vicinity of the trench D1, and the position of the bottom surface of the trench D2 is lower than the position of the bottom surface of the trench D1.

Incidentally, the lamination film formed of the insulation films IF1 and IF2 exposed from the photoresist film PR1 in the vicinity of the photoresist film PR1 (see FIG. 4) is less likely to be removed in the dry etching step, and is left over the semiconductor substrate SB. In other words, the insulation film of the insulation film IF1 situated at the position exposed from the termination part of the photoresist film PR1 between the element isolation region EI and the dummy element isolation region DEI adjacent to each other is not fully removed, and is reduced in film thickness, and is left by the etching. This is for the following reason: the dry etching step is performed under the conditions such that the dummy element isolation region DEI formed of a silicon oxide film is more likely to be removed, and such that the insulation film IF2 formed of a silicon nitride film is less likely to be removed.

Herein, for example, in the vicinity of the photoresist film PR1, the top surface of the insulation film IF2 formed of a silicon nitride film in the region exposed from the photoresist film PR1 is retreated, but a part of the insulation film IF2 in the region is left. In this case, the top surface of the semiconductor substrate SB between the element isolation region EI and the dummy element isolation region DEI adjacent to each other is protected against dry etching by the insulation films IF2 and IF1. For this reason, the top surface can be prevented from being damaged.

Further, in the dry etching for removing the dummy element isolation region DEI in the trench D2, the insulation films IF2 and IF1 are used as a mask. Thus, etching is stopped at the time point when the insulation films IF1 and IF2, and the dummy element isolation region DEI in the vicinity of the trench D2 exposed from the photoresist film PR1 in the capacitor element region 1C has been removed. For this reason, the top surface of the semiconductor substrate SB between the adjacent trenches D2 is protected by the insulation films IF2 and IF1 during most time of the etching time. As a result, the top surface of the semiconductor substrate SB between the adjacent trenches D2 can be prevented from being damaged by dry etching.

Figure 6:
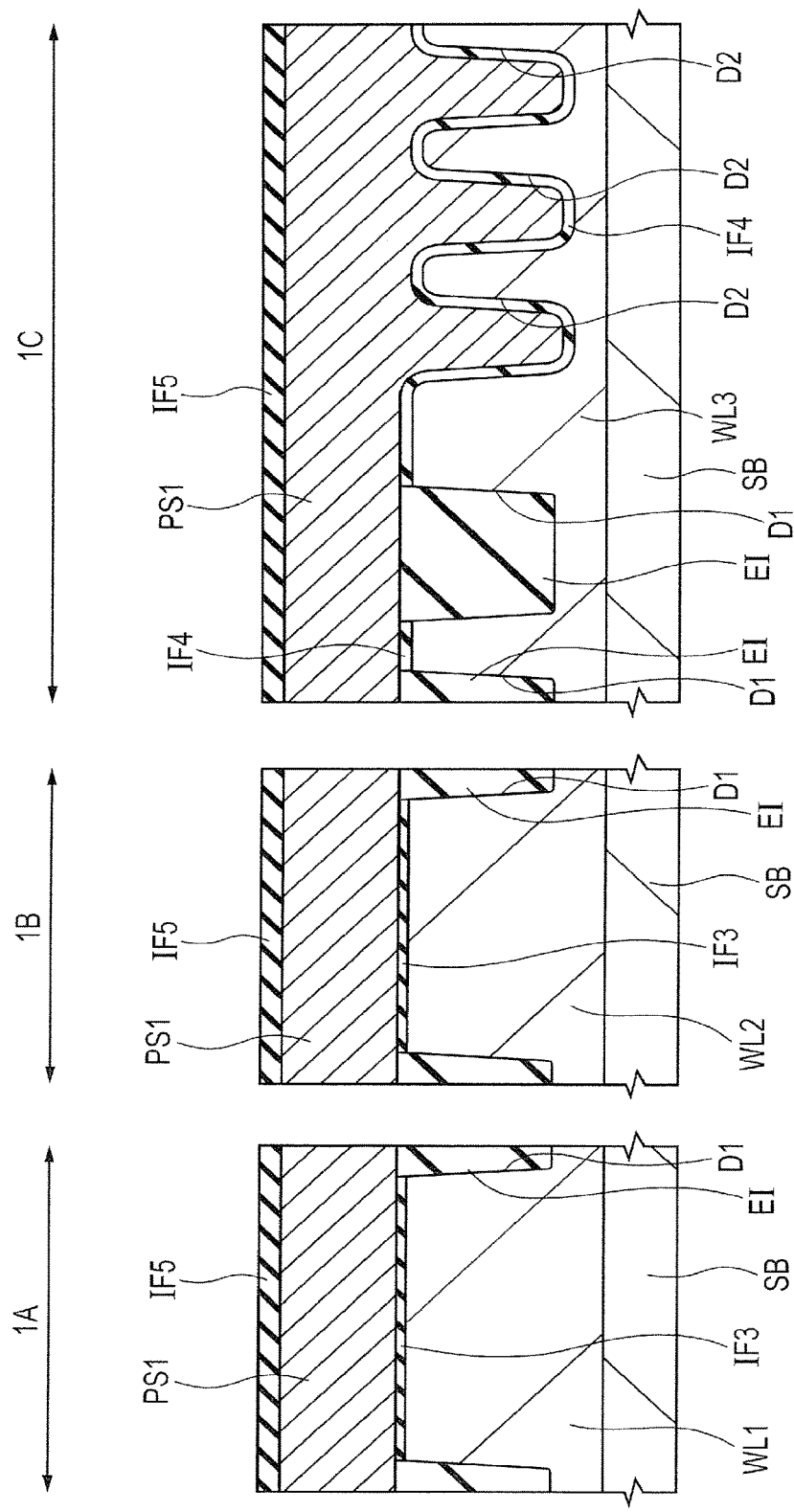
FIG. 6 is a cross sectional view of the semiconductor device during a manufacturing step following FIG. 5.

Then, as shown in FIG. 6, the insulation film IF2 is selectively removed by wet etching. In other words, first, sacrificial oxidation is performed, thereby to form an oxide film at the sidewall and the bottom surface of the trench D2. Then, a cleaning treatment is performed. As a result, the oxide film covering the sidewall of the trench D2 is left, and the silicon oxide film (not shown) over the insulation film IF2 is removed. Subsequently, the insulation film IF2 is removed by hot phosphoric acid.

Subsequently, a cleaning treatment is performed, thereby to remove the sacrificial oxide film covering the sidewall and the bottom surface of the trench D2, and the insulation film IF1 covering the main surface of the semiconductor substrate SB. As a result, the main surface of the semiconductor substrate SB is exposed. In other words, the surface of the semiconductor substrate SB is exposed except for the sidewall and the bottom surface of the trench D1 covered with the element isolation region EI. Then, sacrificial oxidation is performed, thereby to form a thin sacrificial oxide film (not shown) covering the surface of the semiconductor substrate SB.

Then, ion implantation is performed, thereby to form p type wells WL1 and WL2, and a p type well WL3 in the main surface of the semiconductor substrate SB in the memory cell region 1A, the peripheral circuit region 1B, and the capacitor element region 1C, respectively. The wells WL1 and WL2 are herein formed by implanting a p type impurity (e.g., B (boron)) at a relatively lower concentration. The well WL3 is herein formed by implanting an n type impurity (e.g., As (arsenic) or P (phosphorus)) at a relatively lower concentration. Incidentally, although not shown and not described particularly, in the region in which a p type MISFET is formed, an n type impurity (e.g., As (arsenic) or P (phosphorus)) is ion implanted into the main surface of the semiconductor substrate SB, thereby to form an n type well.

Respective formation depths of the wells WL1, WL2, and WL3 are deeper than those of the trenches D1 and D2. Herein, the wells WL1, WL2, and WL3 are respectively formed by different ion implantation steps using a photolithography technology, thereby to be allowed to have different impurity concentrations. Subsequently the semiconductor substrate SB is subjected to a heat treatment, thereby to disperse the impurity in the wells WL1, WL2, and WL3. Then, the thin sacrificial oxide film is removed. As a result, the main surface of the semiconductor substrate SB, and the sidewall and the bottom surface of the trench D2 are exposed.

Subsequently, the following step is performed. As a result, respective top surfaces of the memory cell region 1A, the peripheral circuit region 1B, and the capacitor element region 1C are covered with an insulation film formed of a silicon oxide film. However, the insulation film IF3 formed in the memory cell region 1A and the peripheral circuit region 1B are different in film thickness from the insulation film IF4 formed in the capacitor element region 1C. The film thickness of the insulation film IF4 is, for example, 15 nm.

Namely, the exposed surface of the semiconductor substrate SB is oxidized, resulting in the formation of the insulation film IF4 with a relatively larger film thickness. As a result, in addition to the main surface of the semiconductor substrate SB, the sidewall and the bottom surface of the trench D2 are also covered with the insulation film IF4. The insulation film IF4 is formed by, for example, an ISSG (In-Situ Steam Generation) oxidation method, namely, a thermal oxidation method. Then, using a photolithography technology and an etching method, the insulation film IF4 in the memory cell region 1A and the peripheral circuit region 1B are removed. As a result, the main surface of the semiconductor substrate SB in the memory cell region 1A and the peripheral circuit region 1B is exposed.

Subsequently, thermal oxidation or the like is performed, thereby to form the insulation film IF3 with a relatively smaller film thickness at the exposed top surface of the semiconductor substrate SB. As a result, respective top surfaces of the semiconductor substrate SB in the memory cell region 1A and the peripheral circuit region 1B are covered with the insulation film IF3. In this manner, it is possible to form the insulation films having different thicknesses in the memory cell region 1A and the peripheral circuit region 1B, and in the capacitor element region 1C, respectively.

Subsequently, entirely over the main surface of the semiconductor substrate SB, a polysilicon film PS1 is formed using, for example, a CVD method. As a result, respective top surfaces of the insulation films IF3 and IF4 are covered with the polysilicon film PS1. At this step, the film thickness of the polysilicon film PS1 is sufficiently larger relative to the width in the transverse direction of the trench D2. Accordingly, the trench D2 is fully filled with the insulation film IF4 and the polysilicon film PS1. In addition, immediately over the trench D2, the top surface of the polysilicon film PS1 is hardly dented. In other words, the inside of the trench D2 is filled with the polysilicon film PS1 via the insulation film IF4. Then, over the polysilicon film PS1, an insulation film IF5 formed of a silicon nitride film is formed using, for example, a CVD method.

Herein, the following is also possible: during deposition, the polysilicon film PS1 is formed as an amorphous silicon film; then, by the subsequent heat treatment, the amorphous silicon film is changed into the polysilicon film PS1 formed of a polycrystal silicon film. The polysilicon film PS1 is not doped with an impurity during deposition. After deposition, an impurity is ion implanted. The impurity is diffused by the subsequent heat treatment, resulting in a low-resistance semiconductor film.

The impurity implanted by the ion implantation step can also be diffused into the polysilicon film PS1 in the trench D2 by a heat treatment. In other words, the impurity is also doped into the polysilicon film PS1 at the bottom of the inside of the trench D2. For this reason, when a capacitor element including the upper electrode including the polysilicon film PS1 in the trench D2 is formed in a later step, it is possible to prevent the formation of a depletion layer in the upper electrode in the trench D2.

Herein, an n type impurity (e.g., As (arsenic) or P (phosphorus)) is implanted into the polysilicon film PS1 in the capacitor element region 1C. This is for the following purpose: when the capacitor element formed later is formed of a lower electrode formed of the well WL3 in the top surface of the semiconductor substrate SB, and an upper electrode formed of the polysilicon film PS1 immediately over the lower electrode, the conductivity types are equalized between the lower electrode and the upper electrode. In this manner, in the present embodiment, the n type capacitor element is formed. However, when a p type capacitor element is formed, the well WL3 is formed as a p type semiconductor region, and the polysilicon film PS1 is changed into a p type semiconductor film by the ion implantation.

A part of the polysilicon film PS1 fills the trench D2. However, the polysilicon film PS1 has a sufficiently large film thickness. For this reason, a large concave is not formed in the top surface of the polysilicon film PS1 immediately over the trench D2.

Figure 7:
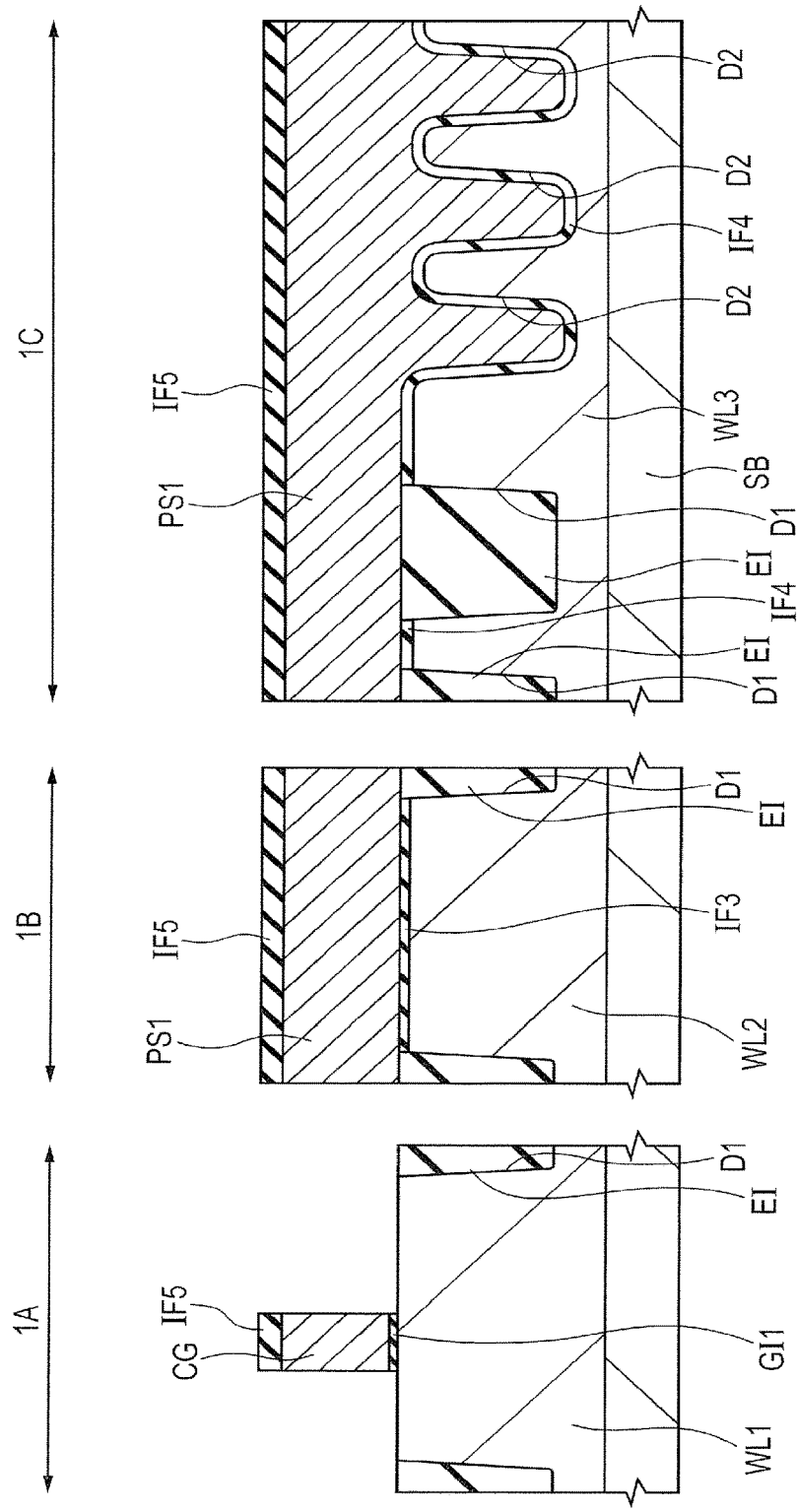
FIG. 7 is a cross sectional view of the semiconductor device during a manufacturing step following FIG. 6.

Then, as shown in FIG. 7, using a photolithography technology and an etching method, the insulation film IF5, the polysilicon film PS1, and the insulation film IF3 in the memory cell region 1A are processed. This results in the formation of a control gate electrode CG formed of the polysilicon film PS1, and a gate insulation film GI1 formed of the insulation film IF3. Incidentally, the following is also possible: first, the insulation film IF5 in the memory cell region 1A is processed using a photolithography technology and a dry etching method; then, with the insulation film IF5 as a mask, the polysilicon film PS1 and the insulation film IF3 in the memory cell region 1A are processed.

Alternatively, herein, the following is also acceptable: the polysilicon film PS1 in the peripheral circuit region 1B and the capacitor element region 1C is not processed; however, in the etching step, the polysilicon film PS1 in the capacitor element region 1C is processed. When the polysilicon film PS1 in the capacitor element region 1C is processed, as described later with reference to FIG. 10, the portions of the polysilicon film PS1 in the trench D2 and in the vicinity thereof are left, and the portion of the polysilicon film PS1 lateral thereto is removed.

Figure 8:
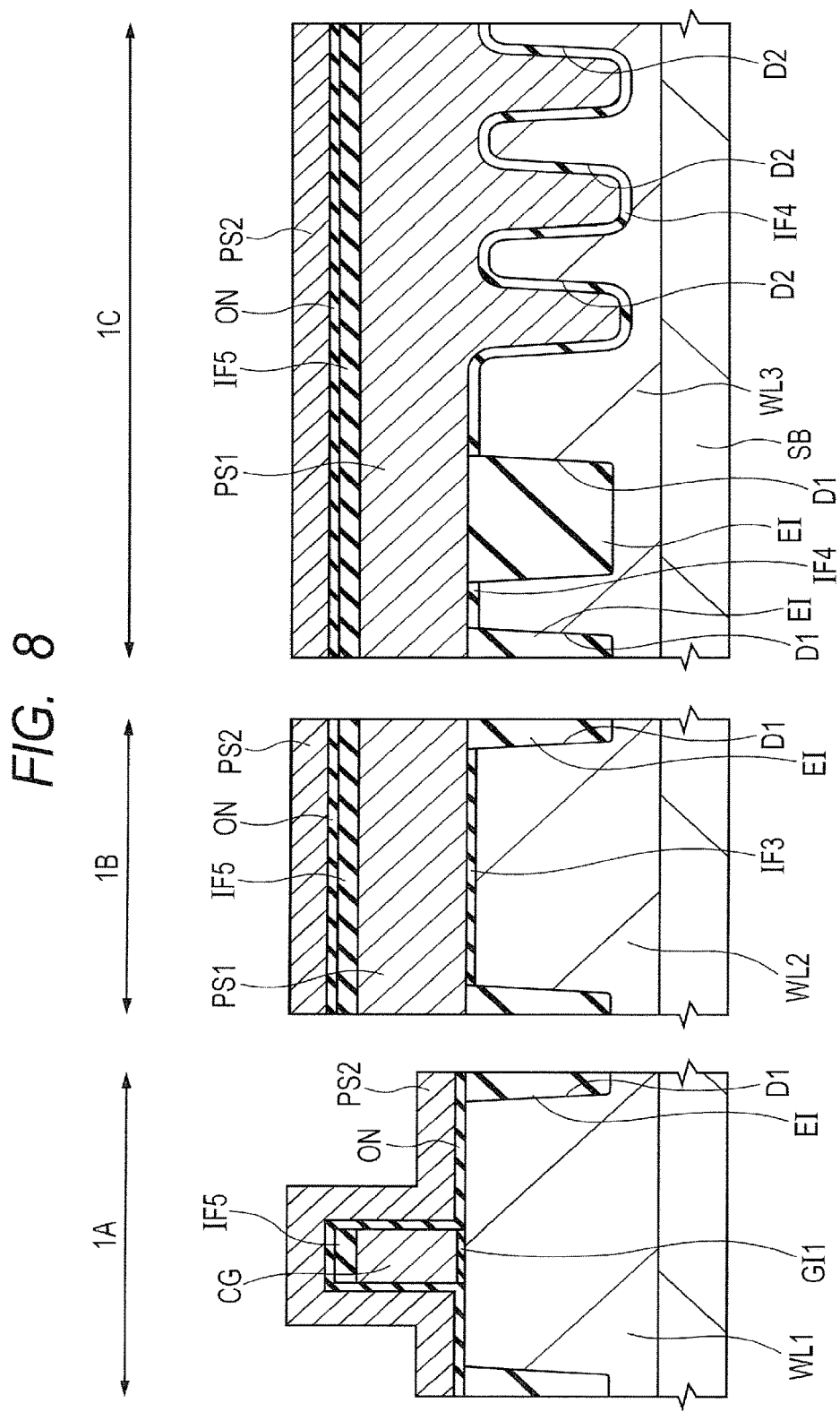
FIG. 8 is a cross sectional view of the semiconductor device during a manufacturing step following FIG. 7.

Then, as shown in FIG. 8, entirely over the main surface of the semiconductor substrate SB, an ONO (oxide-nitride-oxide) film ON of the lamination film for the gate insulation film of the memory transistor is formed. The ONO film ON covers the top surface of the semiconductor substrate SB in the memory cell region 1A, the sidewall and the top surface of the lamination film formed of the gate insulation film GI1, the control gate electrode CG, and the insulation film IF5, and the top surface of the insulation film IF5 in the peripheral circuit region 1B and the capacitor element region 1C.

Herein, for ease of understanding of the drawing, the lamination structure of the lamination film forming the ONO film ON is not shown. In other words, herein, the boundaries between respective films forming the ONO film ON are not shown. The ONO film ON is an insulation film having a charge accumulation part in the inside thereof. Specifically, the ONO film ON is formed of a lamination film of a first silicon oxide film (bottom oxide film) formed over the semiconductor substrate SB, a silicon nitride film formed over the first silicon oxide film, and a second silicon oxide film (top oxide film) formed over the silicon nitride film. The silicon nitride film functions as the charge accumulation part.

The first and second silicon oxide films can be formed by, for example, an oxidation treatment (thermal oxidation treatment) or a CVD method, or a combination thereof. ISSG oxidation can also be used for the oxidation at this step. The silicon nitride film can be formed by, for example, a CVD method. Each thickness of the first and second silicon oxide films can be set at, for example, about 2 to 10 nm. The thickness of the silicon nitride film can be set at, for example, about 5 to 15 nm.

Subsequently, a polysilicon film PS2 is formed using, for example, a CVD method, entirely over the main surface of the semiconductor substrate SB in such a manner as to cover the surface of the ONO film ON. As a result, the sidewall and the top surface of the ONO film ON exposed in the memory cell region LA are covered with the polysilicon film PS2. In other words, at the sidewall of the control gate electrode CG, the polysilicon film PS2 is formed via the ONO film ON. The film thickness of the polysilicon film PS2 is smaller than the film thickness of the polysilicon film PS1.

The polysilicon film PS2 can also be formed in the following manner: during deposition, the film is formed as an amorphous silicon film, and is made polycrystalline by the subsequent heat treatment. The polysilicon film PS2 is, for example, a film doped with an n type impurity (e.g., phosphorus (P)) at a relatively higher concentration. The polysilicon film PS2 is a film for forming a memory gate electrode MG described later.

The film thickness herein referred to denotes, in the case of a specific film, the thickness of the film in a direction perpendicular to the surface of the underlayer. For example, when the polysilicon film PS2 is formed over the surface along the main surface of the semiconductor substrate SB, and along the surface as with the top surface of the ONO film ON, the film thickness of the polysilicon film PS2 denotes the film thickness of the polysilicon film PS2 in a direction perpendicular to the main surface of the semiconductor substrate SB. Whereas, in the case of the polysilicon film PS2 at a portion thereof formed in contact with the wall perpendicular to the main surface of the semiconductor substrate SB as with the sidewall of the ONO film ON, the film thickness of the polysilicon film PS2 denotes the thickness of the polysilicon film PS2 in a direction perpendicular to the sidewall.

Figure 9:
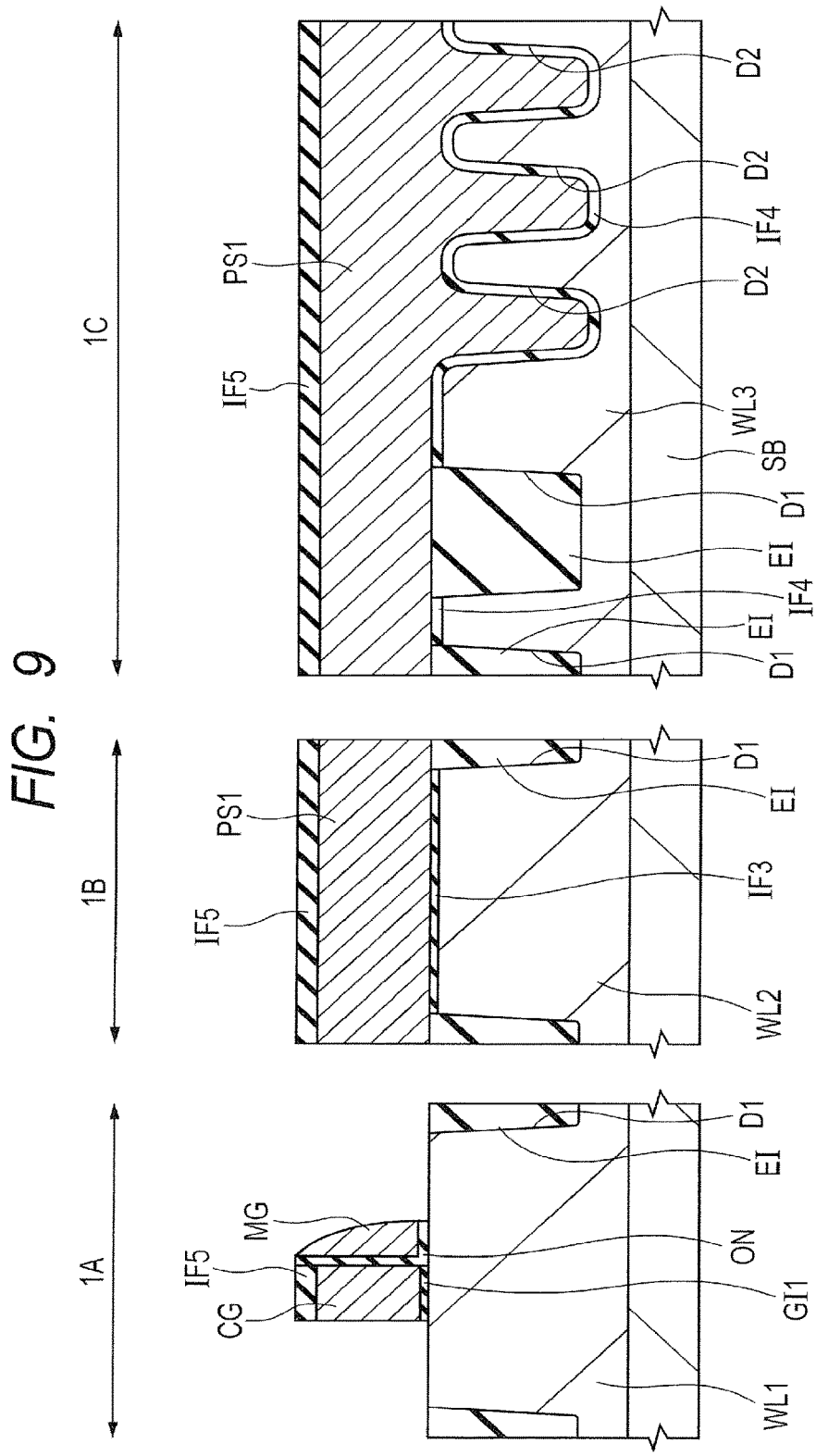
FIG. 9 is a cross sectional view of the semiconductor device during a manufacturing step following FIG. 8.

Then, as shown in FIG. 9, the polysilicon film PS2 is etched back by a dry etching method, thereby to expose the top surface of the ONO film ON. In the etch back step, the polysilicon film PS2 is anisotropically etched (etched back). As a result, over each opposite sidewall of the lamination film formed of the gate insulation film GI1, the control gate electrode CG, and the insulation film IF5, the polysilicon film PS2 is left in a sidewall shape via the ONO film ON.

This results in the formation of a memory gate electrode MG formed of the polysilicon film PS2 left in a sidewall shape via the ONO film ON at one sidewall of the sidewalls of the lamination film in the memory cell region 1A. The etch back exposes the top surface of the ONO film ON in the peripheral circuit region 1B and the capacitor element region 10. The film thickness of the polysilicon film PS2 is smaller than the film thickness of the polysilicon film PS1. Accordingly, the film thickness (gate length) in a transverse direction of the memory gate electrode MG formed of the polysilicon film PS2 in contact with the sidewall of the control gate electrode CG is smaller than the film thickness of the control gate electrode CG formed of the polysilicon film PS1 in the perpendicular direction.

Subsequently, using a photolithography technology, a photoresist pattern (not shown) covering the memory gate electrode MG adjacent to one sidewall of the control gate electrode CG, and exposing the polysilicon film PS2 adjacent to the other sidewall of the control gate electrode CG is formed over the semiconductor substrate SB. Then, by performing etching using the photoresist pattern as an etching mask, the polysilicon film PS2 formed opposite to the memory gate electrode MG across the control gate electrode CG is removed. Then, the photoresist pattern is removed. At this step, the memory gate electrode MG is covered with the photoresist pattern, and hence is left without being etched.

Subsequently, the portion of the ONO film ON not covered with the memory gate electrode MG, and exposed is removed by etching (e.g., wet etching). At this step, in the memory cell region 1A, the portion of the ONO film ON immediately under the memory gate electrode MG is left without being removed. Similarly, the portion of the ONO film ON situated between the lamination film including the gate insulation film GI1, the control gate electrode CG, and the insulation film IF5, and the memory gate electrode MG is left without being removed. The portions of the ONO film ON in other regions are removed. Accordingly, the top surface of the semiconductor substrate SB in the memory cell region 1A is exposed. Whereas, the top surface of the insulation film IF5 in the memory cell region LA, the peripheral circuit region 1B, and the capacitor element region 1C is exposed. Further, the sidewall of the control gate electrode CG, not adjacent to the memory gate electrode MG is exposed.

In this manner, the memory gate electrode MG is formed over the semiconductor substrate SB via the ONO film ON having a charge accumulation part in the inside thereof in such a manner as to be adjacent to the control gate electrode CG.

Figure 10:
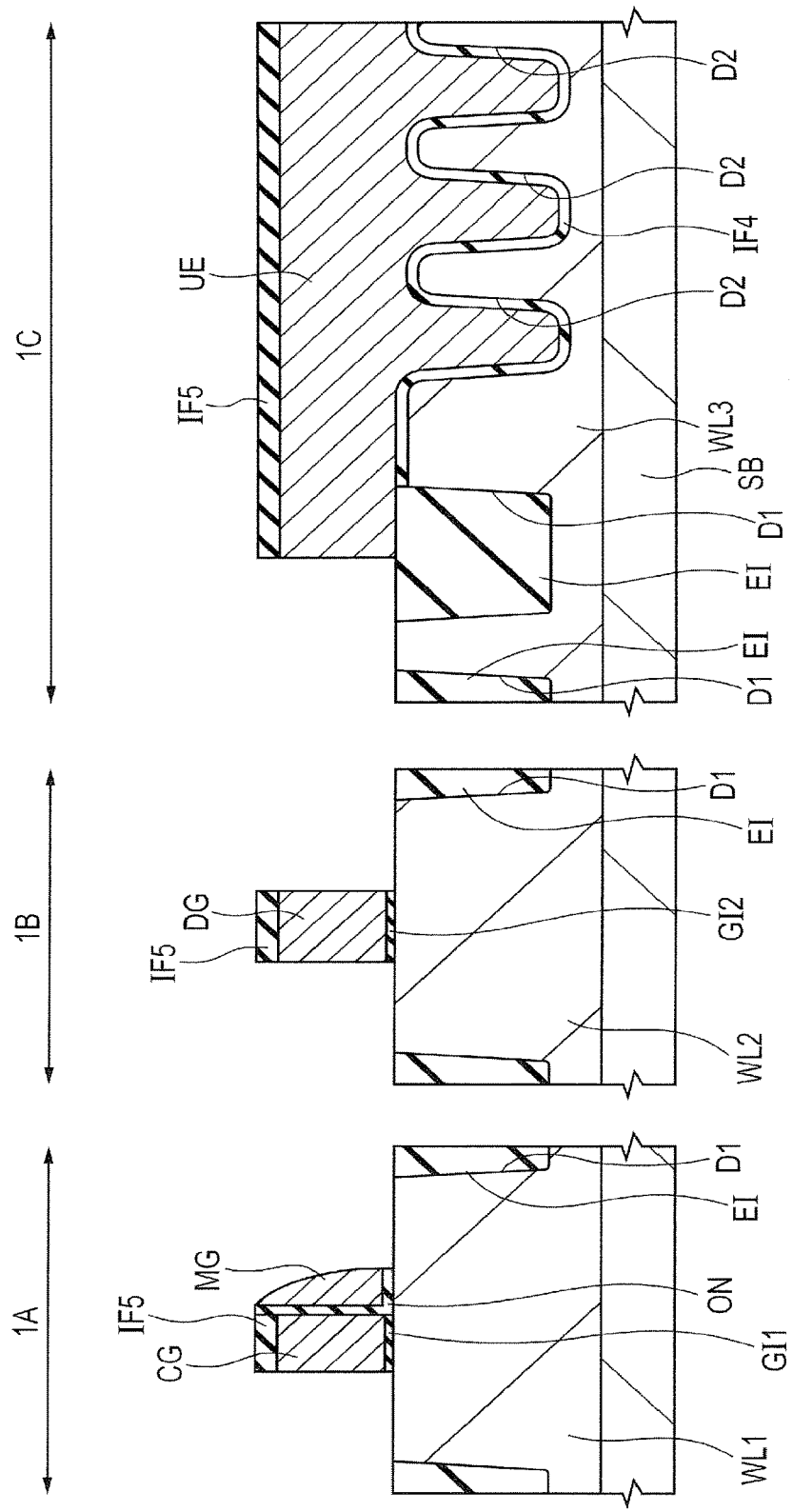
FIG. 10 is a cross sectional view of the semiconductor device during a manufacturing step following FIG. 9.

Then, as shown in FIG. 10, the polysilicon film PS1, and the insulation films IF3, IF4, and IF5 in the peripheral circuit region 1B and the capacitor element region 1C are patterned using a photolithography technology and an etching technology. As a result, a dummy gate electrode DG formed of the polysilicon film PS1, and a gate insulation film GI2 formed of the insulation film IF3 are formed in the peripheral circuit region 1B. Whereas, an upper electrode UE formed of the polysilicon film PS1 is formed in the capacitor element region 1C. Further, in the capacitor element region 1C, the insulation film IF4 over the semiconductor substrate SB in a region exposed from the upper electrode UE is removed. As a result, the main surface of the semiconductor substrate SB between the adjacent element isolation regions EI in the capacitor element region 1C is exposed.

The dummy gate electrode DG is a semiconductor film to be removed in a later step. The lamination film formed of the gate insulation film GI2, the dummy gate electrode DG, and the insulation film IF5 is formed over the main surface of the semiconductor substrate SB between the adjacent element isolation regions EI.

Figure 11:
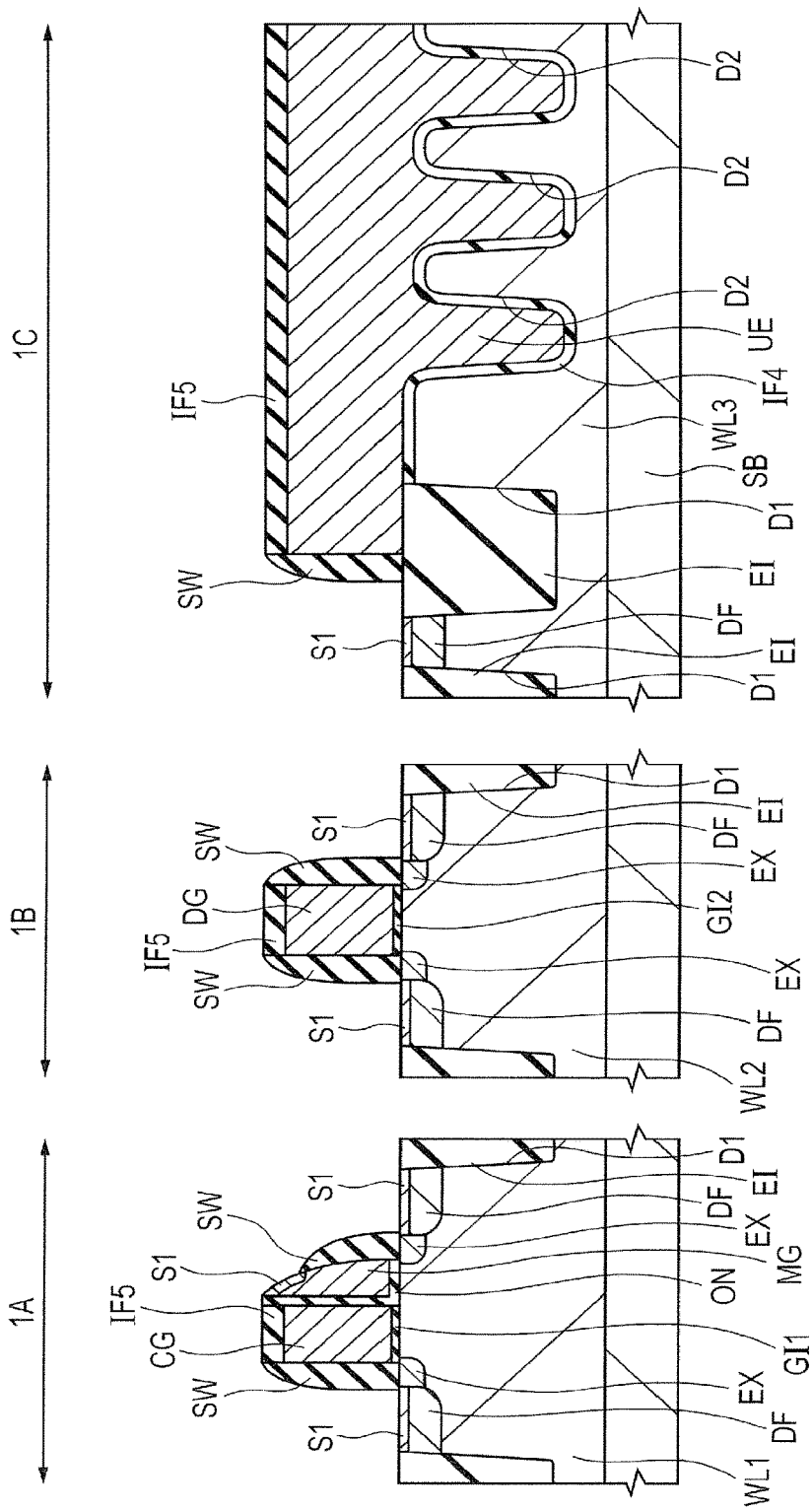
FIG. 11 is a cross sectional view of the semiconductor device during a manufacturing step following FIG. 10.

Then, as shown in FIG. 11, a plurality of n$^-$ type semiconductor regions (impurity diffusion regions) EX are formed using an ion implantation method, or the like. Namely, an n type impurity such as arsenic (As) or phosphorus (P) is doped into the main surface of the semiconductor substrate SB by an ion implantation method using the insulation films IF4 and IF5, the control gate electrode CG, the memory gate electrode MG, the dummy gate electrode DG, the ONO film ON, the upper electrode UE, and the like as a mask (ion implantation inhibiting mask). As a result, a plurality of n$^-$ type semiconductor regions EX are formed. Before the formation of the n$^-$ type semiconductor regions EX, offset spacers respectively covering the sidewall of the structure formed of the control gate electrode CG and the memory gate electrode MG, and respective sidewalls of the dummy gate electrode DG may be formed of, for example, a silicon nitride film or a silicon oxide film, or a lamination film thereof.

In the memory cell region 1A, a pair of n$^-$ type semiconductor regions EX formed in the portions of the top surface of the semiconductor substrate SB lateral to the structure including the control gate electrode CG and the memory gate electrode MG respectively form portions of the source/drain regions of the control transistor and the memory transistor in the memory cell region 1A formed later. Whereas, in the peripheral circuit region 1B, a pair of $n^-$ type semiconductor regions EX formed in the portions of the top surface of the semiconductor substrate SB lateral to the dummy gate electrode DG respectively form portions of the source/drain regions of the MISFET in the peripheral circuit region 1B formed later. Respective $n^-$ type semiconductor regions EX in the memory cell region 1A and the peripheral circuit region 1B can be formed by the same ion implantation step, but can also be formed by different ion implantation steps.

Subsequently, sidewalls SW covering the sidewalls on the opposite sides of the structure including the control gate electrode CG, the memory gate electrode MG, the gate insulation film GI1, the insulation film IF5, and the ONO film ON in the memory cell region 1A are formed. Whereas, by the same step, sidewalls SW covering the sidewalls on the opposite sides of the lamination film formed of the gate insulation film GI2, the insulation film IF5, and the dummy gate electrode DG is formed in the peripheral circuit region 1B. Further, by the same step, sidewalls SW covering the sidewalls on the opposite sides of the lamination film including the upper electrode UE, and the insulation films IF4 and IF5 are formed in the capacitor element region 10.

The sidewalls SW can be formed in a self-alignment manner in the following manner: a silicon oxide film and a silicon nitride film are sequentially formed over the semiconductor substrate SB using, for example, a CVD method; then, the silicon oxide film and the silicon nitride film are partially removed by anisotropical etching, thereby to expose the top surface of the semiconductor substrate SB and the top surface of the insulation film IF5. In other words, it can be considered that the sidewall SW is formed of a lamination film. However, in the drawing, the interfaces between the films forming the lamination film are not shown. Incidentally, the formation method of the lamination film can be improved to provide optimum sidewall widths for respective element characteristics. However, a description thereon is omitted.

Subsequently, a plurality of $n^+$ type semiconductor regions (impurity diffusion regions) DF are formed in the memory cell region 1A, the peripheral circuit region 1B, and the capacitor element region 1C using an ion implantation method, or the like. Namely, an n type impurity (e.g., arsenic (As) or phosphorus (P)) is doped into the main surface of the semiconductor substrate SB using the insulation film IF4, the insulation film IF5, the control gate electrode CG, the memory gate electrode MG, the dummy gate electrode DG, the ONO film ON, the upper electrode UE, the sidewalls SW as a mask by an ion implantation method. As a result, a plurality of $n^+$ type semiconductor regions DF can be formed. The $n^+$ type semiconductor region DF is higher in impurity concentration, and larger injunction depth (formation depth) than the $n^-$ type semiconductor region EX. Incidentally, the $n^+$ type semiconductor region DF can also be formed with a smaller junction depth than that of the $n^-$ type semiconductor region EX.

This results in the formation of a source/drain region formed of the $n^-$ type semiconductor region EX of an extension region, and the $n^+$ type semiconductor region DF of a diffusion layer higher in impurity concentration than the $n^-$ type semiconductor region EX, and having a LDD (Lightly Doped Drain) structure in the memory cell region 1A and the peripheral circuit region 1B.

A pair of $n^+$ type semiconductor regions DF formed in the portions of the top surface of the semiconductor substrate SB lateral to the structure including the control gate electrode CG, the memory gate electrode MG, and the sidewalls SW in the memory cell region 1A form portions of the source/drain regions of the control transistor and the memory transistor formed later in the memory cell region 1A. Whereas, a pair of $n^+$ type semiconductor regions DF formed in the portions of the top surface of the semiconductor substrate SB lateral to the structure including the dummy gate electrode DG and the sidewalls SW in the peripheral circuit region 1B form portions of the source/drain regions of the MISFET formed later in the peripheral circuit region 1B. Respective $n^+$ type semiconductor regions DF in the memory cell region 1A and the peripheral circuit region 1B can be formed by the same ion implantation step, but can also be formed by different ion implantation steps.

Whereas, in the capacitor element region 1C, the $n^+$ type semiconductor region DF is formed in the main surface of the semiconductor substrate SB exposed from the element isolation region EI lateral to the upper electrode UE. In other words, the $n^+$ type semiconductor region DF is formed adjacent to the trench D1.

Subsequently, activation annealing is performed which is a heat treatment for activating the impurities doped into the semiconductor regions (the $n^-$ type semiconductor regions EX and the $n^+$ type semiconductor regions DF) for the source region and the drain region, and the like.

Subsequently, a silicide layer S1 is formed. The silicide layer S1 can be formed by performing a so-called Salicide: Self Aligned Silicide process. Specifically, the silicide layer S1 can be formed in the following manner.

Namely, first, entirely over the main surface of the semiconductor substrate SB including over the top surfaces of the $n^+$ type semiconductor regions DF and over the top surface of the memory gate electrode MG, a metal film for forming the silicide layer S1 is formed (deposited). For the metal film, an elementary metal film (pure metal film) or an alloy film can be used. The metal film is formed of, for example, a cobalt (Co) film, a nickel (Ni) film, or a nickel-platinum alloy film, and can be formed using a sputtering method, or the like.

Then, the semiconductor substrate SB is subjected to a heat treatment (a heat treatment for forming the silicide layer S1). As a result, respective surface layer portions of the $n^+$ type semiconductor regions DF and the memory gate electrode MG are allowed to react with the metal film. This results in the formation of the silicide layers S1 at respective tops of the $n^+$ type semiconductor regions DF and the memory gate electrode MG. Then, the unreacted portions of the metal film are removed by wet etching, or the like, resulting in the structure shown in FIG. 11.

The silicide layer S1 can be formed as, for example, a cobalt silicide layer, a nickel silicide layer, or a nickel platinum silicide layer. Incidentally, respective top surfaces of the control gate electrode CG, the dummy gate electrode DG, and the upper electrode UE are covered with the insulation film IF5 of a cap film. For this reason, the silicide layer S1 is not formed at each top of the top surfaces. Incidentally, the top of the memory gate electrode MG in a sidewall shape is exposed. Accordingly, the silicide layer S1 is formed at the exposed portion. However, the silicide layer S1 can be fully removed by a polishing step with a CMP (Chemical Mechanical Polishing) method to be performed in a later step.

Figure 12:
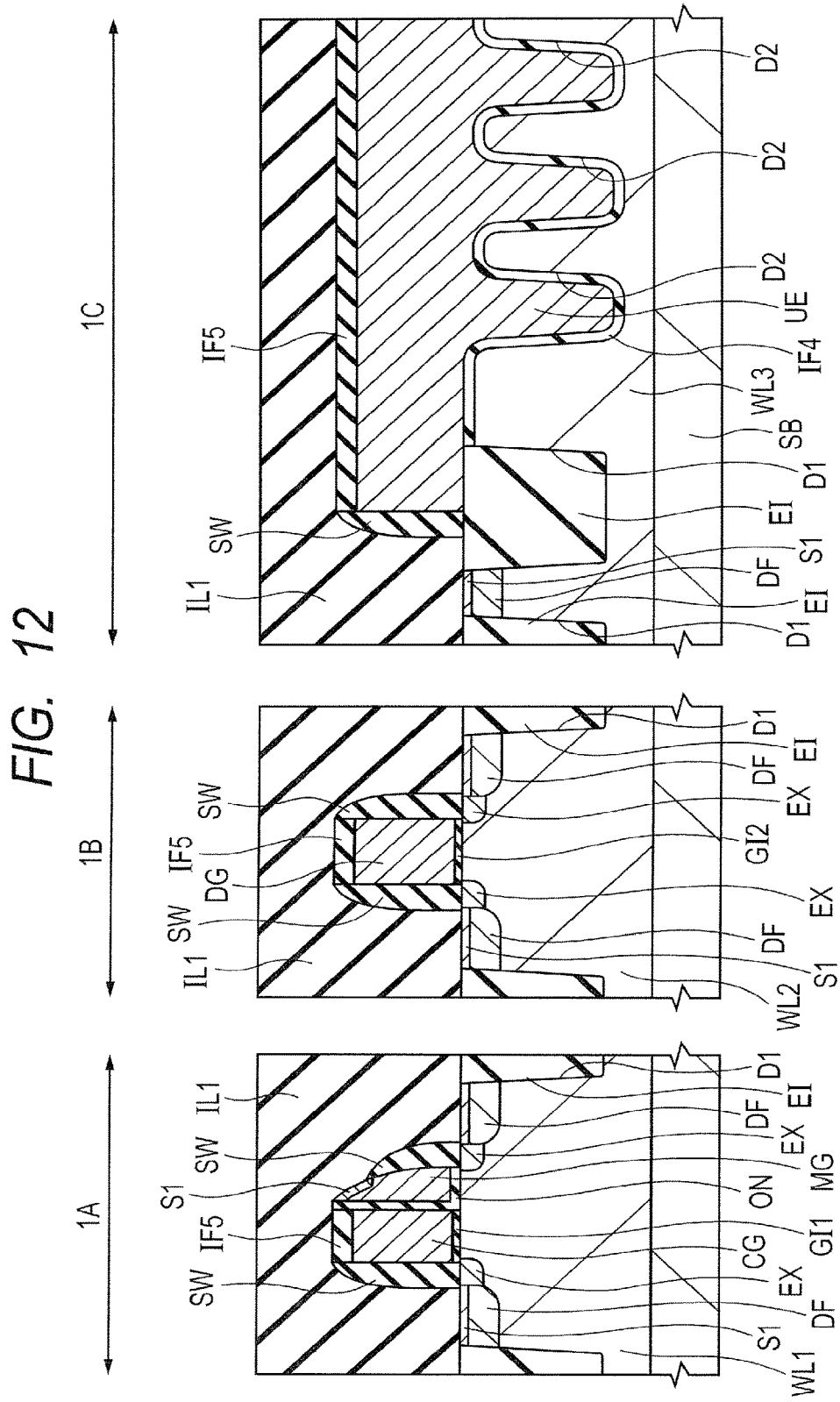
FIG. 12 is a cross sectional view of the semiconductor device during a manufacturing step following FIG. 11.

Then, as shown in FIG. 12, entirely over the main surface of the semiconductor substrate SB, an interlayer insulation film IL1 is formed in such a manner as to cover the control gate electrode CG, the memory gate electrode MG, the sidewalls SW, the dummy gate electrode DG, and the upper electrode UE. The interlayer insulation film IL1 is formed of, for example, a single film of a silicon oxide film, and can be formed using, for example, a CVD method. Herein, the interlayer insulation film IL1 is formed with a larger film thickness than the film thickness of, for example, the control gate electrode CG.

Figure 13:
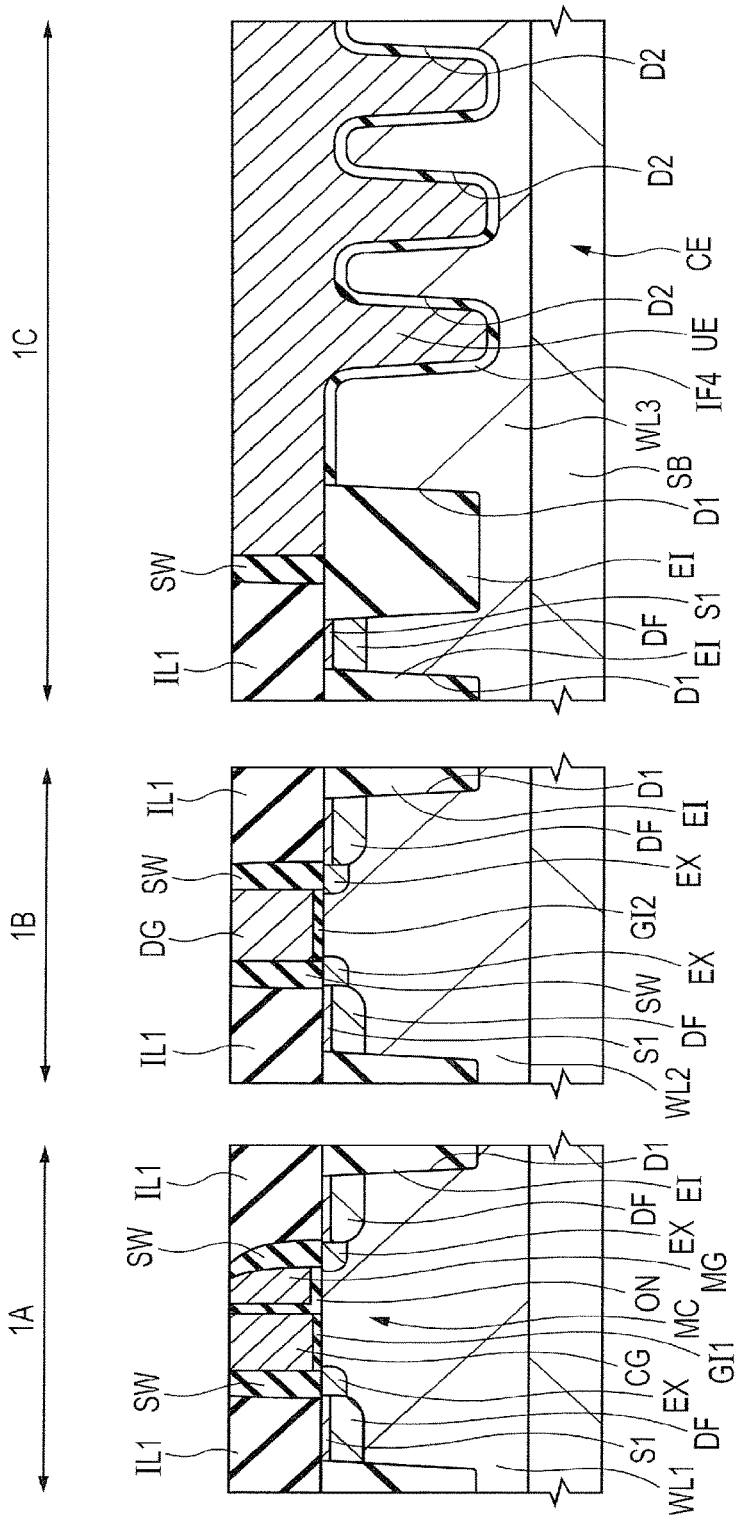
FIG. 13 is a cross sectional view of the semiconductor device during a manufacturing step following FIG. 12.

Then, as shown in FIG. 13, the top surface of the interlayer insulation film IL1 is polished using a CMP method, or the like. As a result, respective top surfaces of the control gate electrode CG, the memory gate electrode MG, the dummy gate electrode DG in the peripheral circuit region 1B, and the upper electrode UE in the capacitor element region 1C are exposed. In other words, in this polishing step, the interlayer insulation film IL1 is polished until respective top surfaces of the control gate electrode CG, the memory gate electrode MG, the dummy gate electrode DG, and the upper electrode UE are exposed. As a result, the insulation film IF5 is removed, so that the top of each sidewall SW is also partially removed.

By this step, the silicide layer S1 over the memory gate electrode MG is removed together with a part of the top of the memory gate electrode MG. Further, at this step, it is difficult to stop polishing at the time when the top surface of the dummy gate electrode DG and the top surface of the control gate electrode CG shown in FIG. 12 are exposed from the insulation film IF5. For this reason, as shown in FIG. 13, respective top surfaces of the dummy gate electrode DG, the control gate electrode CG, and the upper electrode UE are removed by polishing, thereby to be retreated. In other words, respective film thicknesses of the dummy gate electrode DG, the control gate electrode CG, and the upper electrode UE are reduced by polishing.

As a result, the top of each electrode is retreated by the polishing step. Accordingly, a memory cell MC including the control gate electrode CG and the memory gate electrode MG, and the source/drain regions formed in the portions of the main surface of the semiconductor substrate SB lateral thereto is formed in the memory cell region 1A. Namely, in the memory cell region 1A, the control gate electrode CG, and a pair of source/drain regions formed in the portions of the top surface of the semiconductor substrate SB lateral to the control gate electrode CG forma control transistor. Whereas, the gate insulation film GI1 immediately under the control gate electrode CG forms the gate insulation film of the control transistor.

Further, in the memory cell region 1A, the memory gate electrode MG, and a pair of source/drain regions formed in the portions of the top surface of the semiconductor substrate SB lateral to the memory gate electrode MG form a memory transistor. Whereas, the ONO film ON under the memory gate electrode MG forms the gate insulation film of the memory transistor. In this manner, the control transistor and the memory transistor have a pair of source/drain regions in common. The control transistor and the memory transistor form the memory cell MC.

Further, by the polishing step, the top surface of the upper electrode UE in the capacitor element region 1C is retreated. This results in the formation of a capacitor element CE including the upper electrode UE, and a lower electrode formed of the semiconductor substrate SB immediately under the upper electrode UE. The insulation film IF4 is interposed between the upper electrode UE and the semiconductor substrate SB. Thus, the upper electrode UE and the lower electrode are separated, and insulated from each other by the insulation film IF4.

Even after having performed the polishing step, the film thickness (gate length) in a transverse direction of the memory gate electrode MG in contact with the sidewall of the control gate electrode CG is smaller than the film thickness of the control gate electrode CG in the perpendicular direction.

Figure 14:
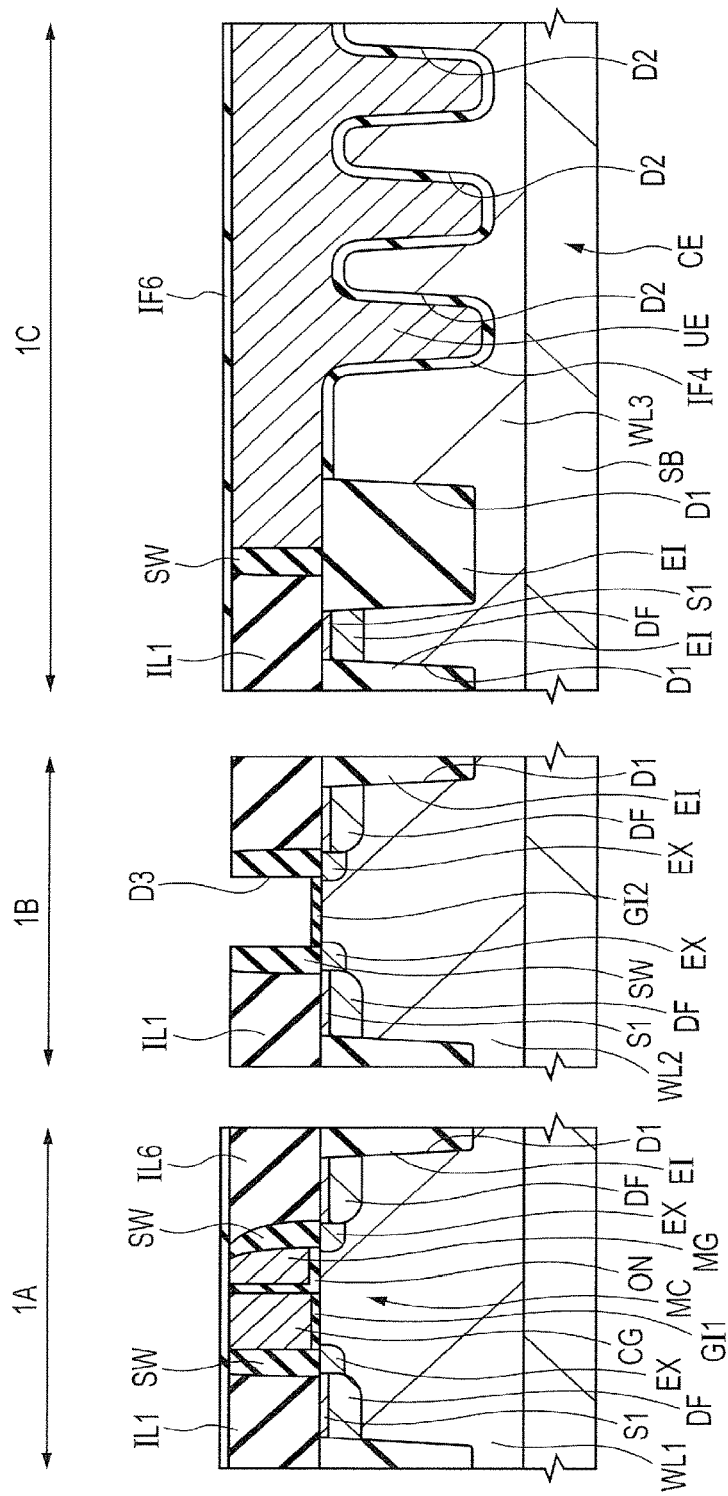
FIG. 14 is a cross sectional view of the semiconductor device during a manufacturing step following FIG. 13.

Then, as shown in FIG. 14, over the interlayer insulation film IL1, an insulation film IF6 is formed using, for example, a CVD method. Then, using a photolithography technology and an etching method, the insulation film IF6 is processed. As a result, the insulation film IF6 is left in the memory cell region 1A and the capacitor element region 1C. In other words, the insulation film IF6 covers respective top surfaces of the control gate electrode CG, the memory gate electrode MG, and the upper electrode UE, and exposes the dummy gate electrode DG. The insulation film IF6 is formed of a silicon oxide film or a silicon nitride film.

Then, the dummy gate electrode DG is etched and removed. Herein, using the insulation film IF6 as a mask for protecting the control gate electrode CG, the memory gate electrode MG, and the upper electrode UE, wet etching is performed with, for example, an aqueous alkaline solution, thereby to remove the dummy gate electrode DG. Removal of the dummy gate electrode DG results in the formation of a trench (concave part or pit part) over the gate insulation film GI2. The trench D3 over the gate insulation film GI2 in the peripheral circuit region 1B is a region from which the dummy gate electrode DG was removed. The sidewall on each opposite side of the trench D3 is formed of the sidewall SW, and the bottom surface of the trench D3 is formed of the top surface of the gate insulation film GI2.

Figure 15:
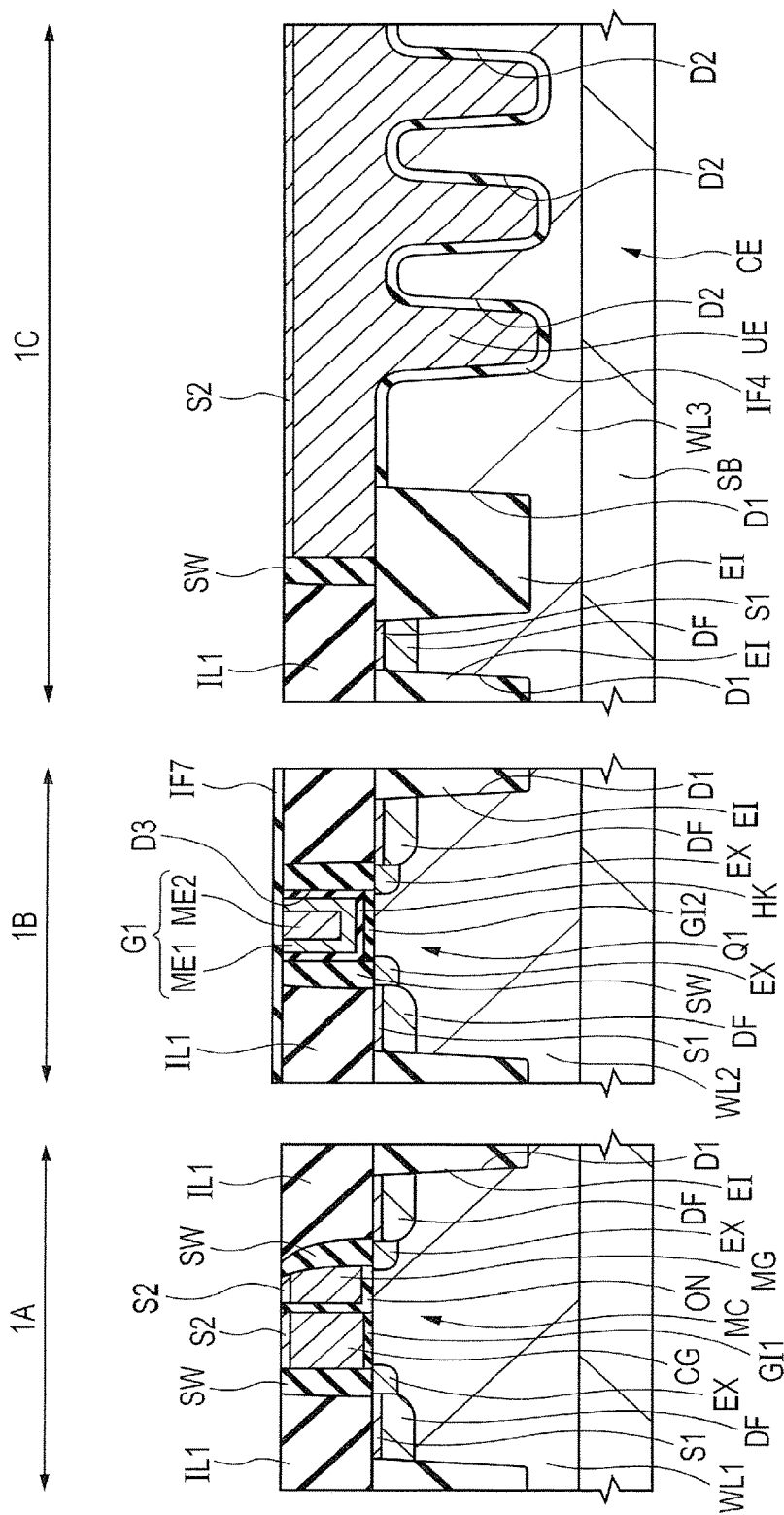
FIG. 15 is a cross sectional view of the semiconductor device during a manufacturing step following FIG. 14.
Figure 16:
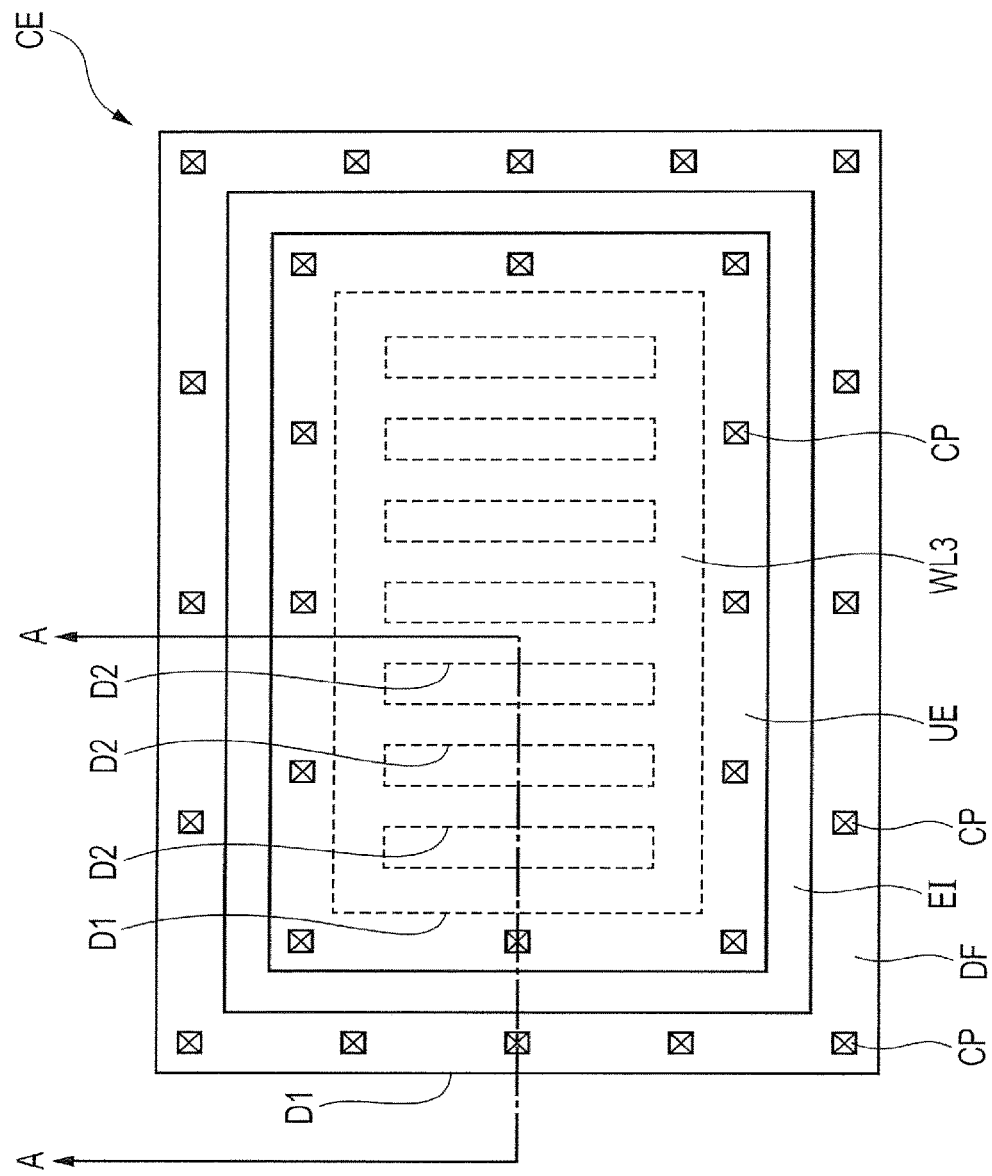
FIG. 16 is a planar layout of the semiconductor device during a manufacturing step following FIG. 15.

Then, as shown in FIG. 15, over the semiconductor substrate SB, in other words, over the interlayer insulation film IL1 including over the bottom surface and the sidewall of the trench D3, an insulation film HK is formed. Then, over the semiconductor substrate SB, in other words, over the insulation film HK, metal films ME1 and ME2 are sequentially formed as conductor films for the gate electrode in such a manner as to fully fill the trench D3.

In the formation step of the insulation film HK and the metal film ME1, the inside of the trench D3 is not fully filled. By forming the metal film ME2 over the metal film ME1, the trench D3 is fully filled. Further, the metal film formed of the metal films ME1 and ME2 is also formed over the interlayer insulation film IL1.

The insulation film HK is an insulation film for a gate insulation film to be formed in the peripheral circuit region 1B. The metal film is a conductor film for a gate electrode. Specifically, the insulation film HK is a film forming the gate insulation film of a low breakdown voltage MISFET to be formed in the peripheral circuit region 1B later. The insulation film HK is an insulation material film higher in dielectric constant (relative dielectric constant) than any of a silicon oxide and a silicon nitride, a so-called high-k film (high dielectric constant film).

For the insulation film HK, there can be used a metal oxide film such as a hafnium oxide film, a zirconium oxide film, an aluminum oxide film, a tantalum oxide film, or a lanthanum oxide film. Further, the metal oxide films can also further contain one or both of nitrogen (N) and silicon (Si). The insulation film HK can be formed by, for example, an ALD (Atomic layer Deposition) method. The film thickness of the insulation film HK is, for example, 1.5 nm. When a high dielectric constant film (herein, the insulation film HK)

is used for the gate insulation film, the physical film thickness of the gate insulation film can be increased more than when the silicon oxide film is used. This can provide an advantage of being capable of reducing the leakage current.

As the metal films ME1 and ME2, there can be used a metal film such as a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum nitride carbide (TaCN) film, a titanium (Ti) film, a tantalum (Ta) film, a titanium aluminum (TiAl) film, or an aluminum (Al) film. Incidentally, the metal film herein referred to denotes a conductor film showing metal conduction, and is assumed to include not only an elementary metal film (pure metal film) or an alloy film, but also a metal compound film showing metal conduction. The metal film can be formed using, for example, a sputtering method.

Herein, for example, the metal film ME1 is formed of a titanium nitride (TiN) film, and the metal film ME2 over the titanium nitride film is formed of an aluminum (Al) film. At this step, the aluminum film is preferably made thicker than the titanium nitride film. The aluminum film is low in resistance, which enables the reduction of the resistance of the gate electrode to be formed later.

Subsequently, unnecessary portions of the metal films ME1 and ME2, and the insulation film HK outside the trench D3 are polished and removed by a CMP method, or the like. As a result, the insulation film HK and the metal films ME1 and ME2 are left in the trench D3. At this step, the insulation film IF6 is also removed. As a result, respective top surfaces of the control gate electrode CG, the memory gate electrode MG, and the upper electrode UE are exposed. Whereas, the metal films ME1 and ME2 embedded in the trench D3 over the gate insulation film GI2 in the peripheral circuit region 1B form a gate electrode G1.

As a result, in the peripheral circuit region 1B, a low breakdown voltage MISFET Q1 is formed. The MISFET Q1 is a field effect transistor having the gate electrode G1, and the source/drain regions lateral to the gate electrode G1. The insulation film HK and the gate insulation film GI2 immediately under the gate electrode G1 form the gate insulation film of the MISFET Q1. The gate electrode G1 is a metal gate electrode. In the present embodiment, the dummy gate electrode DG is removed, and is replaced with the gate electrode G1. For this reason, the dummy gate electrode DG is a pseudo gate electrode, and can be regarded as a gate electrode for substitution.

Further, in the present embodiment, a metal film is used to form the gate electrode G1. Respective electrodes are formed as metal gate electrodes. This can provide an advantage of enabling the size reduction of a transistor element (the reduction of the thickness of the gate insulation film).

In the peripheral circuit region 1B, the gate electrode G1 is adjacent at its bottom surface and sidewall to the insulation film HK over the gate insulation film GI2. In other words, the gate insulation film GI2 and the insulation film HK are interposed between the gate electrode G1 and the semiconductor substrate SB; and at least the insulation film HK is interposed between the gate electrode G1 and the sidewall SW.

Subsequently, over the interlayer insulation film IL1, an insulation film IF7 is formed using, for example, a CVD method. Then, using a photolithography technology and an etching method, the insulation film IF7 is processed. As a result, the insulation film IF7 is left in the peripheral circuit region 1B. In other words, the insulation film IF7 covers the top surface of the gate electrode G1, and does not cover respective top surfaces of the control gate electrode CG, the memory gate electrode MG, and the upper electrode UE. The insulation film IF7 is formed of a silicon oxide film or a silicon nitride film.

Subsequently, the same salicide process as the step described by reference to FIG. 11 is performed. As a result, silicide layers S2 are formed at respective top surfaces of the control gate electrode CG, the memory gate electrode MG, and the upper electrode UE exposed from the insulation film IF7. Herein, the reason why the insulation film IF7 covers the top surface of the gate electrode G1 is as follows: in the salicide process, when the unreacted portions of the metal film are removed after the heat treatment, the gate electrode G1 of a metal gate electrode is prevented from being removed together with the metal film. In other words, the insulation film IF7 is a protective film of the gate electrode G1.

Figure 17:
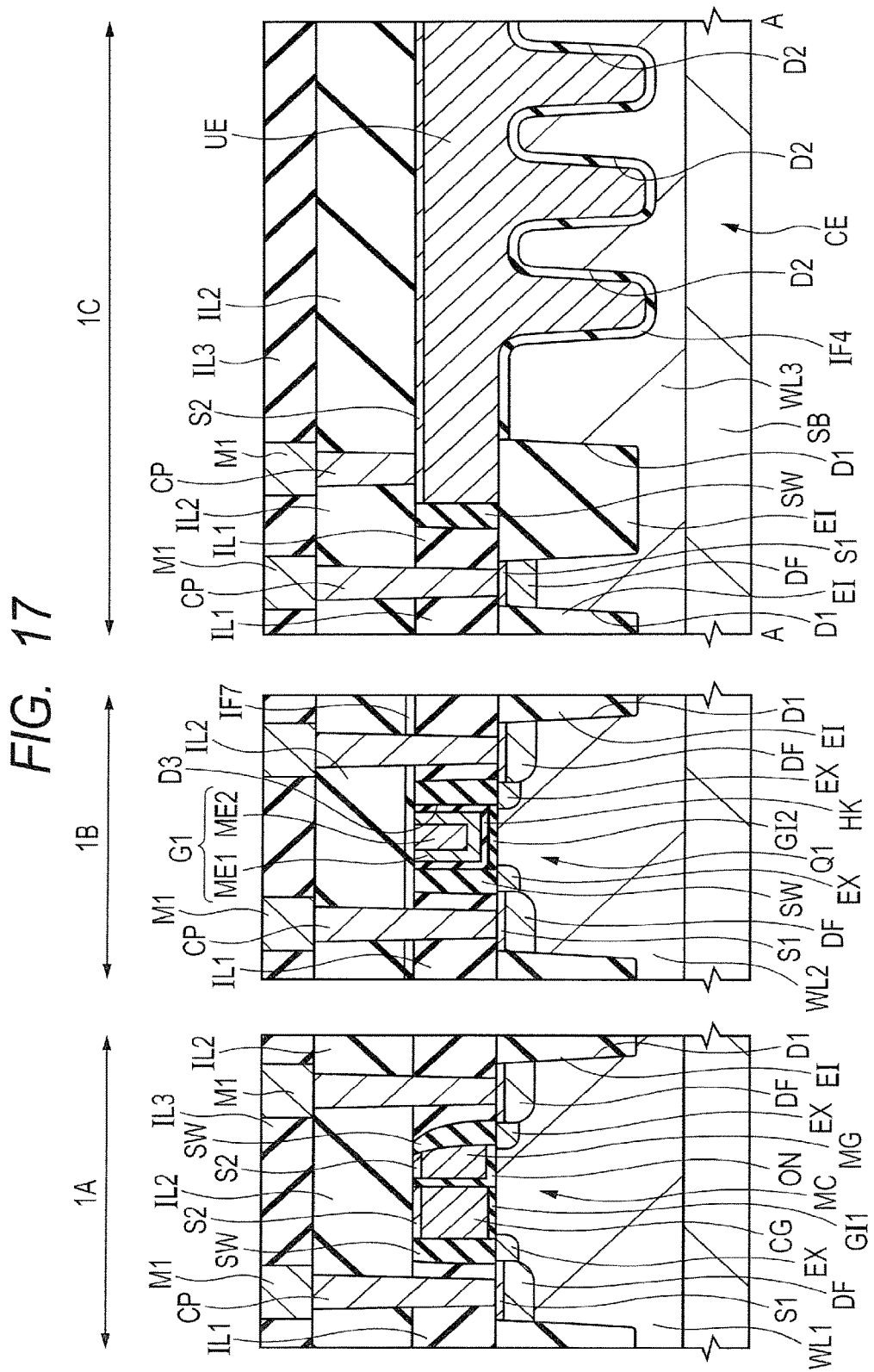
FIG. 17 is a cross sectional view of the semiconductor device during a manufacturing step following FIG. 15.

Then, as shown in FIGS. 16 and 17, an interlayer insulation film, a plurality of contact plugs, and a plurality of wires are formed. Incidentally, the planar layout shown in FIG. 16 shows only the trenches D1 and D2, the upper electrode UE, the element isolation region EI, the well WL3, the type semiconductor region DF, and the contact plugs CP in the capacitor element region 1C. Further, in FIG. 16, the outlines of the trenches D1 and D2, the well WL3, and the element isolation region EI at portions thereof covered with the upper electrode UE are indicated with broken lines. Herein, the outline of the element isolation region EI, and the outline of the trench D1 are indicated with the same broken line. The capacitor element region 1C of FIG. 17 is a cross section along line A-A of FIG. 16.

Herein, first, as shown in FIG. 17, an interlayer insulation film IL2 covering the entire top surface of the semiconductor substrate SB including the memory cell region 1A, the peripheral circuit region 1B, and the capacitor element region 1C is formed using, for example, a CVD method. The interlayer insulation film IL2 is formed of, for example, a silicon oxide film, and covers respective top surfaces of the control gate electrode CG, the memory gate electrode MG, the gate electrode G1, the upper electrode UE, the insulation film IF7, and the interlayer insulation film IL1.

Subsequently, with a photoresist pattern (not shown) formed over the interlayer insulation film IL2 using a photolithography technology as an etching mask, the interlayer insulation films IL1, IL2, and IF7 are dry etched. This results in the formation of a plurality of contact holes (openings or through holes) penetrating through the interlayer insulation films IL1 and IL2, and a plurality of contact holes penetrating through the interlayer insulation films IL2 and IF7. At the bottom of each contact hole, there is exposed a part of the silicide layer S1 over the surface of the $n^+$ type semiconductor region DF of a part of the main surface of the semiconductor substrate SB, a part of the silicide layer S2 over the surface of the control gate electrode CG, a part of the silicide layer S2 over the surface of the memory gate electrode MG, a part of the gate electrode G1, a part of the silicide layer S2 over the surface of the upper electrode UE, or the like.

Subsequently, a plurality of conductive contact plugs CP formed of tungsten (W) or the like are formed as coupling conductors in respective contact holes, respectively. For forming the contact plug CP, for example, over the interlayer insulation film IL2 including the inside of the contact hole, a barrier conductor film (e.g., a titanium film, a titanium nitride film, or a lamination film thereof) is formed. Then, over the barrier conductor film, a main conductor film formed of a tungsten film or the like is formed in such a manner as to fully fill the inside of each contact hole. Then, the unnecessary portions of the main conductor film and the barrier conductor film outside the contact hole are removed by a CMP method, an etch back method, or the like. As a result, the contact plug CP can be formed. Incidentally, for simplification of the drawing, in FIG. 17, the barrier conductor film and the main conductor film (tungsten film) forming the contact plug CP are integrally shown.

The contact plugs CP respectively embedded in the contact holes are formed in such a manner as to be electrically coupled with respective tops of the $n^+$ type semiconductor region DF, the control gate electrode CG, the memory gate electrode MG, the gate electrode G1, and the upper electrode UE, and the like, respectively. Each contact plug CP is coupled with the top surface of the silicide layer S1 over the $n^+$ type semiconductor region DF, the top surface of the silicide layer S2 over the control gate electrode CG, the top surface of the silicide layer S2 over the memory gate electrode MG, the top surface of the gate electrode G1, the top surface of the silicide layer S2 over the upper electrode UE, or the like.

Incidentally, the cross sectional view of FIG. 17 does not show respective contact holes and contact plugs CP over the control gate electrode CG, the memory gate electrode MG, and the gate electrode G1. In other words, the contact plugs CP are coupled with the control gate electrode CG, the memory gate electrode MG, and the gate electrode G1 extending in the gate width direction, respectively, in regions not shown.

Subsequently, over the interlayer insulation film IL2 including the contact plug CP embedded therein, a first wiring layer including a first-layer wire M1 is formed. The wire M1 can be formed using a so-called single damascene technology. The first wiring layer has an interlayer insulation film IL3, and the first-layer wire M1 penetrating through the interlayer insulation film IL3. The bottom surface of the wire M1 is coupled with the top surface of the contact plug CP. Although subsequent steps are not shown, over the first wiring layer, a second wiring layer, a third wiring layer, and the like are sequentially formed to form a lamination wiring layer; then, the semiconductor wafer is singulated by a dicing step, resulting in a plurality of semiconductor chips.

In the manner up to this point, the semiconductor device of the present embodiment is manufactured. Incidentally, herein, a description has been given taking as an example the so-called high-k last manufacturing method in which after removal of the dummy gate electrode, the insulation film HK is formed. However, there may be used a so-called high-k first manufacturing method in which before removal of the dummy gate electrode, the insulation film HK is formed. The memory cell MC of the present embodiment uses a high voltage for the write/erase operations. The power supply generation circuit requires a large-scale capacitor element CE for charge accumulation and smoothing. In the capacitor element CE, apart of the upper electrode UE is embedded in the trench D2, resulting in an increase in capacitance per unit area. This enables the size reduction of the semiconductor chip.

As shown in FIG. 16, in the capacitor element region 1C, a plurality of trenches D2 each including a part of the upper electrode UE embedded therein extend in a first direction, respectively, and are arranged side by side to one another in a second direction. An annular trench D1 is formed in such a manner as to surround the region including a plurality of trenches D2 formed therein. In the trench D1, an annular element isolation region EI is formed. The upper electrode UE covers all the trenches D2 surrounded by the element isolation region EI, and covers the end of the inside of the annular element isolation region EI, in a plan view.

A plurality of the contact plugs CP are coupled with the top surface of the $n^+$ type semiconductor region DF outside the element isolation region EI, and the upper surface of the upper electrode UE. Each contact plug CP is coupled with the top surface of the upper electrode UE immediately over the element isolation region EI. In the capacitor element region 1C, the contact plug CP coupled with the top surface of the $n^+$ type semiconductor region DF of the main surface of the semiconductor substrate SB (see FIG. 17) is a coupling conductor for supplying an electric potential to the lower electrode of the capacitor element CE, i.e., the semiconductor substrate SB (well WL3) immediately under the upper electrode UE.

For the capacitor element CE of the present embodiment, the upper electrode UE is partially embedded in a plurality of trenches D2, which can increase the opposing area between the upper electrode UE and the lower electrode (semiconductor substrate). In other words, the capacitance of the capacitor element CE can be increased more than when the upper electrode is formed over a flat semiconductor substrate (lower electrode) via an insulation film.

<Regarding Operation of Nonvolatile Memory>

Then, the operation example of the nonvolatile memory will be described by reference to FIG. 41.

FIG. 41 is a table showing one example of the application conditions of voltages to respective sites of a selection memory cell at the times of "write", "erase", and "read" of the present embodiment. The table of FIG. 41 shows a voltage Vmg to be applied to the memory gate electrode MG of the memory cell MC, a voltage Vs to be applied to the source region, a voltage Vcg to be applied to the control gate electrode CG, a voltage Vd to be applied to the drain region, and a base voltage Vc to be applied to the p type well in the top surface of the semiconductor substrate as shown in FIG. 17 at respective times of "write", "erase", and "read". The selection memory cell herein referred to denotes the memory cell selected as the target on which "write", "erase", or "read" is performed. Incidentally, in the example of the nonvolatile memory shown in FIG. 17, the active region on the right side of the memory gate electrode MG is the source region, and the active region on the left side of the control gate electrode CG is the drain region.

Incidentally, those shown in the table of FIG. 41 are preferable examples of the voltage application conditions, and are not exclusive, and can be variously changed, if required. Further, in the present embodiment, injection of electrons into the silicon nitride film of the charge accumulation part in the ONO film ON (see FIG. 17) of the memory transistor is defined as "write", and injection of holes is defined as "erase".

Further, in the table of FIG. 41, the row A corresponds to the case where the write method is a SSI method, and the erase method is a BTBT method; the row B corresponds to the case where the write method is a SSI method, and the erase method is a FN method; the row C corresponds to the case where the write method is a FN method, and the erase method is a BTBT method; and the row D corresponds to the case where the write method is a FN method, and the erase method is a FN method.

The SSI method can be regarded as an operation method of performing write on the memory cell by injecting hot electrons into the silicon nitride film. The BTBT method can be regarded as an operation method of performing erase on the memory cell by injecting hot holes into the silicon nitride film. The FN method can be regarded as an operation method of performing write or erase by tunneling of electrons or holes. The FN method can be described in another expression as follows: the write of the FN method can be regarded as an operation method of performing write on the memory cell by injecting electrons into the silicon nitride film by the FN tunneling effect; and the erase of the FN method can be regarded as an operation method of performing erase on the memory cell by injecting holes into the silicon nitride film by the FN tunneling effect. Below, a description will be given specifically.

The write methods include a write method (hot electron injection write method) referred to as a so-called SSI (Source Side Injection) method in which write is performed by hot electron injection by source side injection, and a write method (tunneling write method) referred to as a so-called FN method in which write is performed by FN (Fowler Nordheim) tunneling.

For write of the SSI method, for example, the voltages (Vmg=10 V, Vs=5 V, Vcg=1 V, Vd=0.5 V, and Vb=0 V) as shown in "Write operation voltage" of the row A or the row B of the table of FIG. 41 are applied to respective sites of the selection memory cell to perform write; thus, electrons are injected into the silicon nitride film in the ONO film ON of the selection memory cell, thereby to perform write.

At this step, hot electrons are generated in the channel region under between two gate electrodes (the memory gate electrode MG and the control gate electrode CG) (between the source and the drain). Thus, hot electrons are injected into the silicon nitride film which is the charge accumulation part in the ONO film ON under the memory gate electrode MG. The injected hot electrons (electrons) are trapped by the trap level in the silicon nitride film in the ONO film ON. As a result, the threshold voltage of the memory transistor increases. Namely, the memory transistor is rendered in a write state.

For write of the FN method, for example, the voltages (Vmg=−12 V, Vs=0 V, Vcg=0 V, Vd=0 V, and Vb=0 V) as shown in "Write operation voltage" of the row C or the row D of the table of FIG. 41 are applied to respective sites of the selection memory cell to perform write; thus, in the selection memory cell, electrons are tunneled from the memory gate electrode MG, and injected into the silicon nitride film in the ONO film ON, thereby to perform write. At this step, electrons are tunneled from the memory gate electrode MG through the second silicon oxide film (top oxide film) by the FN tunneling (FN tunneling effect), are injected into the ONO film ON, and are trapped by the trap level in the silicon nitride film in the ONO film ON. As a result, the threshold voltage of the memory transistor increases. Namely, the memory transistor is rendered in a write state.

Incidentally, in write of the FN method, write can also be performed in the following manner: electrons are tunneled from the semiconductor substrate SB, and are injected into the silicon nitride film in the ONO film ON. In this case, the write operation voltages can be set at, for example, those obtained by inverting the positive and negative signs of the "write operation voltages" in the row C or the row D of the table of FIG. 41.

The erase methods include an erase method (hot hole injection erase method) referred to as a so-called BTBT method in which erase is performed by hot hole injection due to BTBT (Band-To-Band Tunneling phenomenon), and an erase method (tunneling erase method) referred to as a so-called FN method in which erase is performed by FN (Fowler Nordheim) tunneling.

For erase of the BTBT method, holes generated by BTBT are injected into the charge accumulation part (the silicon nitride film in the ONO film ON), thereby to perform erase. For example, the voltages (Vmg=−6 V, Vs=6 V, Vcg=0 V, Vd=open, and Vb=0 V) as shown in "Erase operation voltage" of the row A or the row C of the table of FIG. 41 are applied to respective sites of the selection memory cell to perform erase. As a result, holes are generated by a BTBT phenomenon, and are accelerated under an electric field. Thus, holes are injected into the silicon nitride film in the ONO film ON of the selection memory cell. This reduces the threshold voltage of the memory transistor. Namely, the memory transistor is rendered in an erase state.

For erase of the FN method, for example, the voltages (Vmg=12 V, Vs=0 V, Vcg=0 V, Vd=0 V, and Vb=0 V) as shown in "Erase operation voltage" of the row B or the row D of the table of FIG. 41 are applied to respective sites of the selection memory cell to perform erase; thus, in the selection memory cell, holes are tunneled from the memory gate electrode MG, and injected into the silicon nitride film in the ONO film ON, thereby to perform erase. At this step, holes are tunneled from the memory gate electrode MG through the second silicon oxide film (top oxide film) by the FN tunneling (FN tunneling effect), are injected into the ONO film ON, and are trapped by the trap level in the silicon nitride film in the ONO film ON. This reduces the threshold voltage of the memory transistor. Namely, the memory transistor is rendered in an erase state.

Incidentally, in erase of the FN method, erase can also be performed in the following manner: holes are tunneled from the semiconductor substrate SB, and are injected into the silicon nitride film in the ONO film ON. In this case, the erase operation voltages can be set at, for example, those obtained by inverting the positive and negative signs of the "erase operation voltages" in the row B or the row D of the table of FIG. 41

At the time of read, for example, the voltages as shown in "Read operation voltage" in the row A, the row B, the row C, or the row D of the table of FIG. 41 are applied to respective sites of the selection memory cell to perform read. The voltage Vmg to be applied to the memory gate electrode MG at the time of read is set at a value between the threshold voltage of the memory transistor in a write state and the threshold voltage in an erase state. As a result, it is possible to discriminate the write state and the erase state.

Then, respective application voltages at the operations will be described. The voltages of the external power supply to a product chip are, for example, 1.5 V for a low breakdown voltage MISFET, and 5 V for a high breakdown voltage MISFET. In the memory operation, other voltages than these are generated by the voltage generation circuit in a chip. For example, the voltage of 10 V for Vmg at the time of SSI write of a relatively higher voltage is generated by the voltage generation circuit formed of a high breakdown voltage MISFET. In the voltage generation circuit, charge accumulation, voltage smoothing or the like requires the capacitor element as shown in the capacitor element region 1C of FIG. 17.

Regarding Effects of the Present Embodiment

Below, a description will be given to the problems of a semiconductor device of Comparative Example, i.e., a semiconductor device having a split gate type MONOS memory, and a capacitor element including an upper electrode with a relatively smaller film thickness embedded in the trenches in the top surface of the semiconductor substrate. Thus, the effects of the present embodiment will be described. Herein, FIGS. 38 to 40 each show a cross sectional view of the semiconductor device of Comparative Example.

In each semiconductor device of the present embodiment and Comparative Example, as described by reference to FIGS. 1 to 15, the MISFET Q1 in the peripheral circuit region 1B is formed using the gate-last process. In other words, in the present embodiment and Comparative Example, a dummy gate electrode DG (see FIG. 10) is formed, and the dummy gate electrode DG is covered with the interlayer insulation film IL1; then, the polishing step exposes the top surface of the dummy gate electrode DG; then, the dummy gate electrode DG is replaced with a metal gate electrode.

In such a gate-last process, the polishing step of polishing the top of each gate electrode is performed. For this reason, it is difficult for form a capacitor element formed of a lamination film of a first conductor film (lower electrode) formed over the semiconductor substrate, and a second conductor film (upper electrode). This is for the following reason: even when the second conductor film is formed over the first conductor film, the polishing step removes the second conductor film. Under such circumstances, in the present embodiment and the following Comparative Example, the capacitor element is formed in which the semiconductor substrate is set as the lower electrode, and the polysilicon film over the semiconductor substrate is set as the upper electrode.

Further, in the present embodiment and the following Comparative Example, trenches are formed in the main surface of the semiconductor substrate by a dry etching method; and the upper electrode is partially embedded in the trenches. This results in an increase in opposing area between the upper electrode and the semiconductor substrate, which enables an increase in capacitance. In the present application, such an element may be referred to as a trench capacitor element.

Figure 38:
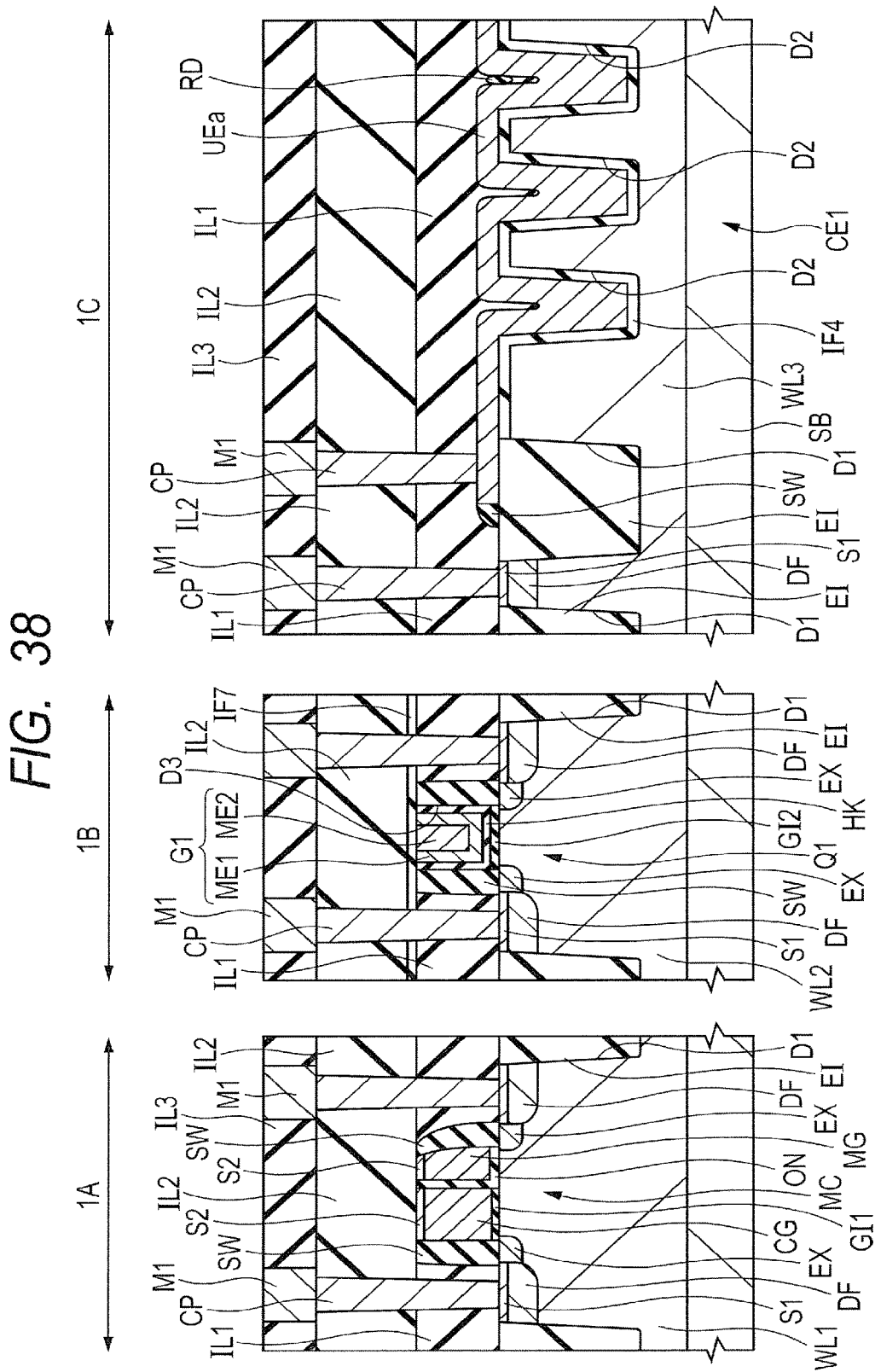
FIG. 38 is a cross sectional view of a semiconductor device of Comparative Example.

As Comparative Example, FIG. 38 shows a cross sectional view of a semiconductor device including a split gate type MONOS memory in the memory cell region 1A, a MISFET Q1 in the peripheral circuit region 1B, and a capacitor element CE1 in the capacitor element region 1C. The capacitor element CE1 includes an upper electrode UEa partially embedded in the trenches D2 formed in the main surface of the semiconductor substrate SB, and a lower electrode formed of the immediately underlying semiconductor substrate SB.

As shown in FIG. 38, the capacitor element CE1 is covered at the top thereof with the interlayer insulation films IL1 and IL2. Herein, the semiconductor device of the Comparative Example is different from the semiconductor device of the present embodiment in that the film thickness of the upper electrode UEa of the capacitor element CE1 is smaller. For example, the upper electrode UEa is formed of the polysilicon film PS2 (see FIG. 8) used for forming the memory gate electrode MG. In other words, the film thickness of the polysilicon film PS2 used for forming the memory gate electrode MG is smaller than the film thickness of the polysilicon film PS1 (see FIG. 6) used for forming the control gate electrode CG. For this reason, the film thickness of the upper electrode UEa of Comparative Example is smaller than the thickness of the control gate electrode CG.

The reason why the gate length of the memory gate electrode MG, i.e., the film thickness of the polysilicon film PS2 (see FIG. 8) forming the memory gate electrode MG is relatively smaller is as follows.

The split gate type MONOS memory has a structure in which two transistors are coupled with each other. When a current passes from the drain region on the side of the control gate electrode CG forming the memory cell MC of the MONOS memory to the source region on the memory gate electrode MG side, the channel resistance of the memory transistor including the memory gate electrode MG is high (the gate length of the memory gate electrode MG is large). Thus, a voltage drop is caused. As a result, the source potential of the control transistor including the control gate electrode CG increases, resulting in the reduction of the voltage between the gate and the source of the control transistor. Accordingly, the current value is suppressed on the control gate electrode CG side.

On the other hand, when the channel resistance under the control gate electrode CG is large, a voltage drop is caused, but the gate-source voltage of the memory transistor is less likely to be reduced. Namely, the drain voltage of the memory transistor is affected by the voltage drop, and is reduced. However, in a saturated region, even when the drain voltage is reduced a little, a change in current is hardly caused. Accordingly, even when the gate length of the control gate electrode CG is larger than the gate length of the memory gate electrode MG, the characteristics of the memory cell are less affected. From the description up to this point, the memory gate electrode MG is required to be formed of the polysilicon film PS2 smaller in film thickness than the polysilicon film PS1 to be used for forming the control gate electrode CG.

From the viewpoints of preventing a voltage drop, improving the operation speed of the memory cell, and the like, the gate length of the memory gate electrode MG is desirably smaller. Accordingly, it can be considered that the film thickness of the polysilicon film PS2 to be used for forming the memory gate electrode MG is reduced in order to reduce the gate length of the memory gate electrode MG by the miniaturization of the semiconductor device, or the like. Herein, when the polysilicon film PS2 to be used for forming the memory gate electrode MG is processed, thereby to form the upper electrode UEa of the capacitor element CE1 as in Comparative Example, the film thickness of the polysilicon film PS2 becomes less than ½ the open width of the trench D2. Thus, the trench D2 may not be able to be fully filled with the polysilicon film PS2.

In this case, as shown in FIG. 38, the upper electrode UEa is partially formed in each trench D2 along the sidewall and the bottom surface of the trench D2; and a deep concave part is formed in the top surface of the upper electrode UEa immediately over the trench D2. Namely, the top surface of the upper electrode UEa cannot be formed nearly flat. For this reason, even when the polishing step described by reference to FIG. 13 is performed, the concave parts are left in the top surface of the upper electrode UEa. Incidentally, when the film thickness of the upper electrode UEa is smaller than the thickness of the control gate electrode CG formed after the polishing step, in the polishing step, the top surface of the upper electrode UEa is not polished. In other words, even when polishing is performed, the top surface of the upper electrode UEa is not exposed, and remains covered with the interlayer insulation film IL1.

In this case, in the formation step of the silicide layer S2 described by reference to FIG. 15, the silicide layer S2 cannot be formed at the top surface of the upper electrode UEa. For this reason, even when a contact plug is coupled with the top surface of the upper electrode UEa, the coupling resistance between the contact plug and the upper electrode UEa cannot be reduced. This unfavorably reduces the characteristics of the capacitor element CE1.

Whereas, when a deep concave part is formed immediately over the trench D2 in the top surface of the upper electrode UEa as described above, a residue RD may be generated in the inside of the concave part in the formation step of the sidewall SW. In this case, thereafter, the residue RD may peel off, resulting in a foreign matter. The formation of the foreign matter causes a defect of the semiconductor device.

In contrast, in the present embodiment, the control gate electrode CG and the upper electrode UE are formed of the same polysilicon film PS1 (see FIG. 6). For this reason, after the polishing step described by reference to FIG. 13, the control gate electrode CG and the upper electrode UE have the same height, and are exposed from the interlayer insulation film IL1. Therefore, in the second salicide process described by reference to FIG. 15, the silicide layer S2 is formed at the top surface of the upper electrode UE.

Accordingly, a silicide layer is not formed at the top surface of the upper electrode due to the small film thickness of the upper electrode as in the Comparative Example. This can prevent an increase in coupling resistance between the upper electrode and the contact plug. Thus, it is possible to prevent the capacitor element from ceasing to operate normally due to the increase in the coupling resistance. This can improve the reliability of the semiconductor device.

Namely, in the present embodiment, even after the polishing step described by reference to FIG. 13, the control gate electrode CG and the upper electrode UE have the same film thickness. Accordingly, the top surface of the upper electrode UE is not covered with the interlayer insulation film IL1. For this reason, the silicide layer S2 is formed in such a manner as to be in contact with the top surface of the upper electrode UE. As shown in FIG. 17, the top surface of the upper electrode UE is not covered with the interlayer insulation film IL1, and is covered with the interlayer insulation film IL2. In other words, in a plan view, the interlayer insulation film IL1 and the upper electrode UE do not overlap each other.

Further, it is possible to prevent the formation of a deep concave part in the top surface of the upper electrode UE. This can prevent the following situation: the residue RD (see FIG. 38) is left in the concave parts, and, subsequently, the residue RD peels off to become a foreign matter, which causes a defect of the semiconductor device.

As described above, the polysilicon film PS1 (see FIG. 11) to be used for forming the control gate electrode CG has a relatively larger film thickness. For this reason, the polysilicon film PS1 can fully fill the trench D2. A first reason why the film thickness of the polysilicon film PS1 is relatively larger is as follows: in order to prevent a variation in transistor characteristics of the memory cell MC, the polysilicon film PS1 is formed with a large film thickness to a certain degree.

In other words, the control gate electrode CG before the polishing step is required to have a height (thickness) enough to prevent the impurity implanted for forming the n$^-$ type semiconductor regions EX and the n$^+$ type semiconductor regions DF forming the source/drain regions from passing through the gate electrode, and being implanted into the portion in which the channel is formed. Namely, in the ion implantation step described by reference to FIG. 11, when the impurity ions pass through the control gate electrode CG, and are doped into the main surface of the semiconductor substrate SB, the transistor characteristics vary. For this reason, in order to prevent this, the control gate electrode CG before the polishing step, i.e., the polysilicon film PS1 (see FIG. 6) is required to be formed with a thickness equal to, or larger than a prescribed thickness.

Specifically, at the time of ion implantation described by reference to FIG. 11, the thickness of the control gate electrode CG is required to be larger than any of the thickness (depth) of the n$^-$ type semiconductor regions EX, and the thickness (depth) of the n$^+$ type semiconductor regions DF forming the source/drain regions.

Whereas, a second reason why the film thickness of the polysilicon film PS1 is relatively larger is as follows: as described by reference to FIG. 13, in the case where the gate-last process is adopted, when the top surface of the interlayer insulation film IL1 is polished, overpolishing of partially removing the top surface of the control gate electrode CG by polishing is performed; accordingly, the film thickness of the polysilicon film PS1 forming the control gate electrode CG is previously set larger.

In other words, in the gate-last process, the dummy gate electrode DG and the control gate electrode CG shown in FIG. 12 are filled with the interlayer insulation film IL1. Then, as described by reference to FIG. 13, the top surface of the interlayer insulation film IL1 is polished by a CMP method, or the like. At this step, the following is difficult: by controlling the polishing amount with precision, the top surface of the dummy gate electrode DG is not removed, and the top surface is exposed from the interlayer insulation film IL1 and the insulation film IF5 (see FIG. 12). Therefore, at the time of the polishing, polishing is stopped at the point when the top surface of the dummy gate electrode DG is removed to a certain degree by polishing. As a result, the top surface of the dummy gate electrode DG is exposed.

At this step, when the film thicknesses of the control gate electrode CG and the dummy gate electrode DG become excessively small, the control transistor and the MISFET Q1 formed later may cease to operate normally. Therefore, the polysilicon film PS1 for forming the control gate electrode CG and the dummy gate electrode DG is required to previously ensure a large film thickness.

Further, as described by reference to FIG. 15, the gate electrode G1 of a metal gate electrode is formed in the peripheral circuit region 1B. Then, in order to reduce the resistance of the control gate electrode CG and the memory gate electrode MG, desirably, respective top surfaces of the control gate electrode CG and the memory gate electrode MG are silicidized, thereby to provide the silicide layer S2. However, in the polishing step described by reference to FIG. 13, when the control gate electrode CG becomes too thin, the silicide layer S2 comes in contact with the gate insulation film GI1. Thus, conceivably, the gate insulation film GI1 and the material of the gate electrode are allowed to react with each other. In this case, there occurs the phenomenon referred to as Fermi level pinning that the effective work function of the control gate electrode CG is shifted. This unfavorably results in an increase in absolute value of the threshold voltage of the MOSFET.

For this reason, when the control gate electrode CG is excessively thin, and the film thicknesses of the formed silicide layers S2 vary among respective memory cells MC, the memory cell MC in which the control gate electrode CG is silicidized to the position thereof in contact with the top surface of the gate insulation film GI1, and the memory cell MC in which the control gate electrode CG formed of a silicon film is left between the silicide layer S2 and the gate electrode GI1 may merge with each other. In this case, a plurality of memory cells MC vary from one another in characteristics. Under such circumstances, in order to avoid the occurrence of such a variation in characteristics, the polysilicon film PS1 for forming the control gate electrode CG is required to be previously formed thick.

Incidentally, it can also be considered that the polysilicon film for forming the control gate electrode CG, and the polysilicon film for forming the dummy gate electrode DG are deposited separately according to the manufacturing method. In this case, it can also be considered that a difference is caused in film thickness between the polysilicon films. However, even when the control gate electrode CG and the dummy gate electrode DG are thus formed of different polysilicon films, in order to keep the uniformity in height among respective top surfaces of the interlayer insulation film IL1 and respective gate electrodes in the polishing step, the polysilicon films are required to have a uniform film thickness. Accordingly, in the gate-last process, the polysilicon film PS1 for forming the control gate electrode CG has a relatively larger film thickness.

Further, in the removal step of the dummy element isolation region DEI described by reference to FIGS. 4 and 5, with the lamination film of the insulation films IF1 and IF2 left over the semiconductor substrate SB between the adjacent trenches D2, dry etching is performed. However, when the dry etching is performed after removing the insulation films IF1 and IF2 shown in FIG. 4, the top surface of the semiconductor substrate SB is largely damaged. In other words, the surface of the semiconductor substrate SB between the adjacent trenches D2 is exposed, and hence is damaged by the plasma of dry etching. Accordingly, the upper electrode UE (see FIG. 17) formed subsequently is low in quality, which unfavorably reduces the reliability of the semiconductor device.

Whereas, when the film covering the top surface of the semiconductor substrate SB between the trenches D2 is only a silicon oxide film, the silicon oxide film is eliminated at the initial stage of the dry etching. Accordingly, similarly, the surface of the semiconductor substrate SB is damaged, which unfavorably reduces the reliability of the semiconductor device.

In contrast, in the present embodiment, in the dry etching, the insulation film IF2 and the insulation film IF1 each formed of a silicon nitride film less likely to be removed are used as a mask. This can prevent the top surface of the semiconductor substrate SB between the adjacent trenches D2 from being damaged by dry etching.

Further, in order to avoid the problem of occurrence of the damage as described above, it can be considered that the removal step of the dummy element isolation region DEI described by reference to FIG. 5 is performed not by dry etching but by wet etching. However, in this case, the corner part of the end of the bottom surface of the trench D2, and the corner part of the top of the sidewall of the trench D2 are each in an angular shape. This unfavorably causes a leakage current to pass between the upper electrode and the lower electrode in the capacitor element.

Figure 39:
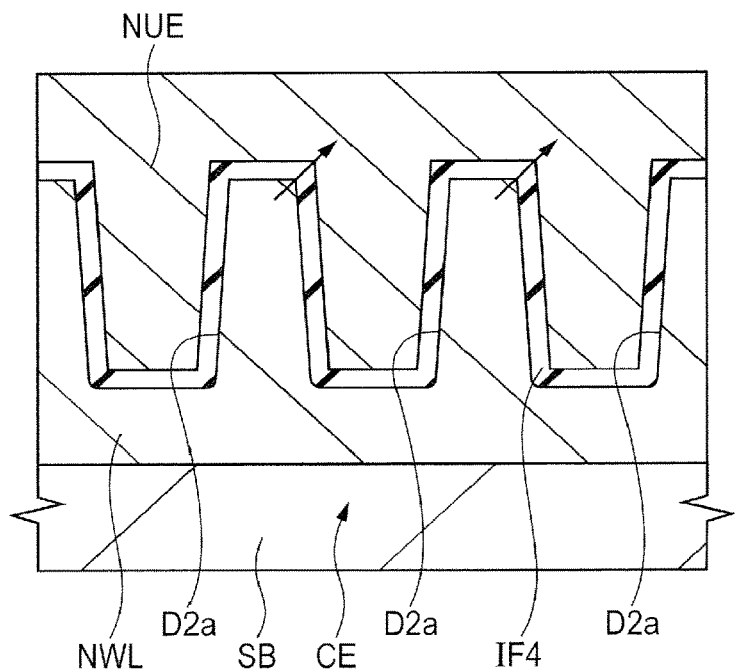
FIG. 39 is a cross sectional view of a semiconductor device of Comparative Example.
Figure 40:
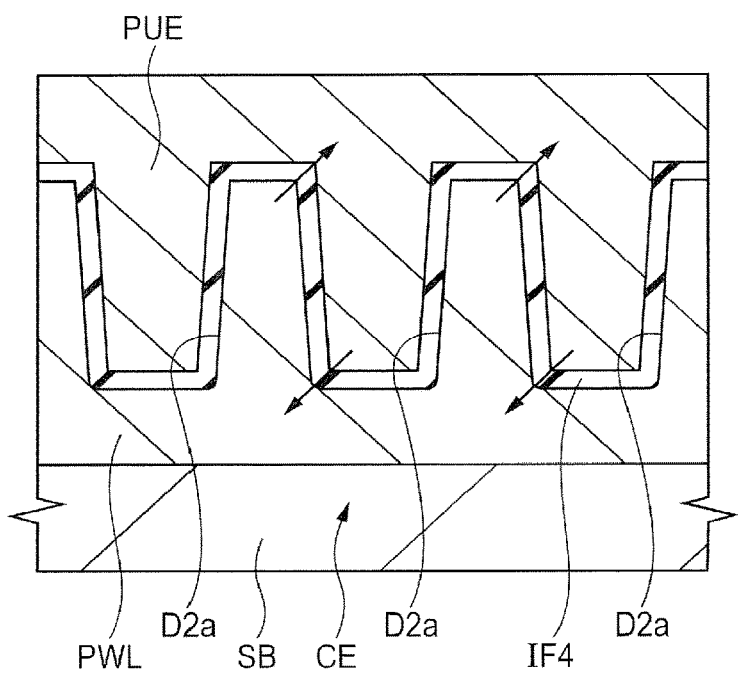
FIG. 40 is a cross sectional view of a semiconductor device of Comparative Example.

Namely, as shown as Comparative Example in FIGS. 39 and 40, when the dummy element isolation region is removed by wet etching, the trench D2a including an upper electrode NUE (see FIG. 39) or a PUE (see FIG. 40) of the trench capacitor element embedded therein is in an angular shape at both the bottom surface end and the sidewall upper end thereof. Respective corner parts of the bottom surface end and the sidewall upper end of the trench D2a are hardly rounded as with respective corner parts of the bottom surface end and the sidewall upper end of the trench D1 shown in FIG. 4. For this reason, at the corner parts shown in FIGS. 39 and 40, an electric field concentration becomes more likely to occur.

Incidentally, FIGS. 39 and 40 are each a cross sectional view showing the semiconductor device of Comparative Example, and each show a part of the vicinity of the trench portion of the trench capacitor element on an enlarged scale. In FIG. 39, in the main surface of the semiconductor substrate SB of the lower electrode forming the trench capacitor element, an n type well NWL is formed; and over the semiconductor substrate SB, an upper electrode NUE formed of an n type polysilicon film is formed via the insulation film IF4. In FIG. 40, in the main surface of the semiconductor substrate SB of the lower electrode forming the trench capacitor element, a p type well PWL is formed; and over the semiconductor substrate SB, an upper electrode PUE formed of a p type polysilicon film is formed via the insulation film IF4.

As shown in FIG. 39, in the trench capacitor element formed of the n type upper electrode NUE and the n type well NWL, upon application of a plus potential to the n type upper electrode NUE, electric field concentration occurs in the well NWL of the corner part of the upper end of the trench D2a. As a result, electrons of majority carriers of the n type semiconductor flow from the well NWL at the corner part to the upper electrode NUE side. Accordingly, the leakage current reduces the life of the insulation film IF4 or the like in the vicinity of the corner part. This unfavorably reduces the reliability as the capacitor element. In FIG. 39, the position from which electrons flow out for the foregoing reason is indicated with an arrow.

Further, as shown in FIG. 40, in the trench capacitor element formed of the p type upper electrode PUE and the p type well PWL, upon application of a minus potential to the upper electrode PUE, electric field concentration occurs in the well PWL at the corner part of the upper end of the trench D2a. As a result, holes of majority carriers of the p type semiconductor flow from the well PWL at the corner part to the upper electrode PUE side. Accordingly, the leakage current reduces the life of the insulation film IF4 or the like in the vicinity of the corner part. This unfavorably reduces the reliability as the capacitor element. In FIG. 40, the position from which electrons flow out for the foregoing reason is indicated with an arrow.

Further, as shown in FIG. 40, in the trench capacitor element formed of the p type upper electrode PUE and the p type well PWL, when the electric field applied to the electrode of the capacitor element is large, electrons of minor carriers on the upper electrode PUE side start to flow toward the well PWL due to the bending of the band. At this step, the flow of electrons becomes particularly remarkable due to the electric field concentration at the upper electrode PUE in the vicinity of the bottom surface end of the trench D2a, i.e., the corner part of the upper electrode PUE. The leakage current reduces the life of the insulation film IF4 or the like in the vicinity of the corner part. In FIG. 40, the position from which electrons flow out for the foregoing reason is indicated with an arrow.

Thus, unfavorably, in the n type trench capacitor element, a leakage current tends to be caused due to the shape of the upper end of the trench D2a; and in the p type trench capacitor element, a leakage current tends to be caused due to the shapes of the upper end and the bottom surface end of the trench D2a.

In contrast, in the present embodiment, as shown in FIGS. 4 and 5, the dummy element isolation region DEI is removed using not wet etching but dry etching. As a result, the corner part of the top of the sidewall of the trench D2 is cut and rounded by dry etching. Whereas, the central part of the bottom surface of the trench D2 is cut by dry etching. Accordingly, the bottom surface end of the trench D2 is rounded. For this reason, as shown in FIG. 17, when each electrode of the capacitor element CE is applied with a voltage with the upper electrode UE embedded in the trenches D2, it is possible to relax the electric field generated in the well WL3 at the bottom surface end of the upper electrode in the trench D2, and the sidewall upper end of the trench D2.

Therefore, it is possible to prevent the occurrence of the electric field concentration at the corner parts of the trench D2 of the trench capacitor element. For this reason, it is possible to prevent the generation of the leakage current between the lower electrode and the upper electrode UE, and to prevent the reduction of the life of the insulation film IF4 interposed between the lower electrode and the upper electrode UE. Therefore, it is possible to prevent the reduction of the reliability of the semiconductor device due to the generation of the leakage current or the reduction of the life of the capacitor element CE.

Further, as described by reference to FIG. 6, in the present embodiment, the step of forming the sacrificial oxide film at the sidewall and the bottom surface of the trench D2 by an oxidation treatment, followed by removal thereof is repeatedly performed twice. For this reason, it is possible to remove the damages caused on the sidewall and the bottom surface of the trench D2 by the dry etching step described by reference to FIG. 5. Therefore, it is possible to improve the reliability of the semiconductor device.

Further, when the dummy element isolation region is removed by wet etching, it is necessary to prevent the element isolation region EI in the trench D1 (see FIG. 4) from being removed by wet etching. This creates a necessity of ensuring a large space between the trench D1 and the trench D2, which unfavorably hinders the miniaturization of the semiconductor device. In other words, by the chemical used in wet etching (isotropic etching), in addition to the dummy element isolation region DEI, the insulation film IF1 over the main surface of the semiconductor substrate SB, and the like are also removed. Thus, it can be considered that the insulation film IF1 exposed from the photoresist film PR1 is retreated to the element isolation region EI in the region covered with the photoresist film PR1. In this case, the chemical reaches to the element isolation region EI, so that even the element isolation region EI may be removed. Therefore, in order to prevent this, it becomes necessary to expand the distance between the trench D2 and the trench D1.

In contrast, in the present embodiment, the dummy element isolation region is removed by the dry etching step. Accordingly, the element isolation region EI is not removed. For this reason, it is possible to reduce the distance between the trench D2 and the trench D1, which can facilitate the miniaturization of the semiconductor device.

Regarding First Modified Example

Figure 18:
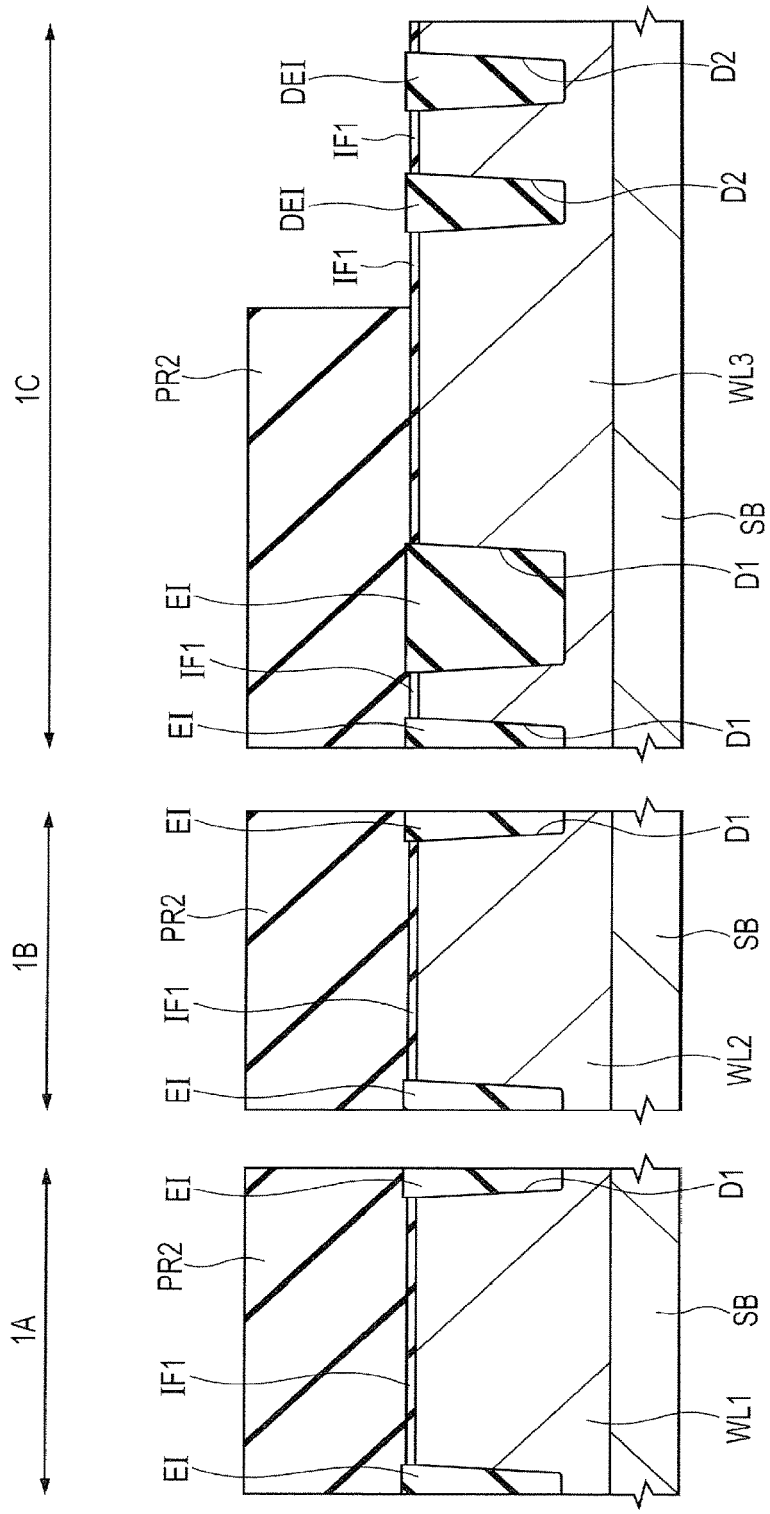
FIG. 18 is across sectional view of First Modified Example of the semiconductor device of First Embodiment during a manufacturing step.
Figure 19:
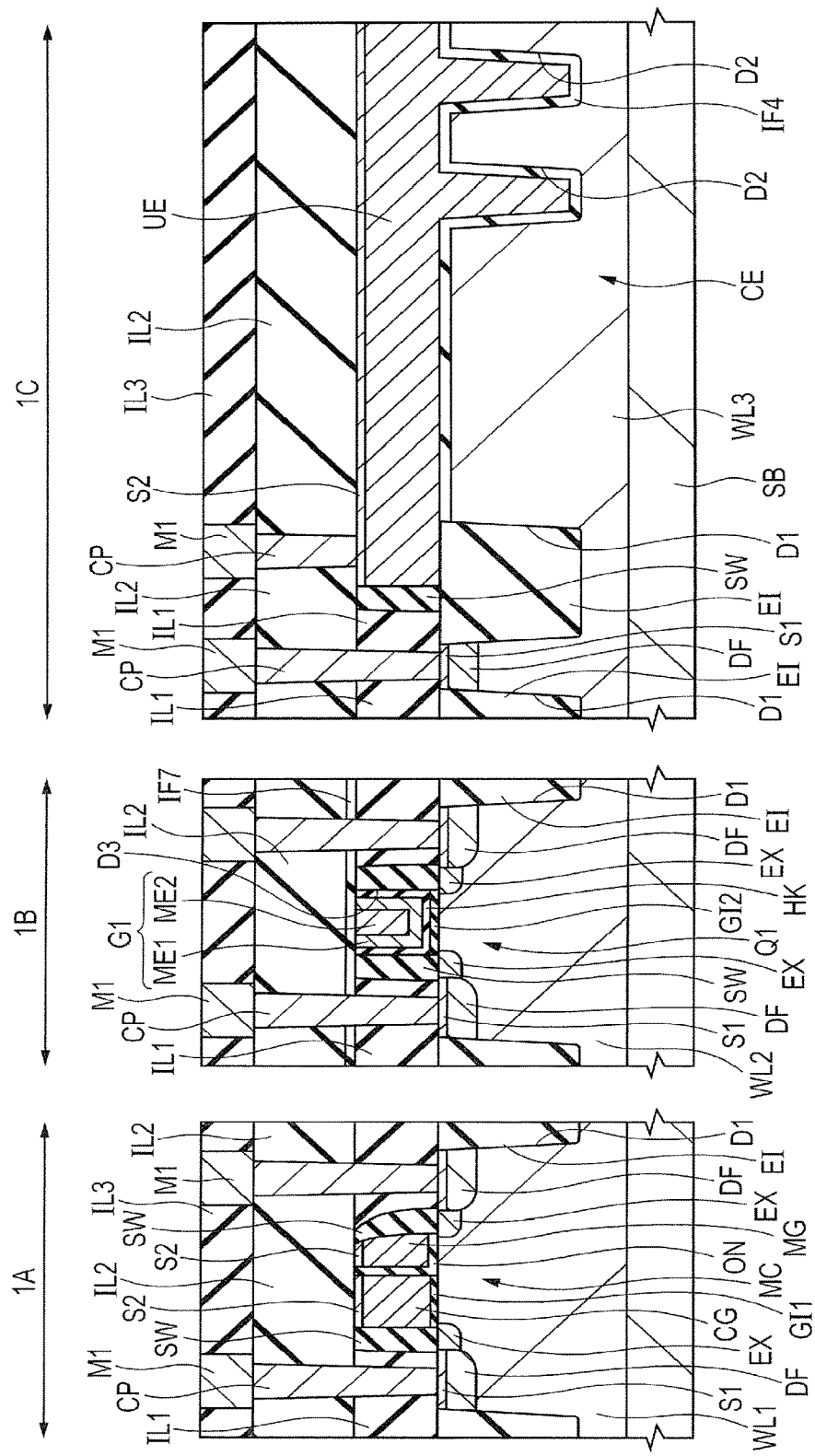
FIG. 19 is a cross sectional view of the semiconductor device during a manufacturing step following FIG. 18.

Below, First Modified Example of the semiconductor device of the present embodiment will be described by reference to FIGS. 18 and 19. FIGS. 18 and 19 are each a cross sectional view for illustrating a method for manufacturing a semiconductor device of First Modified Example of the present embodiment. FIGS. 18 and 19 each show, as with FIGS. 1 to 15, and 17, the cross sections of the memory cell region 1A, the peripheral circuit region 1B, and the capacitor element region 1C.

In the present modified example, a description will be given to the following: when a problem is not caused in terms of the reliability at the corner part of the trench of the trench capacitor element, the dummy element isolation region is removed by wet etching (isotropic etching).

In the manufacturing steps of the present modified example, first, the steps described by reference to FIGS. 1 to 3 are performed. Then, as shown in FIG. 18, the insulation film IF2 is removed. Subsequently, the cleaning step of the main surface of the semiconductor substrate SB is performed. Subsequently, a sacrificial oxide film is formed at the surface of the semiconductor substrate SB. Then, ion implantation is selectively performed on each region, thereby to form wells WL1 to WL3. Then, a heat treatment is performed, thereby to diffuse the impurities in the wells WL1 to WL3.

Then, a photoresist film PR2 is formed over the main surface of the semiconductor substrate SB. Herein, as compared with the photoresist film PR1 described by reference to FIG. 4, the termination part of the photoresist film PR2 between the trenches D1 and D2 in the capacitor element region 1C is more largely separated from the end of the trench D1. Further, as distinct from the structure of FIG. 4, herein, the trench D1 and the trench D2 in the capacitor element region 1C are largely separated from each other.

This is for the following reason: it is necessary to prevent the removal of the element isolation region EI in the trench D1 by wet etching for removing the dummy element isolation region DEI to be performed next. Namely, it is necessary to prevent the following: the insulation film IF1 is isotropically removed by the wet etching, and is retreated to the trench D1; as a result, in the capacitor element region 1C, the element isolation region EI in the trench D1 covered with the photoresist film PR2 is removed.

Accordingly, herein, in order to prevent the insulation film IF1 from being retreated to the trench D1, a large width of the insulation film IF1 adjacent to the trench D1 to be covered with the photoresist film PR2 in the vicinity of the termination part of the photoresist film PR2 is ensured.

Subsequent steps are not shown particularly. However, using the photoresist film PR2 as a mask, the wet etching is performed. Thus, the insulation film IF1 and the dummy element isolation region DEI exposed from the photoresist film PR2 are removed. As a result, the sidewall and the bottom surface of the trench D2 are exposed. Subsequently, after removing the photoresist film PR2, the sacrificial oxide film is removed. Then, in the same manner as the step described by reference to FIG. 6, the insulation films IF3 and IF4, the polysilicon film PS1, and the insulation film IF5 are formed. However, two sacrificial oxidation steps described by reference to FIG. 6 are not herein performed.

Then, the steps described by reference to FIGS. 7 to 17 are performed. As a result, the semiconductor device of the present modified example shown in FIG. 19 is completed. Herein, the dummy element isolation region DEI is removed by wet etching. For this reason, respective corner parts of the bottom surface end and the top of the sidewall of the trench D2 are hardly rounded as with the trench D1.

As in the present modified example, the leakage current in the trench capacitor element as described by reference to FIGS. 39 and 40 is hardly caused, and causes no problem. In such a case, even when the dummy element isolation region DEI (see FIG. 18) is removed by wet etching, the reliability of the semiconductor device is not reduced. When the dummy element isolation region DEI is removed by wet etching as in the present modified example, the following effects can be obtained.

Namely, the dummy element isolation region DEI in the trench D2 is not removed by dry etching. This can prevent a plasma damage from being inflicted on the surface of the semiconductor substrate SB including the sidewall and the bottom surface of the trench D2 due to dry etching.

Further, the surface of the semiconductor substrate SB is not subjected to a plasma damage as described above. For this reason, after removing the dummy element isolation region DEI, the two sacrificial oxidation steps as described by reference to FIG. 6 are not required to be performed. When the sacrificial oxidation step is performed, the ion implantation step of forming the wells WL1 to WL3 is required to be performed after forming the sacrificial oxide film. However, in the present modified example, the sacrificial oxidation step is not performed. For this reason, before the removal step of the dummy element isolation region DEI shown in FIG. 18, in other words, before forming the photoresist film PR2, the wells WL1 to WL3 can be formed.

Herein, when the memory cell region 1A, the peripheral circuit region 1B, and the capacitor element region 1C are subjected to ion implantations under different conditions, respectively, thereby to form the wells WL1 to WL3, a photoresist pattern is formed/removed for each ion implantation for forming each well. If such formation/removal steps of the photoresist pattern are repeated after removing the dummy element isolation region DEI, it may become difficult to fully remove the photoresist pattern in the trench D2. In this case, there is caused a problem of an increase in manufacturing cost due to cleaning, or a problem of the reduction of the reliability of the semiconductor device resulting from partial remaining of the photoresist film in the trench D2.

In contrast, in the present modified example, with the trench D2 filled with the dummy element isolation region DEI, the wells WL1 to WL3 can be formed. For this reason, it is possible to readily perform the formation/removal of the photoresist pattern for differently forming respective wells.

Further, in the present modified example, as with the embodiment described by reference to FIGS. 1 to 17, using the polysilicon film to be used for forming the control gate electrode CG, the upper electrode UE to fill the trench D2 is formed. Fort this reason, as compared with Comparative Example shown in FIG. 38, the flatness of the top surface of the upper electrode UE can be improved. As a result, it is possible to prevent the occurrence of defective deposition due to the concave parts in the top surface of the upper electrode UE. Further, it is possible to prevent the following: concave parts are formed in the top surface of the upper electrode UE, so that a residue or a cavity is generated in each concave part. Furthermore, it is possible to prevent the top surface of the upper electrode UE from being reduced in height. Accordingly, a silicide layer S2 can be formed over the upper electrode UE.

Regarding Second Modified Example

Figure 20:
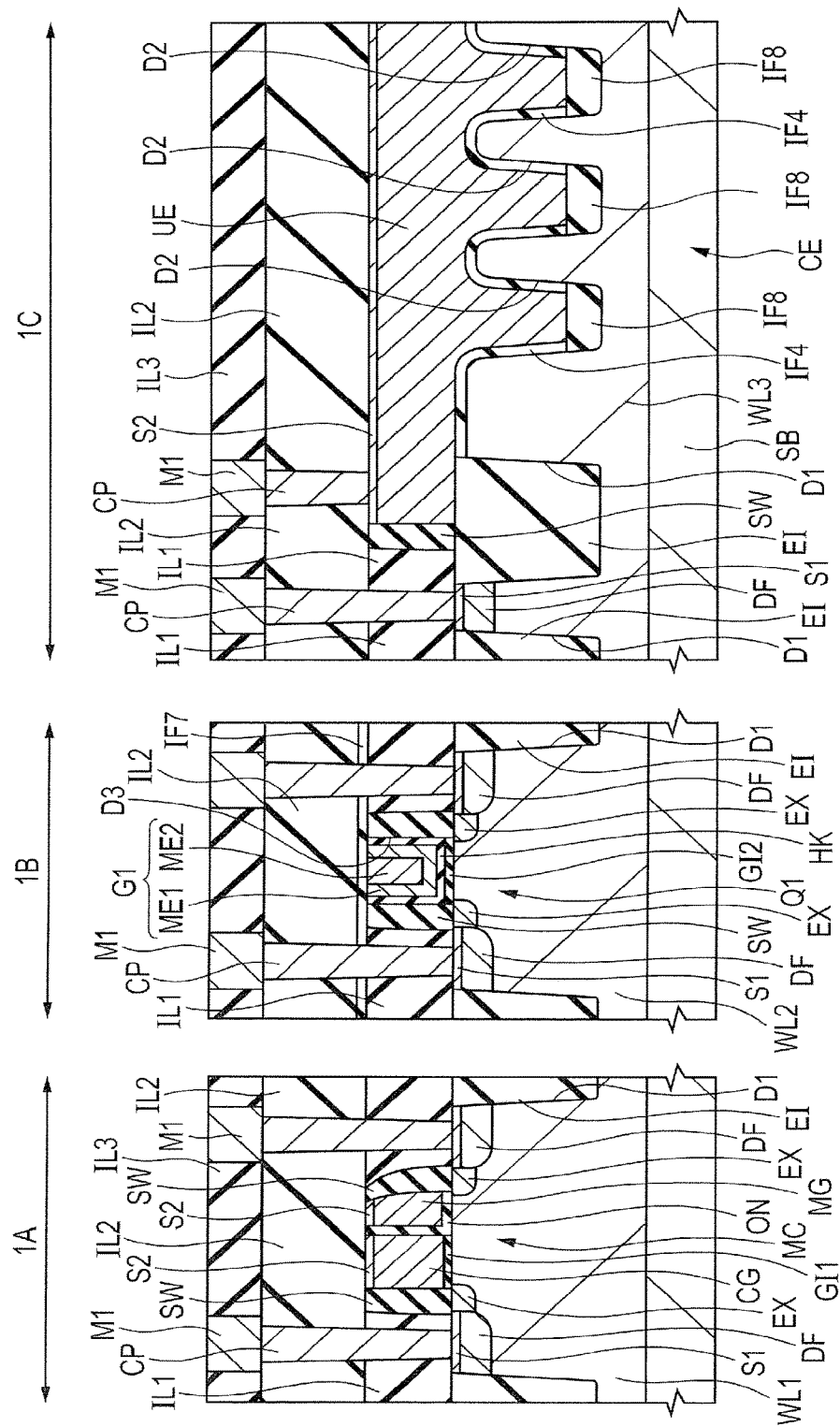
FIG. 20 is a cross sectional view of Second Modified Example of the semiconductor device of First Embodiment during a manufacturing step.

Below, Second Modified Example of the semiconductor device of the present embodiment will be described by reference to FIG. 20. FIG. 20 is a cross sectional view for illustrating a method for manufacturing a semiconductor device of Second Modified Example of the present embodiment. FIG. 20 shows, as with FIGS. 1 to 15, and 17, the cross sections of the memory cell region 1A, the peripheral circuit region 1B, and the capacitor element region 1C.

In the present modified example, a description will be given to the following: the dry etching for removing the dummy element isolation region described by reference to FIG. 5 is stopped before the dummy element isolation region is fully removed; as a result, the insulation film is left at the bottom of the trench in which the upper electrode of the capacitor element is embedded.

In the manufacturing steps of the present modified example, first, the same steps as the steps described by reference to FIGS. 1 to 5 are performed. However, in the dry etching step described by reference to FIG. 5, the dummy element isolation region DEI (see FIG. 4) is not fully removed, and at the bottom of the inside of each trench D2, an insulation film IF8 formed of the dummy element isolation region DEI is left. In other words, the insulation film IF8 in contact with the bottom surface of each trench D2 is left.

For this reason, the bottom surface of the trench D2 is not exposed. Whereas, the corner part of the top of the sidewall of the trench D2 is rounded as described by reference to FIG. 5. However, the bottom surface of the trench D2 is not dry etched. For this reason, the end of the bottom surface is not rounded, and hence is angular as the corner part of the bottom surface end of the trench D1. Accordingly, respective bottom surfaces of the trenches D1 and D2 are equal in height. However, the top surface of the semiconductor substrate SB between the adjacent trenches D2 is lower than that of the position of the main surface of the semiconductor substrate SB in the region adjacent to the trench D1.

Then, as described by reference to FIG. 6, the insulation films IF3 and IF4, the polysilicon film PS1, and the insulation film IF5 are formed. Herein, the insulation film IF4 in the capacitor element region 1C is formed by an oxidation step, and hence is not formed at the bottom surface of the trench D2 and the sidewall lower part of the trench D2 covered with the insulation film IF8. In other words, in the trench D2, the insulation film IF4 is formed only over the insulation film IF8. Then, the steps described by reference to FIGS. 7 to 17 are performed. As a result, the semiconductor device of the present modified example shown in FIG. 20 is completed.

In the present modified example, the following effects can be obtained. Namely, when the insulation film IF4 is formed in the trench D2 by an oxidation method such as thermal oxidation, at the bottom of the trench D2, or at the corner part of the bottom, the film thickness of the insulation film IF4 may be reduced due to the stress caused by the shape such as the depth of the trench D2. When the insulation film IF4 is thus partially reduced in thickness, the insulation property by the insulation film IF4 is reduced, which unfavorably reduces the reliability of the semiconductor device.

In contrast, in the present modified example, as shown in FIG. 20, the dummy element isolation region DEI (see FIG. 4) is partially left at the bottom of the trench D2. This can prevent the formation of the insulation film IF4 with a small film thickness at the bottom of the trench D2. Accordingly, it is possible to prevent the generation of a leakage current between the upper electrode UE and the lower electrode of the capacitor element CE. For this reason, it is possible to improve the reliability of the semiconductor device.

Further, in the present modified example, the corner part of the bottom surface end of the trench D2 is not rounded. For this reason, it is not possible to produce the effect of suppressing the generation of the leakage current resulting from rounding of the corner part of the bottom surface end of the trench D2. However, as other effects, roughly the same effects as in the embodiment described by reference to FIGS. 1 to 17 can be obtained.

Regarding Third Modified Example

Figure 21:
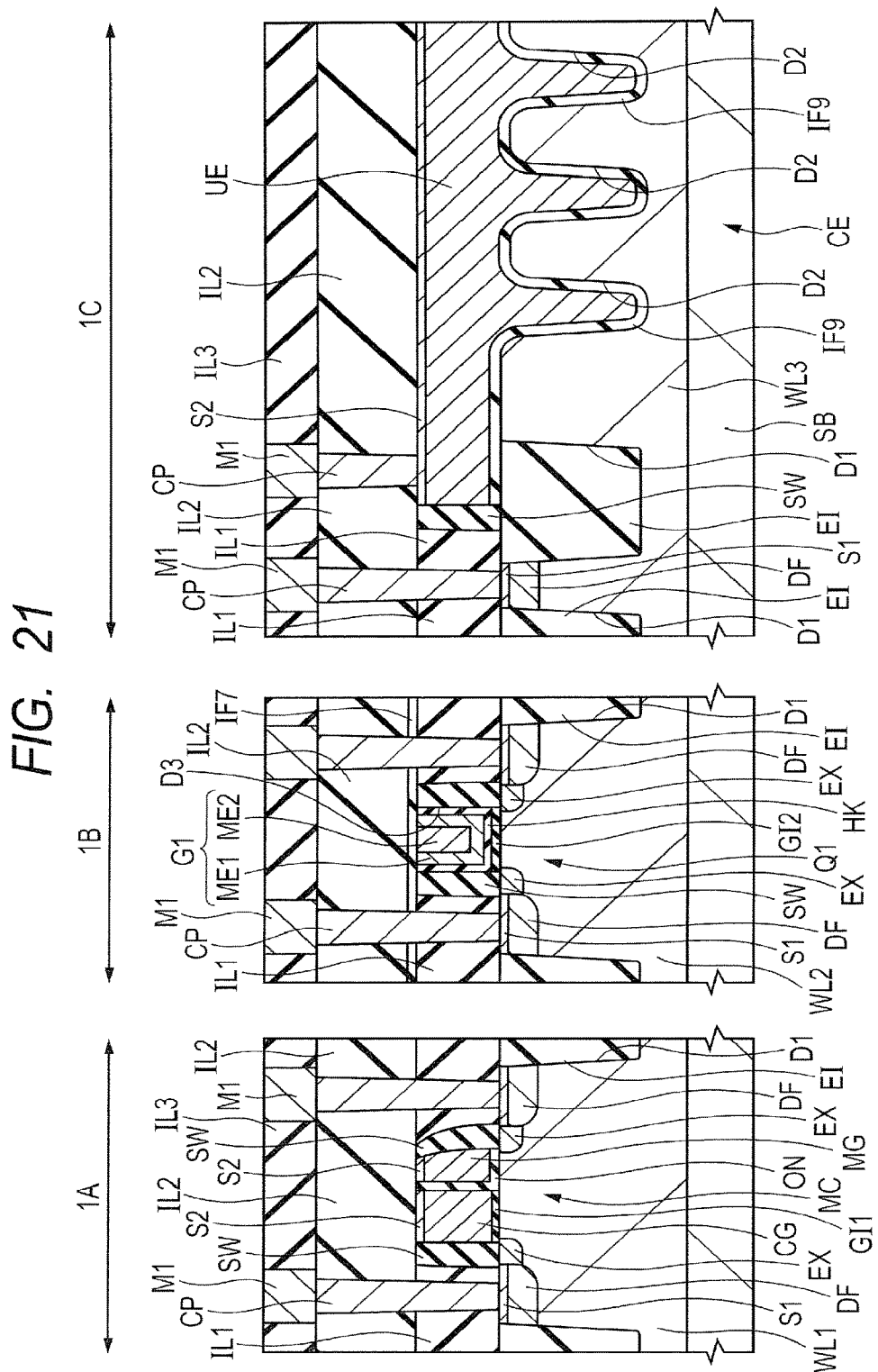
FIG. 21 is across sectional view of Third Modified Example of the semiconductor device of First Embodiment during a manufacturing step.

Below, Third Modified Example of the semiconductor device of the present embodiment will be described by reference to FIG. 21. FIG. 21 is a cross sectional view for illustrating a method for manufacturing a semiconductor device of Third Modified Example of the present embodiment. FIG. 21 shows, as with FIGS. 1 to 15, and 17, the cross sections of the memory cell region LA, the peripheral circuit region 1B, and the capacitor element region 1C.

In the present modified example, as distinct from the formation method of the insulation film IF4 described by reference to FIG. 6, the deposited film formed by a deposition method such as a CVD method forms an insulation film for isolating the electrode of the capacitor element. Other manufacturing steps are the same as the manufacturing steps described by reference to FIGS. 1 to 17. In the present modified example, the following effects can be obtained.

Namely, as described in the Second Modified Example, at the bottom of the trench D2, the film thickness of the insulation film IF4 (see FIG. 6) formed by an oxidation method may be reduced. This unfavorably reduces the reliability of the semiconductor device.

Under such circumstances, in the present modified example, not by an oxidation method but by a CVD method, or the like, the insulation film IF9 formed of a silicon oxide film is deposited and formed with a uniform film thickness over the bottom surface and over the sidewall of the trench D2 shown in FIG. 21. This can prevent the reduction of the reliability due to the reduction in film thickness of the insulation film at the bottom of the trench D2. Further, besides, in the present modified example, roughly the same effects as those in the embodiment described by reference to FIGS. 1 to 17 can be obtained.

Regarding Fourth Modified Example

Figure 22:
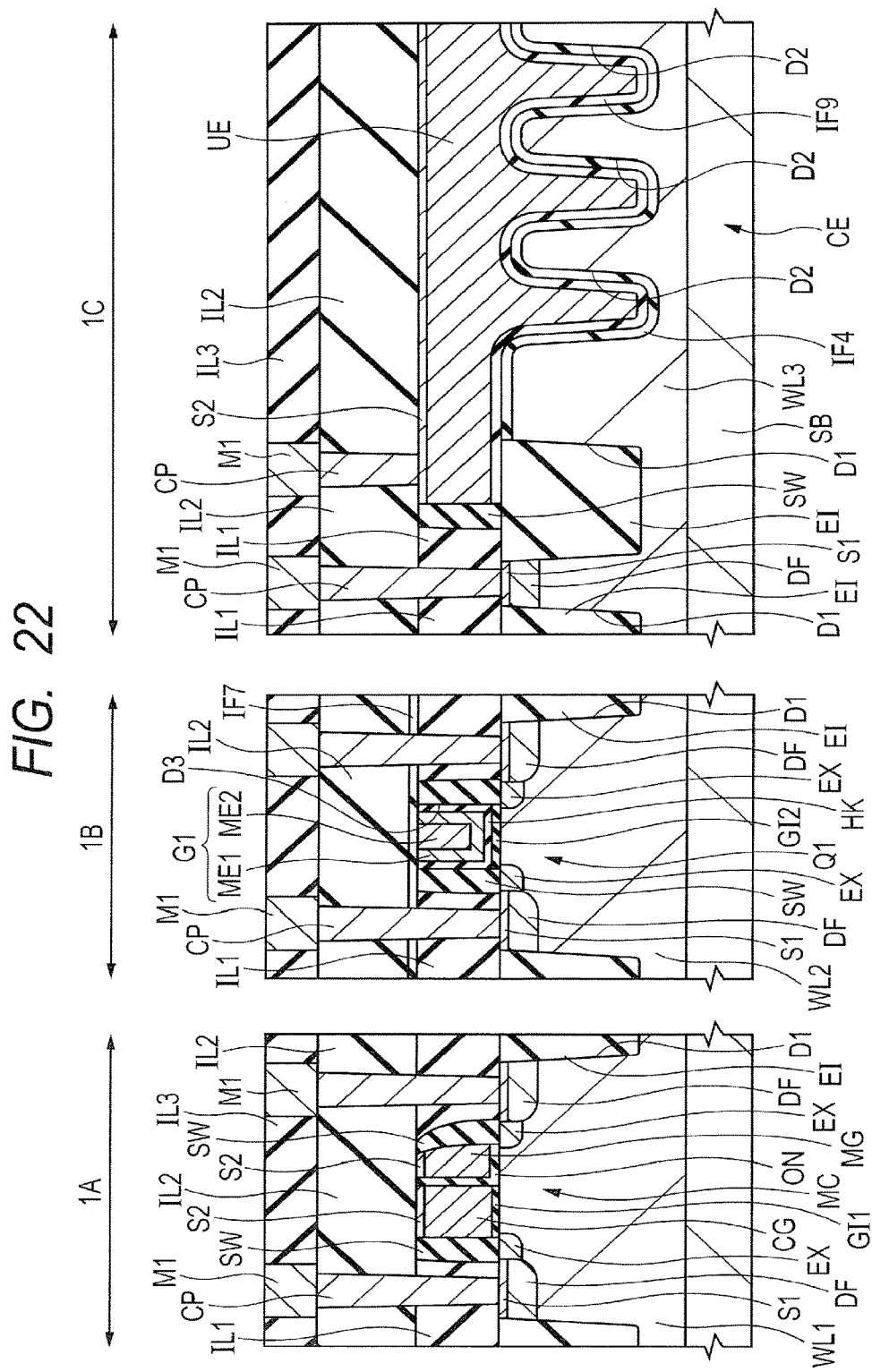
FIG. 22 is a cross sectional view of Fourth Modified Example of the semiconductor device of First Embodiment during a manufacturing step.

Below, Fourth Modified Example of the semiconductor device of the present embodiment will be described by reference to FIG. 22. FIG. 22 is a cross sectional view for illustrating a method for manufacturing a semiconductor device of Fourth Modified Example of the present embodiment. FIG. 22 shows, as with FIGS. 1 to 15, and 17, the cross sections of the memory cell region 1A, the peripheral circuit region 1B, and the capacitor element region 1C.

In the present modified example, as distinct from the formation method of the insulation film IF4 described by reference to FIG. 6, the insulation film for establishing an insulation between the upper electrode UE and the lower electrode of the capacitor element CE is formed of a lamination film formed of two insulation films formed by a thermal oxidation method and a deposition method, respectively. Namely, as described by reference to FIG. 6, after forming the insulation film IF4 by a thermal oxidation method, the insulation film IF9 is formed by a deposition method such as a CVD method. The lamination film formed of the insulation films IF4 and IF9 formed in this manner is left as the insulation film for establishing an isolation between the upper electrode UE and the lower electrode of the capacitor element CE. Other manufacturing steps are the same as the manufacturing steps described by reference to FIGS. 1 to 17. In the present modified example, the following effects can be obtained.

Namely, when the insulation film for establishing an insulation between the upper electrode and the lower electrode of the capacitor element is deposited and formed by a CVD method, or the like, the insulation film may be inferior in reliability on the insulation property or the like to the insulation film formed by an oxidation method such as a thermal oxidation method. In contrast, in the present modified example, the lamination film of the insulation film IF4 formed by an oxidation method, and the insulation film IF9 formed by a deposition method establishes an insulation between the upper electrode UE and the lower electrode.

In this case, it can be considered that the insulation film IF4 of the lower-side thermal oxide film is reduced in thickness at the bottom surface or the bottom surface corner part of the trench D2. However, the insulation film IF9 formed of a silicon oxide film with a uniform film thickness is stacked thereover. For this reason, it is possible to prevent the reduction of the reliability of the insulation film for establishing an isolation between the upper electrode UE and the lower electrode of the capacitor element CE. Besides, in the present modified example, roughly the same effects as in the embodiment described by reference to FIGS. 1 to 17 can be obtained. Incidentally, over the semiconductor substrate SB, a high breakdown voltage MISFET (not shown) to be used for input/output of the semiconductor device, or the like is formed. Thus, it can be considered that, for each gate insulation film of the high breakdown voltage MISFETs in the present modified example and the Third Modified Example, there is used the film formed by the same step as that for the insulation film for establishing an insulation between the upper electrode UE and the lower electrode of the capacitor element CE.

Second Embodiment

Below, manufacturing steps of a semiconductor device of Second Embodiment will be described by reference to FIGS. 23 to 27. FIGS. 23 to 27 are each a cross sectional view for illustrating a method for manufacturing a semiconductor device of the present embodiment. FIGS. 23 to 27 each show, as with FIGS. 1 to 15 and FIG. 17, the cross sections of the memory cell region 1A, the peripheral circuit region 1B, and the capacitor element region 1C.

In the First embodiment, a description has been given to the following: the insulation film IF2 (see FIG. 4) used as a mask for forming the trenches for embedding the element isolation region and the trench capacitor element therein is removed after removing the dummy element isolation region DEI (see FIG. 4). In contrast, below, a description will be given to the following: after removing the insulation film formed of a silicon nitride film used as a mask for forming the trenches, the dummy element isolation region is removed. Further, in the present embodiment, not the gate-last process, but the step of forming a gate electrode before forming the source/drain regions of a MISFET in the peripheral circuit region, i.e., a so-called gate-first process is used.

Figure 23:
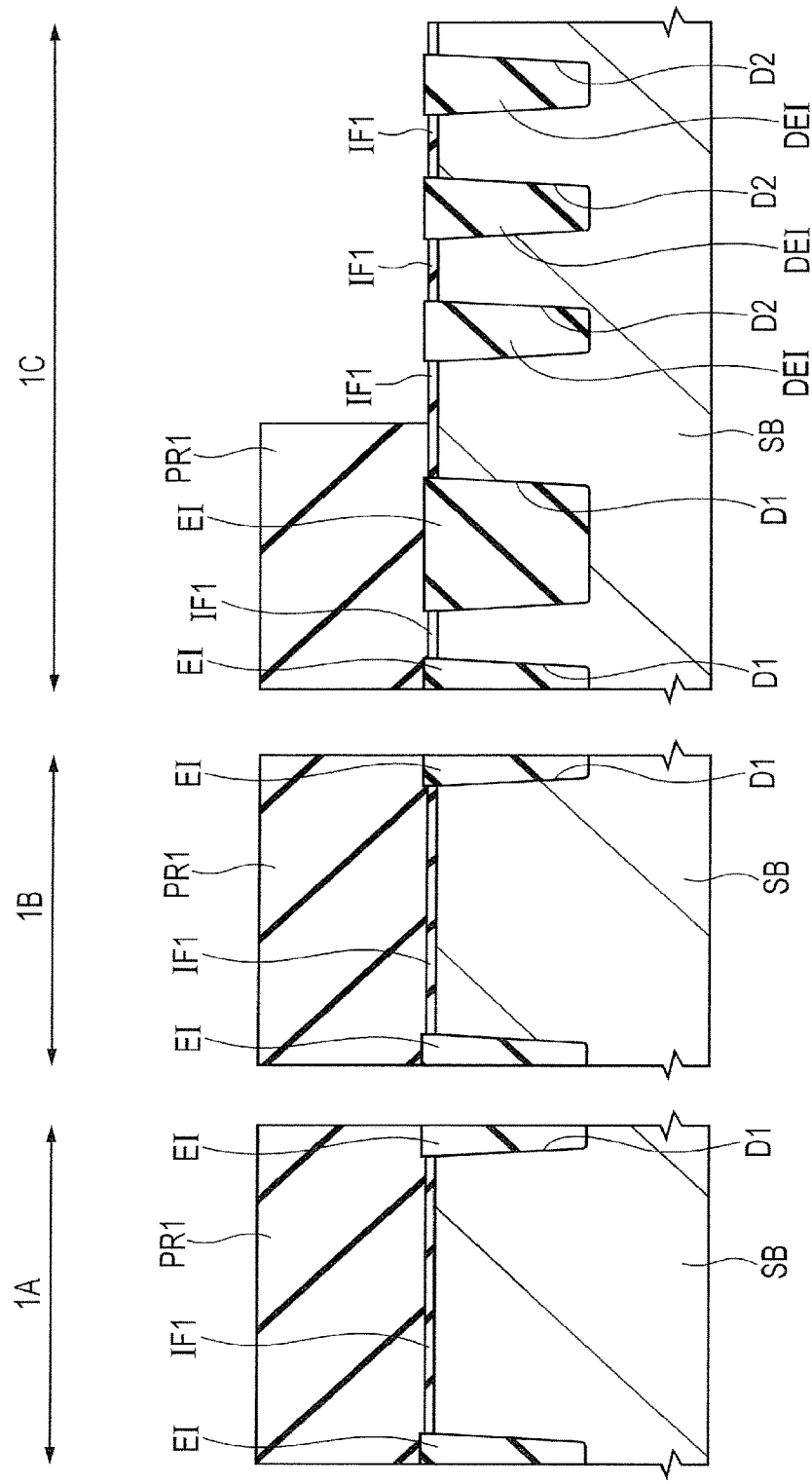
FIG. 23 is a cross sectional view of a semiconductor device of Second Embodiment during a manufacturing step.

In the manufacturing steps of the present modified example, first, the steps described by reference to FIGS. 1 to 3 are performed. Then, as shown in FIG. 23, the insulation film IF2 is removed by wet etching. Then, over the main surface of the semiconductor substrate SB, a photoresist film PR1 is formed. The layout of the photoresist film PR1 is the same as the layout of the photoresist film PR1 described by reference to, for example, FIG. 4.

Figure 24:
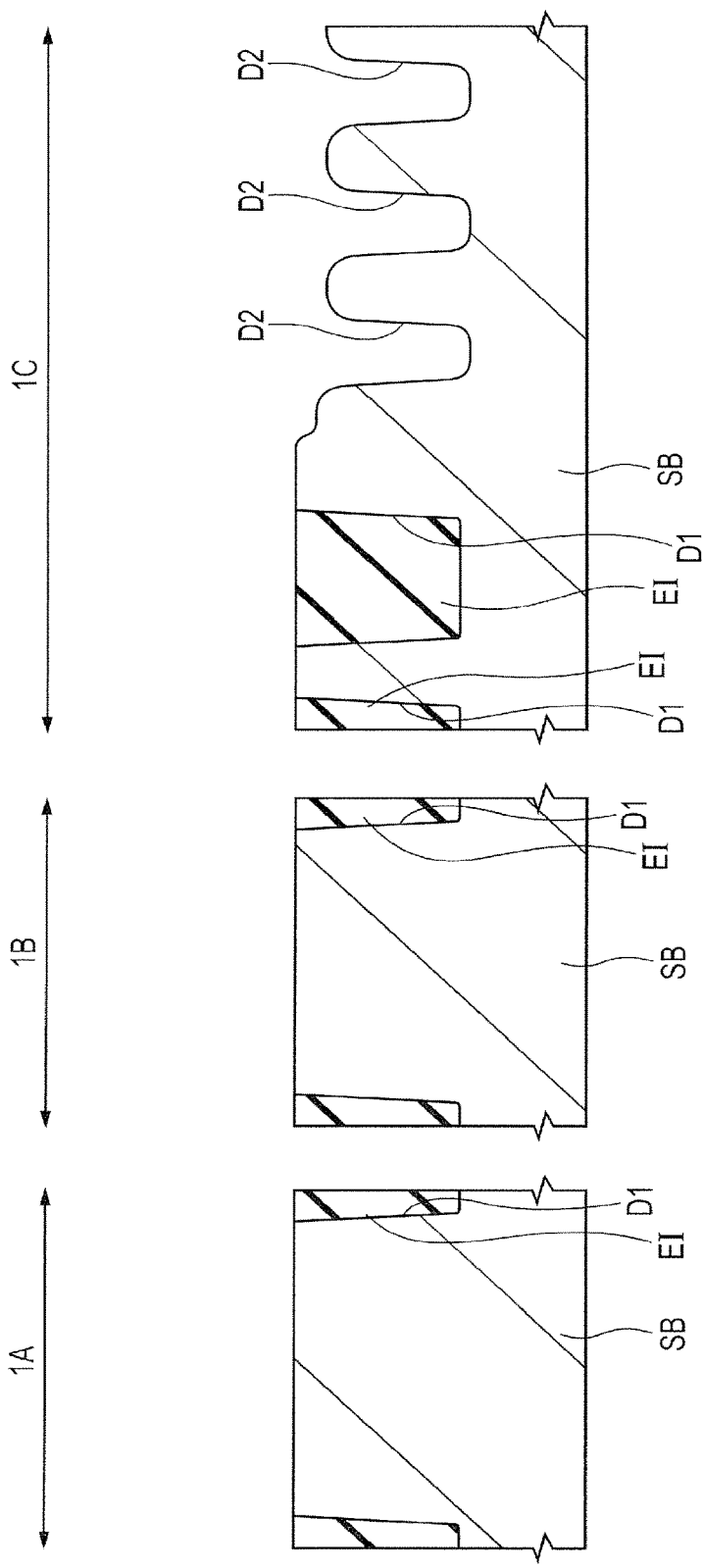
FIG. 24 is a cross sectional view of the semiconductor device during a manufacturing step following FIG. 23.

Then, as shown in FIG. 24, dry etching is performed using the photoresist film PR1 as a mask, thereby to remove the dummy element isolation region DEI and the insulation film IF1. Then, the photoresist film PR1 is removed. At this step, as distinct from the First embodiment, the insulation film IF2 formed of a silicon nitride film (see FIG. 5) is not used as a mask. For this reason, at the early stage of the etching, the insulation film IF1 is removed. Accordingly, until the dummy element isolation region DEI is fully removed, the main surface of the semiconductor substrate SB in the vicinity of the trench D2 is more largely retreated than in the case of the First embodiment. Particularly, the height of the top surface of the semiconductor substrate SB between the adjacent trenches D2 is remarkably reduced. In other words, in the region in which a plurality of trenches D2 are arranged, the height of the main surface of the semiconductor substrate SB is remarkably reduced.

Incidentally, the region in which the trenches D2 are arranged herein referred to is the region exposed from the photoresist film PR1 for removing the dummy element isolation region DEI in the step described by reference to FIG. 23. In other words, the region in which the trenches D2 are arranged denotes the region surrounded by the annular element isolation region EI in the layout shown in FIG. 16, i.e., the region in which the resist is opened in the step described by reference to FIG. 23 of the region (active region) for generating the capacitance between the semiconductor substrate of the lower electrode and the upper electrode UE. The end of the upper electrode UE is situated immediately over the element isolation region EI, and surrounds the region in which the trenches D2 are arranged.

Figure 25:
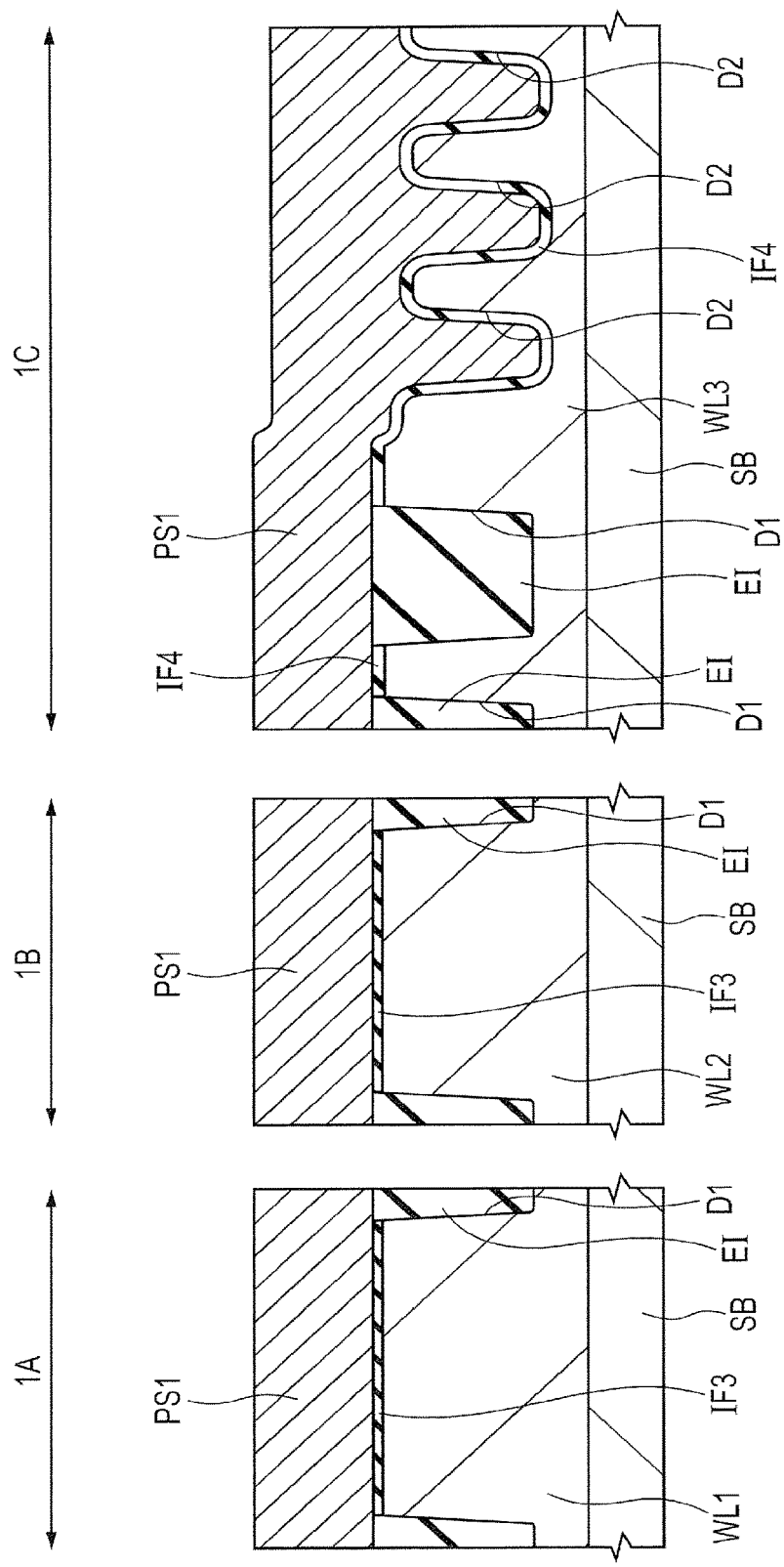
FIG. 25 is a cross sectional view of the semiconductor device during a manufacturing step following FIG. 24.

Then, as shown in FIG. 25, the same step as that described by reference to FIG. 6 is performed, thereby to form the insulation films IF3 and IF4, and the polysilicon film PS1. However, herein, the insulation film IF5 (see FIG. 6) of a cap insulation film is not formed. Herein, in the region in which a plurality of trenches D2 are formed, the height of the main surface of the semiconductor substrate SB is low. Accordingly, the height of the top surface of the polysilicon film PS1 formed over the region is lower than the height of the top surface of the polysilicon film PS1 in other regions.

Herein, before forming the insulation films IF3 and IF4, the surface of the semiconductor substrate SB is subjected to sacrificial oxidation, thereby to form a sacrificial oxide film in contact with the surface of the semiconductor substrate SB. Then, before forming the insulation films IF3 and IF4, the step of removing the sacrificial oxide film is performed. As a result, it is possible to remove the damage inflicted on the surface of the semiconductor substrate SB by dry etching described by reference to FIG. 24.

Figure 26:
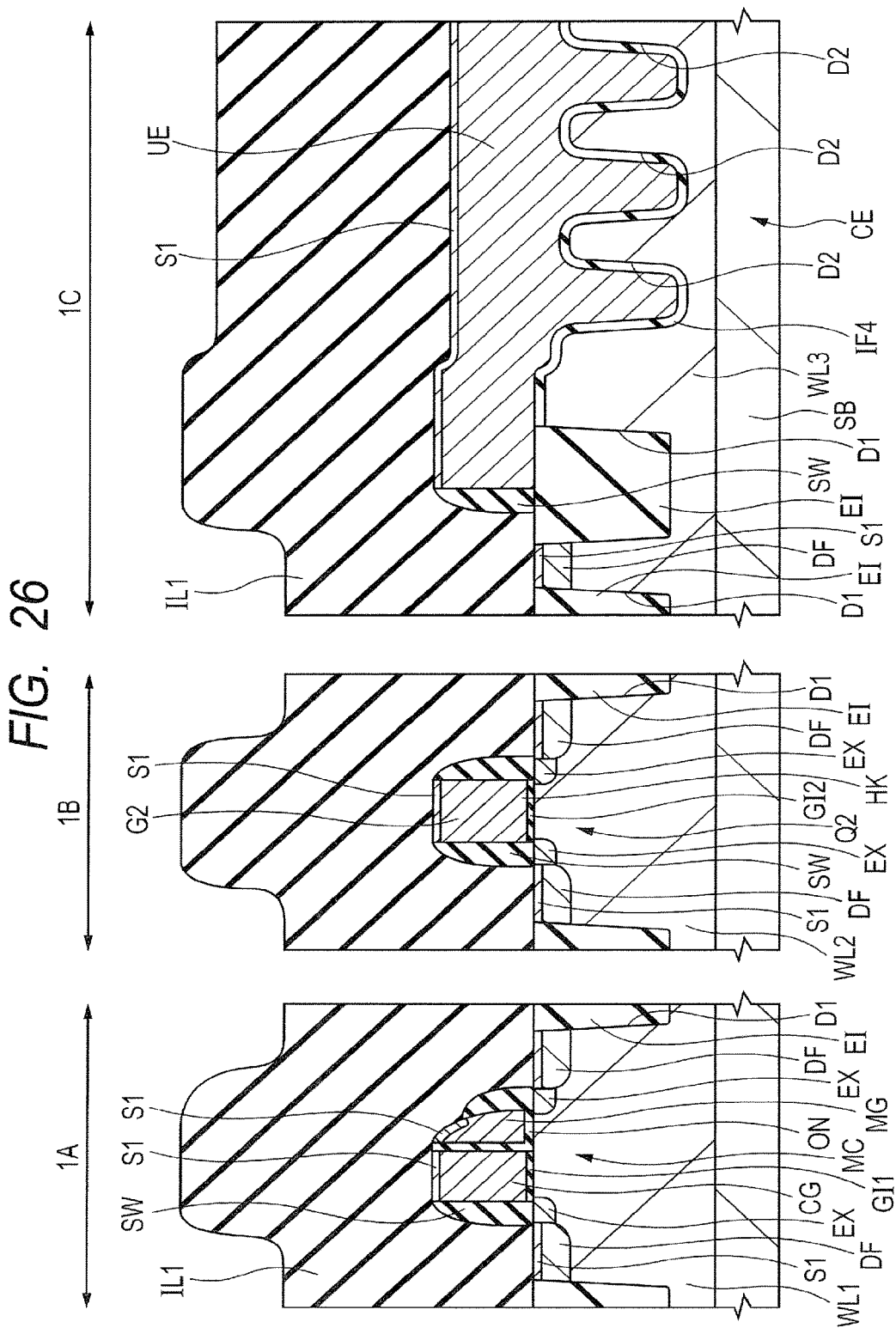
FIG. 26 is a cross sectional view of the semiconductor device during a manufacturing step following FIG. 25.

Then, as shown in FIG. 26, the same steps as those described by reference to FIGS. 7 to 11 are performed, thereby to form a memory cell MC, a MISFET Q2, and a capacitor element CE. In other words, the memory cell MC includes a control transistor including a control gate electrode CG, and a memory transistor including a memory gate electrode MG. The capacitor element CE is formed of an upper electrode UE with the top surface partially recessed in a wide range, and a lower electrode formed of the semiconductor substrate SB immediately under the upper electrode UE. In the peripheral circuit region 1B, replacement with a metal gate electrode is not performed. Accordingly, the MISFET Q1 has a gate electrode G2 formed of the polysilicon film PS1.

Herein, the insulation film IF5 (see FIG. 6) is not formed. Accordingly, by the salicide process described by reference to FIG. 11, silicide layers S1 are formed at respective top surfaces of the control gate electrode CG, the memory gate electrode MG, the gate electrode G2, and the upper electrode UE, respectively. Further, the dummy gate electrode is not required to be replaced with another gate electrode as with the gate-last process. For this reason, the polishing step described by reference to FIG. 13 is not performed.

Subsequently, an interlayer insulation film IL1 is formed in such a manner as to cover the memory cell MC, the MISFET Q2, and the capacitor element CE. Herein, the top surface of the interlayer insulation film IL1 is affected by the shape of each gate electrode, the upper electrode UE, or the like, and has an unevenness. In other words, for example, immediately over the gate electrode G2, the top surface of the interlayer insulation film IL1 rises in a convex form. The height of the top surface of the interlayer insulation film IL1 at the convex part is larger in height of the top surface than the height of the top surface of the interlayer insulation film IL1 in the region lateral thereto. Similarly, immediately over the upper electrode UE, the top surface of the interlayer insulation film IL1 rises in a convex form, and is larger in height of the top surface than the top surface of the interlayer insulation film IL1 in the region lateral thereto.

However, immediately over the region in which the trenches D2 are arranged, the top surface of the upper electrode UE is lower in height than the top surface of the end of the upper electrode UE in the transverse direction. For this reason, also of the top surface of the interlayer insulation film IL1 immediately over the upper electrode UE, the central part of the convexly rising portion in the transverse direction, i.e., the portion immediately over the region in which the trenches D2 are arranged is low in height of the top surface thereof. Herein, the region in which the trenches D2 are arranged has a very large area in a plan view in order to ensure the capacitance of the capacitor element CE. Accordingly, the top surface of the interlayer insulation film IL1 immediately over the upper electrode UE is lower in height of the top surface in a large region except for the end of the region immediately over the upper electrode UE.

In other words, the height of the top surface of the interlayer insulation film IL1 immediately over the region (active region) in which the trenches D2 are arranged is lower than the height of the interlayer insulation film IL immediately over the end of the upper electrode UE, and is, in a plan view, higher than the height of the top surface of the interlayer insulation film IL immediately over the semiconductor substrate SB (e.g., the $n^+$ type semiconductor region DF in the capacitor element region 1C) in the region lateral to the upper electrode UE.

The shape of the top surface of such an interlayer insulation film IL1 is advantageous from the viewpoint of improving the flatness of the top surface when the top surface of the interlayer insulation film IL1 is polished by, for example, a CMP method in the subsequent step. Namely, when the top surface of the interlayer insulation film IL1 rises high immediately over the region occupying a large area as the region in which the trenches D2 are arranged, it is difficult to planarize the top surface of the interlayer insulation film IL1 in such a region, and the top surfaces of the interlayer insulation film IL1 in other regions.

In other words, when the top surface of the interlayer insulation film IL1 immediately over the region in which the trenches D2 are arranged, and the top surface of the interlayer insulation film IL1 immediately over the end of the upper electrode UE have the equal height, planarization by the polishing step becomes difficult. As a result, it becomes impossible to normally perform deposition/processing of an interlayer insulation film, a wire, or the like, to be formed over the interlayer insulation film IL1.

Figure 27:
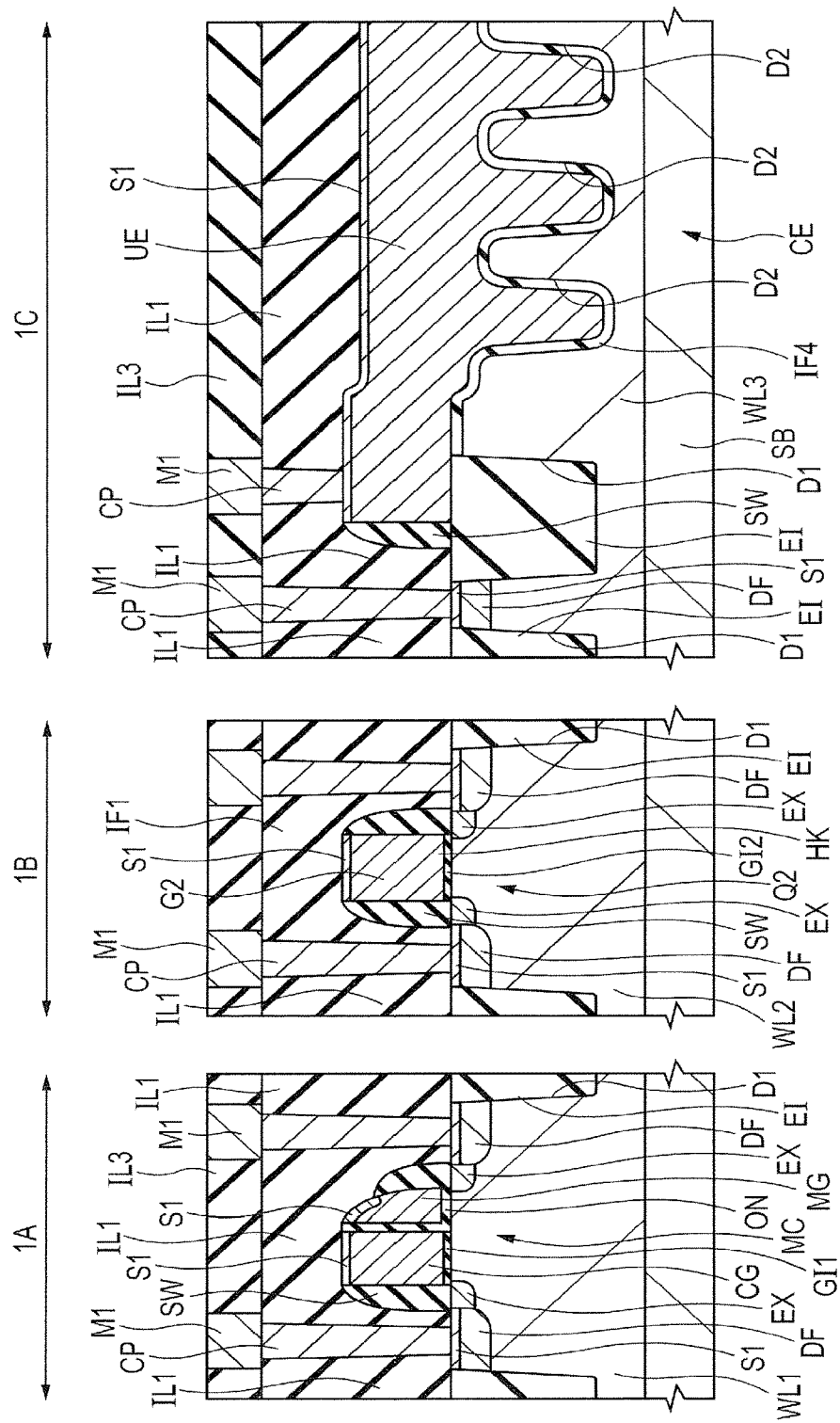
FIG. 27 is a cross sectional view of the semiconductor device during a manufacturing step following FIG. 26.

In contrast, in the present embodiment, in the dry etching step described by reference to FIG. 24, etching is performed without using a silicon nitride film as a mask. This results in a lower height of the top surface of the main surface of the semiconductor substrate SB in the region in which the trenches D2 are arranged. For this reason, as shown in FIG. 27, the upper electrode UE and the interlayer insulation film IL1 formed immediately over the region is low in top surface height in a wide range. This can produce an effect of facilitating the planarization of the top surface of the interlayer insulation film IL1 by a polishing step to be performed next. Namely, it is possible to suppress the generation of a step difference at the top surface of the interlayer insulation film IL1. Even if the top surface of the interlayer insulation film IL1 cannot be fully planarized, it is possible to reduce the size of the step difference at the top surface of the interlayer insulation film IL1.

Then, as shown in FIG. 27, the top surface of the interlayer insulation film IL1 is polished by, for example, a CMP method. Then, the same step as that described by reference to FIG. 17 is performed, thereby to complete the semiconductor device of the present embodiment. However, in the polishing step, the control gate electrode CG, the memory gate electrode MG, and the upper electrode UE, and their respective overlying silicide layers S1 are not exposed. Further, the same step as that described by reference to FIG. 17 is performed. However, the interlayer insulation film IL2 is not required to be formed. Accordingly, over the interlayer insulation film IL1, an interlayer insulation film IL3 and a wire M1 are formed not via the interlayer insulation film IL2. Further, over respective top surfaces of the control gate electrode CG, the memory gate electrode MG, and the upper electrode UE, the silicide layers S1 have already been formed. This eliminates the necessity of performing the second salicide process (see FIG. 15) described in the First embodiment.

Incidentally, herein, a description has been given to the case where the insulation film IF5 (see FIG. 6) is not formed. However, the following is also acceptable: when the step described by reference to FIG. 6 is performed, after forming the insulation film IF5, patterning is performed, thereby to leave the insulation film IF5 only immediately over the control gate electrode CG. In this case, the top surface of the control gate electrode CG in the completed semiconductor device remains covered with the insulation film IF5 except for the feeding part to the control gate electrode CG.

In the present embodiment, as described above, it becomes easy to planarize the top surface of the interlayer insulation film IL1 by the polishing step. This can reduce the cost required for the manufacturing steps of the semiconductor device. Further, it is possible to readily improve the flatness of the top surface of the interlayer insulation film IL1 immediately over the upper electrode UE. For this reason, it is possible to prevent the following: it becomes impossible to normally perform deposition/processing of an interlayer insulation film, a wire, or the like, to be formed over the interlayer insulation film IL1.

Besides, the present modified example can produce roughly the same effects as those of the embodiments described by reference to FIGS. 1 to 17. However, in the dry etching step described by reference to FIGS. 23 and 24, the main surface of the semiconductor substrate SB is not protected by the insulation film IF2 formed of a silicon nitride film (see FIGS. 4 and 5). For this reason, the damage inflicted on the surface of the semiconductor substrate SB exposed from the photoresist film in the capacitor element region 1C by the dry etching is larger than in the First Embodiment. However, the damage can be removed by the formation and removal steps of the sacrificial oxide film performed before forming the insulation films IF3 and IF4 (see FIG. 25).

Regarding Modified Example

Figure 28:
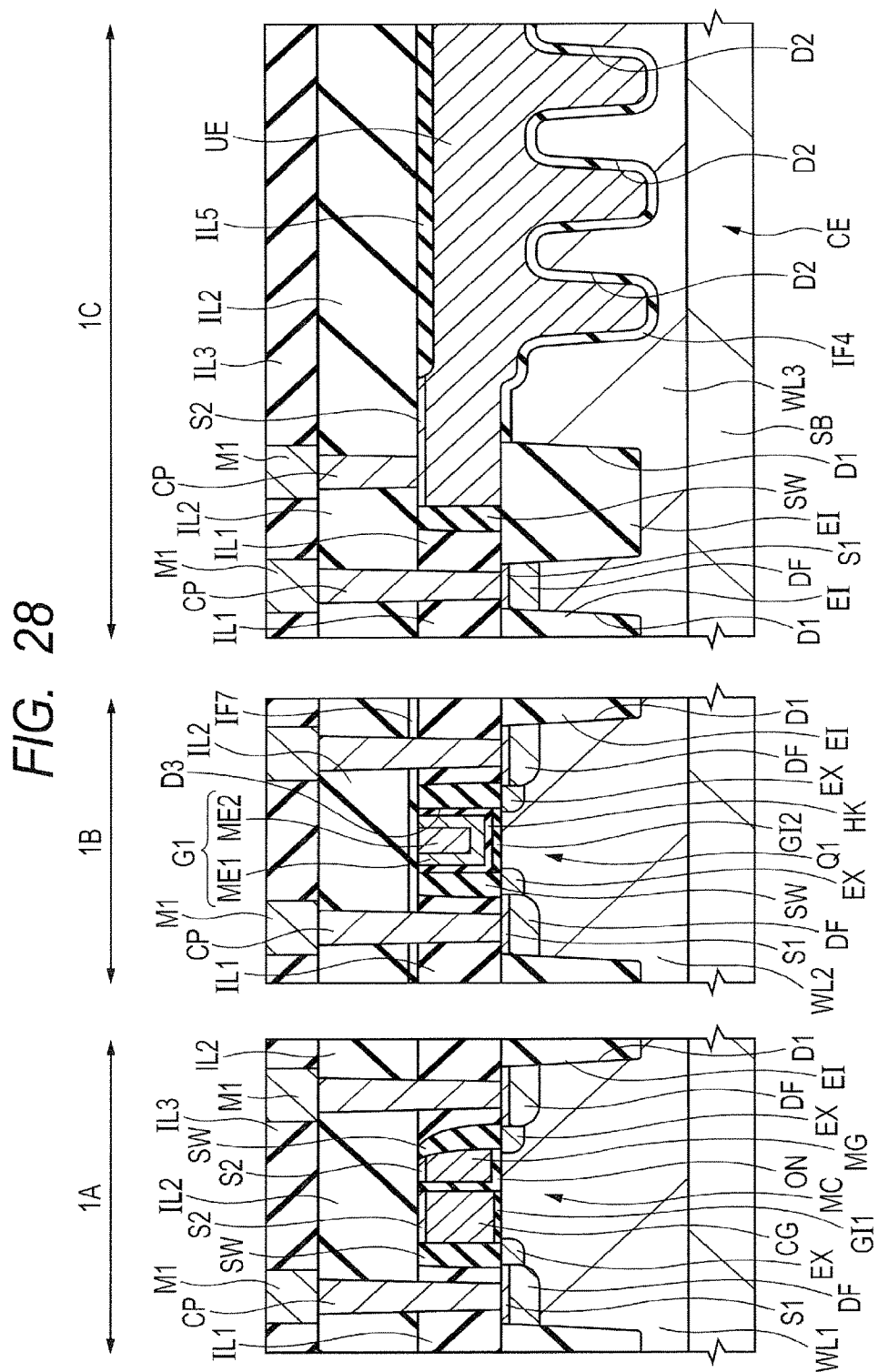
FIG. 28 is a cross sectional view of Modified Example of the semiconductor device of Second Embodiment during a manufacturing step.

Below, Modified Example of the semiconductor device of the present embodiment will be described by reference to FIG. 28. FIG. 28 is a cross sectional view for illustrating a method for manufacturing a semiconductor device of Modified Example of the present embodiment. FIG. 28 shows, as with FIG. 27, the cross sections of the memory cell region 1A, the peripheral circuit region 1B, and the capacitor element region 1C.

In the present modified example, as with the manufacturing steps described by reference to FIGS. 23 and 24, dry etching is performed without protection by the insulation film IF2 formed of a silicon nitride film (see FIG. 4). As a result, the height of the top surface of the semiconductor substrate SB in the region in which the trenches D2 are arranged is reduced. This facilitates the planarization of the top surface of the interlayer insulation film IL1 (see FIG. 6). However, herein, the MISFET Q1 (see FIG. 28) in the peripheral circuit region 1B is formed by the gate-last process.

In other words, as the manufacturing steps of the present modified example, the same steps as those described by reference to FIGS. 23 to 25 are performed. Then, over the polysilicon film PS1, the insulation film IF5 (see FIG. 6) is formed. Then, the same steps as those described by reference to FIGS. 7 to 17 are performed. As a result, the semiconductor device of the present modified example shown in FIG. 28 is completed.

Herein, the polishing step described by reference to FIG. 13 reduces the height of the top surface of the upper electrode UE. However, the top surface of the upper electrode UE immediately over the region in which the trenches D2 are arranged is lower than the top surface of the end of the upper electrode UE, i.e., the height of the top surface of the upper electrode UE immediately over the element isolation region EI in the capacitor element region 1C. In other words, the position of the top surface of the upper electrode UE immediately over the trenches D2 is lower than the position of the top surface of the upper electrode UE immediately over the element isolation region EI in the capacitor element region 1C.

For this reason, the insulation film IF5 formed in the step described by reference to FIG. 6 is left immediately over a part of the upper electrode UE. In other words, immediately over the active region of the capacitor element CE, the insulation film IF5 is formed between the upper electrode UE and the interlayer insulation film IL. The insulation film IF5 is not formed between the end of the upper electrode UE and the interlayer insulation film IL2. In other words, the top surface of the end of the upper electrode UE is not covered with the insulation film IF5. Whereas, when the step difference is still larger, not only the insulation film IF5, but also the interlayer insulation film IL1 may be left thereover. Incidentally, FIG. 28 shows the state in which only the insulation film IF5 is left.

In this case, in the second salicide process described by reference to FIG. 15, the silicide layer S2 is not formed at the top surface of the upper electrode UE at the portion thereof covered with the insulation film IF5. However, the top surface of the upper electrode UE immediately over the region in which the trenches D2 are arranged is not a site for ensuring a coupling with the contact plug CP. For this reason, it does not matter if the silicide layer S2 is not formed. In other words, the contact plug CP for supplying an electric potential to the upper electrode UE is coupled with the top surface of the silicide layer S2 covering the top surface of the end of the upper electrode UE. This can suppress the contact resistance between the contact plug CP and the upper electrode UE to a low level.

In addition, in the present modified example, roughly the same effects as those in the embodiment described by reference to FIGS. 23 to 28 can be obtained.

Third Embodiment

Figure 29:
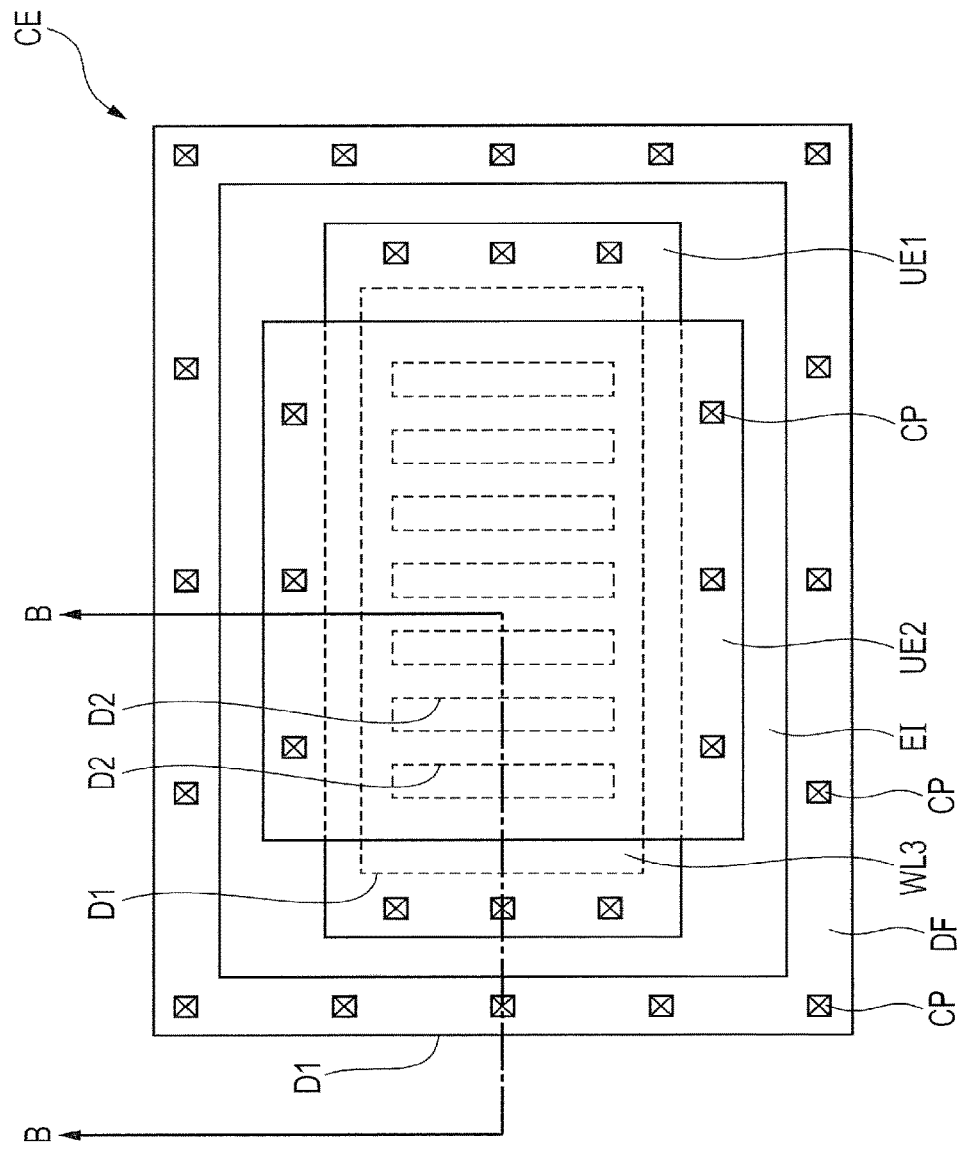
FIG. 29 is a planar layout of a semiconductor device of Third Embodiment during a manufacturing step.
Figure 30:
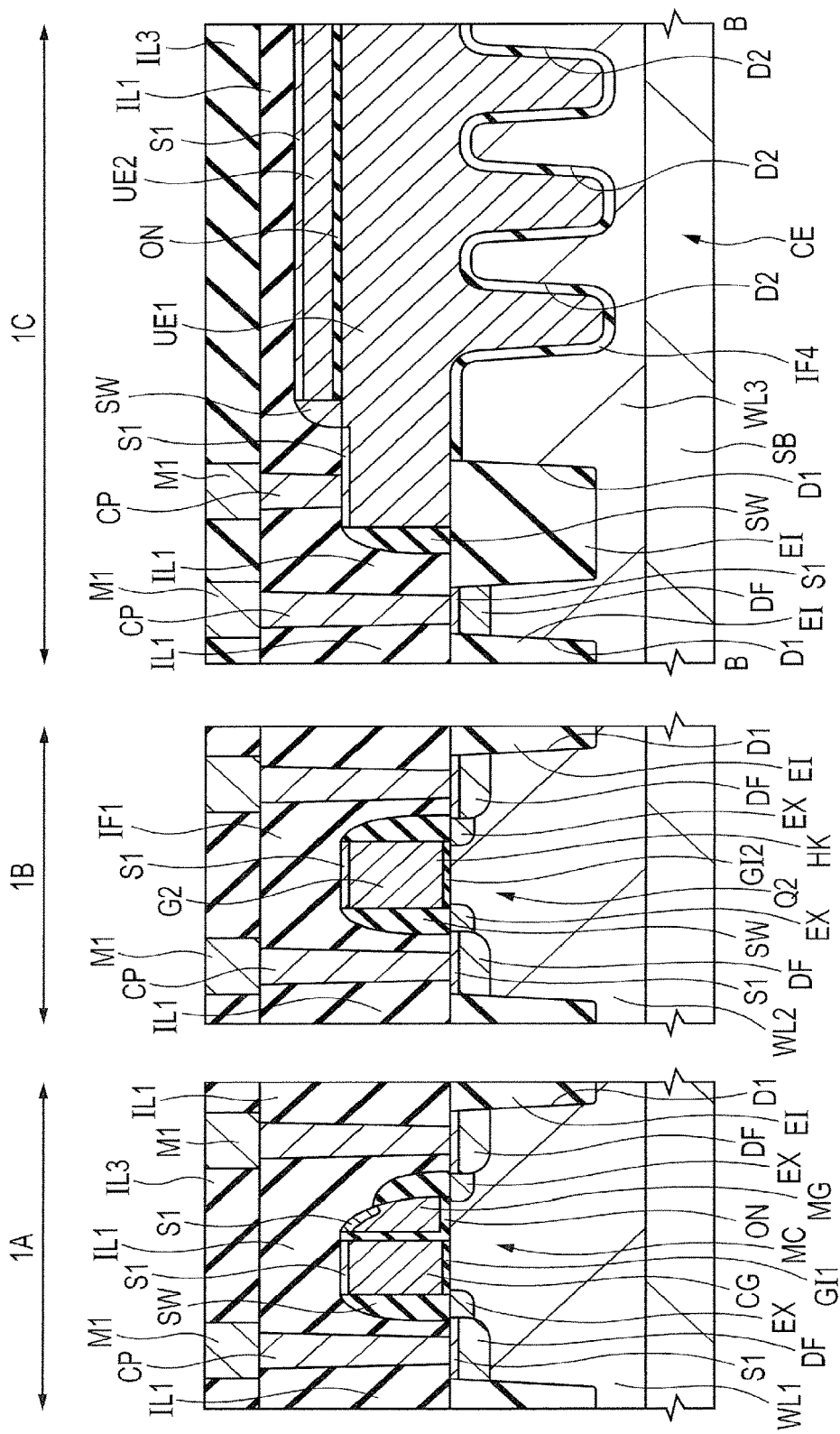
FIG. 30 is a cross sectional view of the semiconductor device during a manufacturing step following FIG. 28.

Below, manufacturing steps of a semiconductor device of Third Embodiment will be described by reference to FIGS. 29 and 30. FIG. 29 is a planar layout for illustrating a method for manufacturing a semiconductor device of the present embodiment. FIG. 30 is a cross sectional view for illustrating a method for manufacturing the semiconductor device of the present embodiment. FIG. 30 shows a cross sectional view along line B-B of FIG. 29 in the capacitor element region 1C. FIG. 30 shows, as with FIGS. 1 to 15, and 17, the cross sections of the memory cell region 1A, the peripheral circuit region 1B, and the capacitor element region 1C.

The planar layout shown in FIG. 29 shows only the trenches D1 and D2, the first upper electrode UE1, the second upper electrode UE2, the element isolation region EI, the well WL3, the n⁺ type semiconductor region DF, and the contact plugs CP in the capacitor element region 1C. Further, in FIG. 29, the outlines of the trenches D1 and D2, the well WL3, and the element isolation region EI at portions thereof covered with the first upper electrode UE1 and the second upper electrode UE2 are indicated with broken lines. Further, the outline of the first upper electrode UE1 covered with the second upper electrode UE2 is also indicated with a broken line.

In accordance with the present embodiment, each MISFET is formed by the gate-first process, and over the upper electrode (first upper electrode) of the capacitor element, a still other upper electrode (second upper electrode) is provided. Incidentally, below, a description will be given to the following: after forming the first upper electrode, a polysilicon film to be used for forming the memory gate electrode and the second upper electrode is formed.

In the manufacturing steps of the semiconductor device of the present embodiment, first, the same steps as the steps described by reference to FIGS. 1 to 5 are performed. Then, as in the step described by reference to FIG. 6, the insulation films IF3 and IF4, and the polysilicon film PS1 are formed. However, herein, the insulation film IF5 (see FIG. 6) is not formed. Then, the same step as the step described by reference to FIG. 7 is performed, thereby to form the control gate electrode CG.

However, herein, patterning is performed, thereby to form the control gate electrode CG. In addition, the polysilicon film PS1 (see FIG. 7) in the capacitor element region 1C is processed, thereby to form the first upper electrode UE1. The structure of the first upper electrode UE1 is the same as that of the upper electrode described in the First embodiment. Then, the step described by reference to FIG. 8 is performed. As a result, the control gate electrode CG and the first upper electrode UE1 are covered with the ONO film ON and the polysilicon film PS2 (see FIG. 8).

Subsequently, with the polysilicon film PS2 immediately over the first upper electrode UE1 covered with the photoresist film, the dry etching step is performed as described by reference to FIG. 9. As a result, respective portions of the polysilicon film PS2 and the ONO film ON are removed, thereby to form the memory gate electrode MG in the memory cell region 1A. Then, the photoresist film is removed.

Herein, in the region protected by the photoresist film against dry etching, i.e., immediately over the first upper electrode UE1, a second upper electrode UE2 (see FIG. 30) formed of the polysilicon film PS2 is formed via the ONO film ON. Whereas, in the peripheral circuit region 1B, the polysilicon film PS1 is exposed from the ONO film ON and the polysilicon film PS2.

Then, the polysilicon film PS1 is processed, thereby to form a gate electrode G2 formed of the polysilicon film PS1 in the peripheral circuit region 1B. In the present embodiment, the gate-last process is not performed, and the gate electrode is not replaced with a metal gate electrode. Accordingly, it is not a dummy gate electrode but a gate electrode G2 forming a MISFET to be formed later that is herein formed in the peripheral circuit region 1B.

Then, the steps as the steps described by reference to FIGS. 11 and 12 are performed. As a result, the top of each semiconductor element is covered with the interlayer insulation film IL1. Then, the top surface of the interlayer insulation film IL1 is polished. The gate-last process is not performed. For this reason, in the subsequent steps, the polishing step described by reference to FIG. 13, and the replacement step of the gate electrode described by reference to FIGS. 14 and 15 are not performed. Further, in the step described by reference to FIG. 11, at respective exposed top surfaces of the control gate electrode CG, the memory gate electrode MG, the first upper electrode UE1, and the second upper electrode UE2, silicide layers S1 are formed, respectively. The polishing step is not performed, and hence the silicide layers S1 and the second upper electrode UE2 are left without being removed even in a later step.

Then, the steps described by reference to FIGS. 16 and 17 are performed. As a result, the semiconductor device of the present embodiment shown in FIGS. 29 and 30 is completed. Herein, the interlayer insulation film IL2 (see FIG. 17) is not formed. Accordingly, over the interlayer insulation film IL1, a first wiring layer is formed not via the interlayer insulation film IL2. In the region not shown in FIG. 30, as shown in FIG. 29, contact plugs CP are electrically coupled with the top surface of the second upper electrode UE2 formed over the semiconductor substrate SB not via the first upper electrode UE1.

Incidentally, when the top surface of the control gate electrode CG is partially covered with the cap insulation film, in the step described by reference to FIG. 6, over the polysilicon film PS1, an insulation film IF5 is formed. Then, in the step described by reference to FIG. 7, the insulation film IF5 is left immediately over the control gate electrode CG, and the portions of the insulation film IF5 in other regions are removed. As a result, the insulation film IF5 is not left between the first upper electrode UE1 and the second upper electrode UE2 formed later.

As shown in FIG. 29, the layout of the capacitor element CE is different from that of the First Embodiment (see FIG. 16) in that the second upper electrode UE2 is formed over the first upper electrode UE1. In a plan view, a part of the second upper electrode UE2 overlaps the region in which the trenches D2 are arranged and the first upper electrode UE1, and other parts thereof overlap the element isolation region EI. In the region immediately over the element isolation region EI, and in which the second upper electrode UE2 and the first upper electrode UE1 do not overlap each other, the top surface of the end of the second upper electrode UE2 is coupled with the contact plugs CP.

The present embodiment can produce roughly the same effects as those in the First Embodiment. However, herein, the step of polishing the top surface of the first upper electrode UE1, and the step of forming a silicide layer S2 (see FIG. 15) over the first upper electrode UE1 by the second salicide process are not performed. This prevents the occurrence of the following problem: a silicide layer is not formed at the top surface of the upper electrode due to the small film thickness of the upper electrode as in Comparative Example described by reference to FIG. 38. Accordingly, the present embodiment does not produce the effect of preventing an increase in coupling resistance between the upper electrode and the contact plug of the effects described in the First Embodiment.

Further, in the present embodiment, the gate-last process is not performed. In other words, the polishing step described by reference to FIG. 13 is not performed. Therefore, the second upper electrode UE2 formed over the first upper electrode UE1 via the ONO film ON can be left. Accordingly, the capacitor element CE is formed of the lower electrode (first electrode) formed of the semiconductor substrate SB, the first upper electrode (second electrode) UE1, and the second upper electrode (third electrode) UE2. This can generate the capacitances at two sites between the lower electrode and the first upper electrode UE1, and between the first upper electrode UE1 and the second upper electrode UE2. Therefore, it is possible to form the capacitor element CE having a small occupying area in a plan view, and having a large capacitance.

Incidentally, herein, a description has been given to the following: the first upper electrode UE1 is formed by patterning, and then, the polysilicon film PS2 is formed; subsequently, the second upper electrode UE2 is formed. However, the first upper electrode UE1 may also be formed by forming the second upper electrode UE2, followed by patterning of the polysilicon film PS1.

Fourth Embodiment

Below, a description will be given to manufacturing steps of a semiconductor device of Fourth Embodiment by reference to FIGS. 31 to 36. FIGS. 31 to 36 are each a cross sectional view for illustrating a method for manufacturing a semiconductor device of the present embodiment. FIGS. 31 to 36 each show, as with FIGS. 1 to 15, and 17, the cross sections of the memory cell region 1A, the peripheral circuit region 1B, and the capacitor element region 1C.

In the First Embodiment, a description has been given to the following: the polysilicon film used for forming the control gate electrode of the MONOS memory fills the inside of each trench of the trench capacitor element, thereby to form the upper electrode of the capacitor element. However, in the present embodiment, the polysilicon film used for forming the memory gate electrode of the MONOS memory fills the trenches, thereby to form the upper electrode.

In the First embodiment, a description has been given to the solution of the problem due to the concave parts formed in the top surface of the upper electrode immediately over the trenches when the film thickness of the polysilicon film to be used for forming the memory gate electrode is small. In contrast, in the present embodiment, a description will be given to the manufacturing steps which can be carried out when the film thickness of the polysilicon film to be used for forming the memory gate electrode can be set large, when the trench width of the trench capacitor element can be made narrow, or in other cases, and when the problems in association with the concave parts are not caused.

Figure 31:
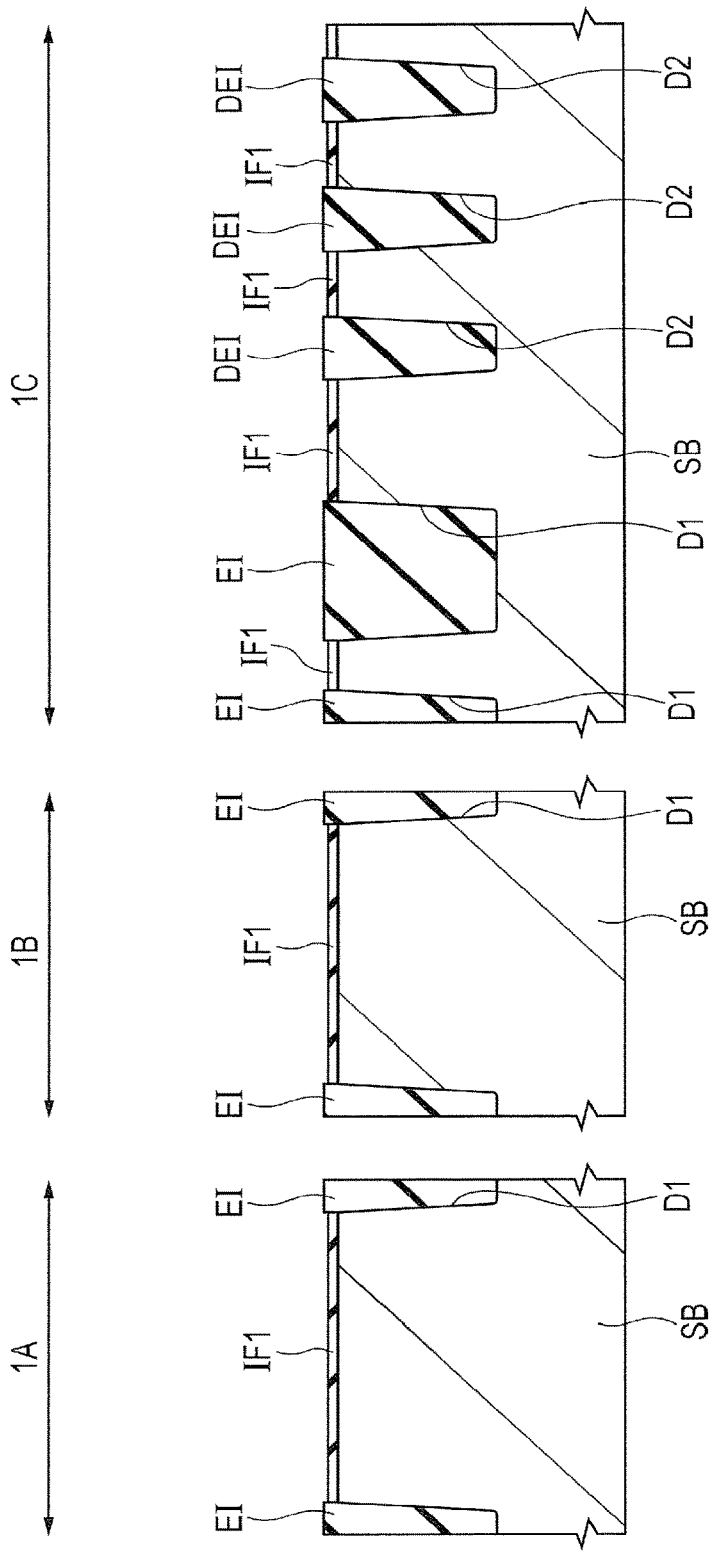
FIG. 31 is a cross sectional view of a semiconductor device of Fourth Embodiment during a manufacturing step.

In the manufacturing steps of the semiconductor device of the present embodiment, first, as shown in FIG. 31, in the top surface of the semiconductor substrate SB, a plurality of trenches D1 and a plurality of trenches D2 are formed. Then, an element isolation region EI is formed in each trench D1, and a dummy element isolation region DEI is formed in each trench D2. The difference from the steps described by reference to FIGS. 1 to 3 is in that the formed insulation film IF2 (see FIG. 3) is removed before the later removal step of the dummy element isolation region DEI.

Figure 32:
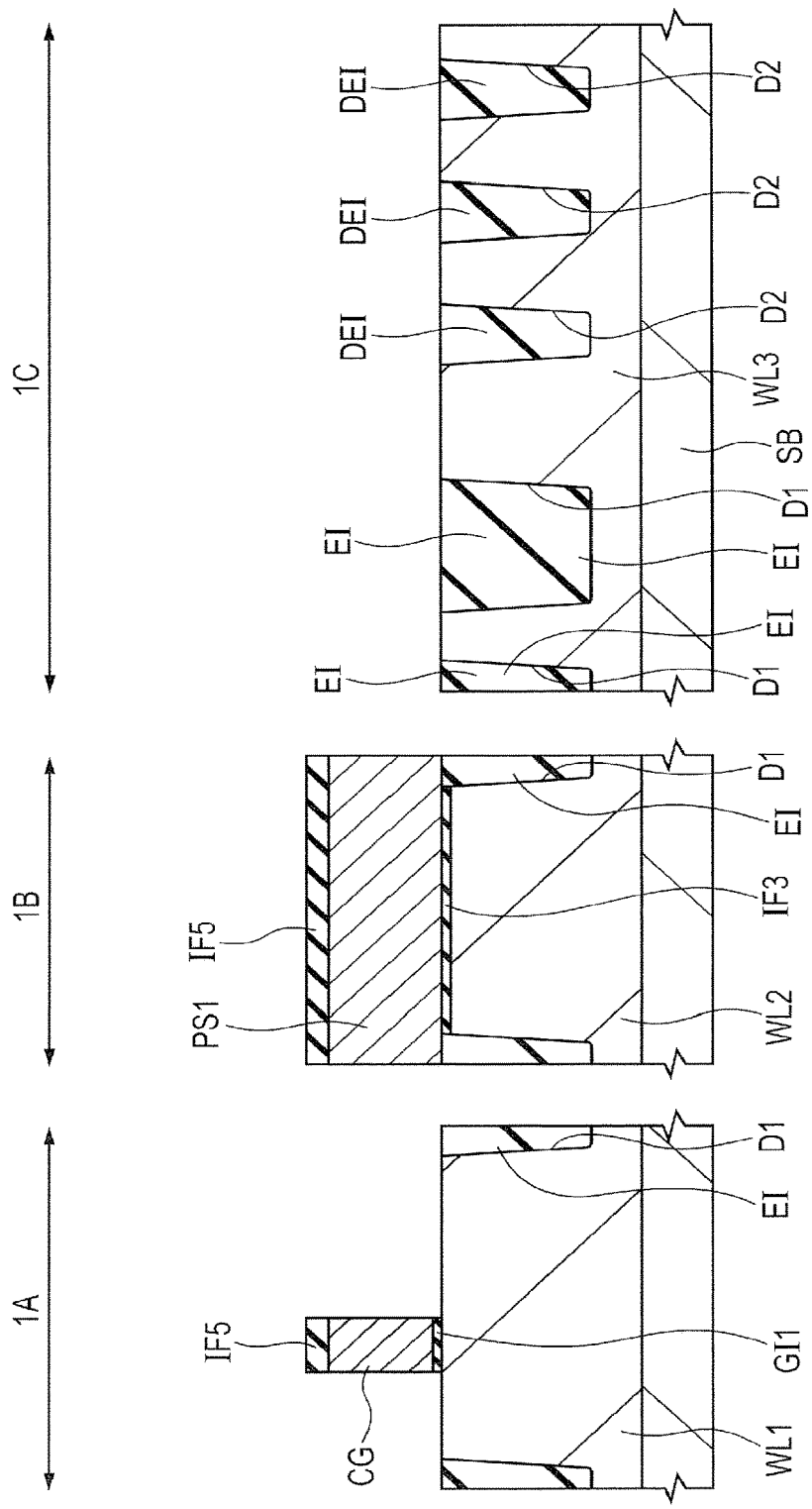
FIG. 32 is a cross sectional view of the semiconductor device during a manufacturing step following FIG. 31.

Then, as shown in FIG. 32, the insulation film IF1 is removed. Subsequently, ion implantation is performed, thereby to form the wells WL1, WL2, and WL3, in the memory cell region LA, the peripheral circuit region 1B, and the capacitor element region 1C, respectively. Then, the main surface of the semiconductor substrate SB is oxidized. As a result, an insulation film IF3 is formed at the top surface of the semiconductor substrate SB in the memory cell region 1A, the peripheral circuit region 1B, and the capacitor element region 1C exposed from the element isolation region EI and the dummy element isolation region DEI. Then, over the main surface of the semiconductor substrate SB, a polysilicon film PS1 and an insulation film IF5 are sequentially formed using, for example, a CVD method.

Subsequently, using a photolithography technology and an etching method, the insulation film IF5, the polysilicon film PS1, and the insulation film IF3 are processed. As a result, in the memory cell region 1A, over the main surface of the semiconductor substrate SB, a control gate electrode CG formed of the polysilicon film PS1 is formed via the gate insulation film GI1. Further, the insulation film IF5, the polysilicon film PS1, and the insulation film IF3 in the capacitor element region 1C are removed by the etching. As a result, the element isolation region EI, the dummy element isolation region DEI, and the semiconductor substrate SB are exposed. Herein, the etching is performed with the peripheral circuit region 1B protected by a photoresist film (not shown). As a result, the polysilicon film PS1, and the like in the peripheral circuit region 1B are not processed, and are left.

Figure 33:
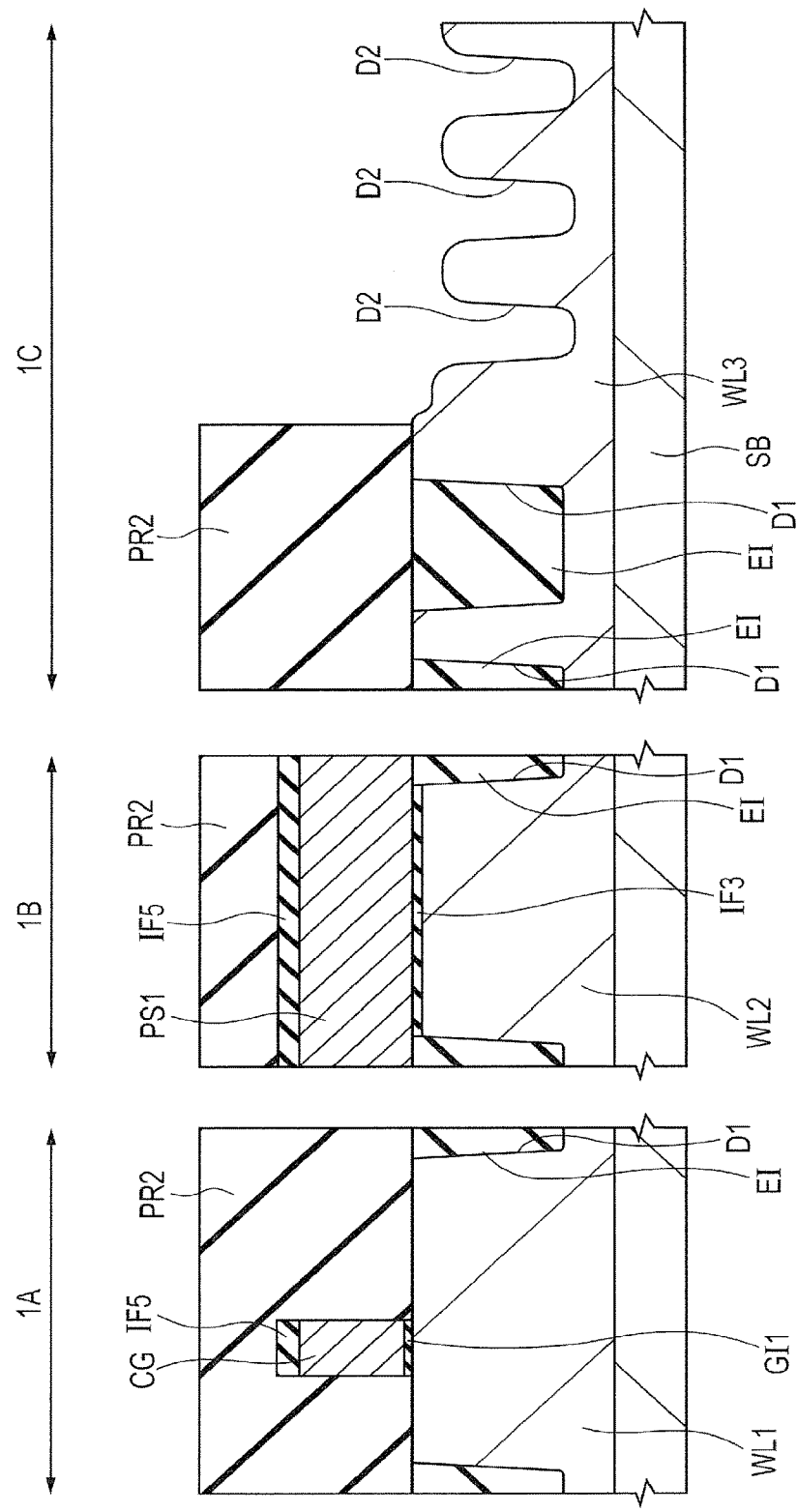
FIG. 33 is a cross sectional view of the semiconductor device during a manufacturing step following FIG. 32.

Then, as shown in FIG. 33, the pattern formed of the photoresist film PR2 formed over the main surface of the semiconductor substrate SB covers the memory cell region 1A and the peripheral circuit region 1B. In the capacitor element region 1C, a part of the main surface of the semiconductor substrate SB and a plurality of dummy element isolation regions DEI are exposed from the photoresist film PR2. In other words, the pattern shape of the photoresist film PR2 is the same as that of the photoresist film PR1 described by reference to FIG. 4, and does not cover the region in which the trenches D2 are arranged.

Subsequently, dry etching is performed using the photoresist film PR2 as a mask, thereby to remove the dummy element isolation regions DEI. As a result, respective sidewalls and bottom surfaces of a plurality of trenches D2 are exposed. Whereas, the main surface of the semiconductor substrate SB in the vicinity of the trench D2 is subjected to dry etching, and hence is reduced in height in a retreated form. Further, the corner part of the sidewall top of the trench D2, and the corner part of the bottom surface end of the trench D2 are both rounded.

Figure 34:
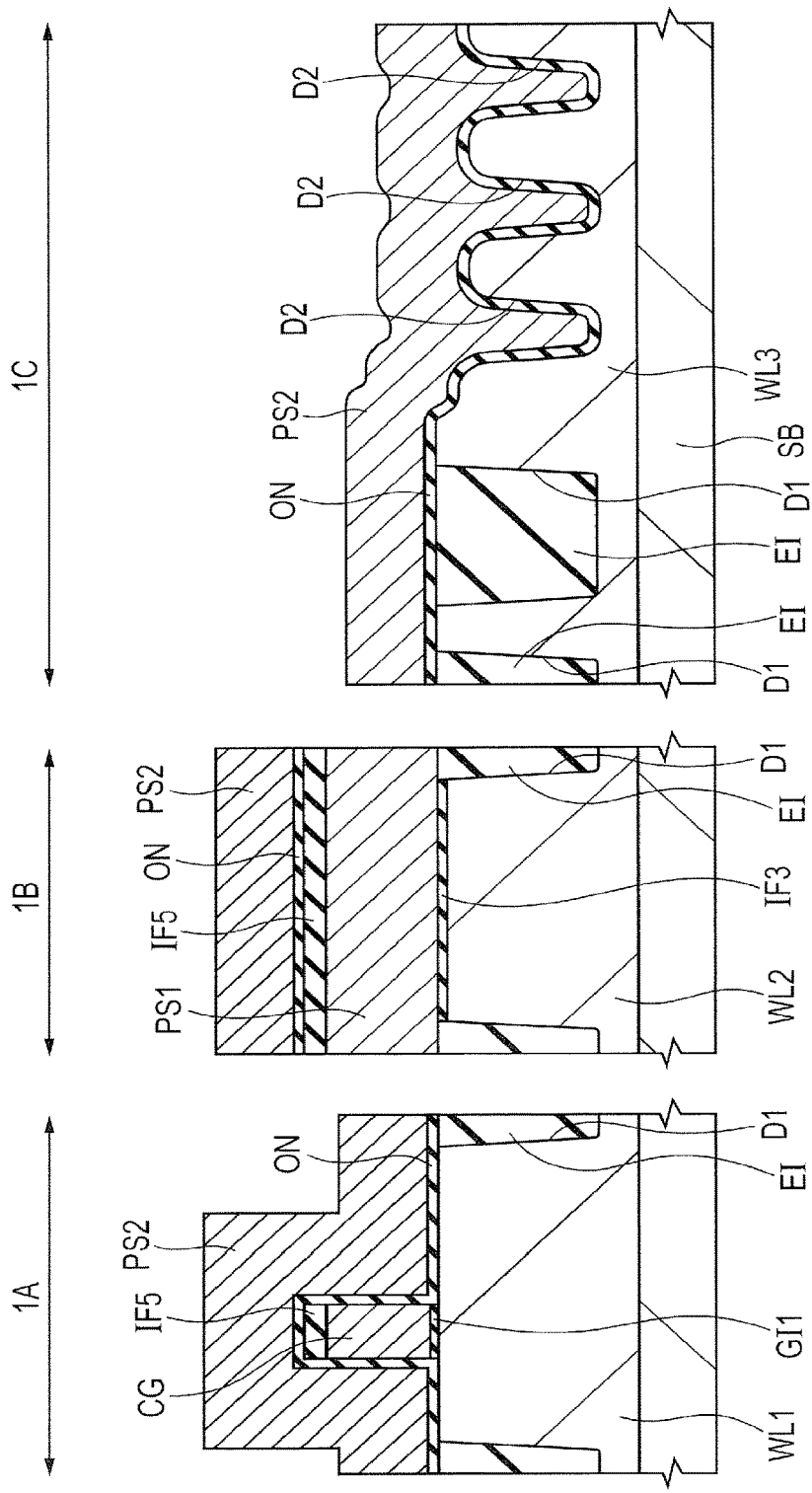
FIG. 34 is a cross sectional view of the semiconductor device during a manufacturing step following FIG. 33.

Then, as shown in FIG. 34, the photoresist film PR2 is removed. Then, over the semiconductor substrate SB, using, for example, a CVD method, an ONO film ON and a polysilicon film PS2 are sequentially formed. As a result, in the memory cell region 1A, the sidewall and the top surface of the lamination film formed of the gate insulation film GI1, the control gate electrode CG, and the insulation film IF5 are covered with the ONO film ON and the polysilicon film PS2.

Whereas, in the peripheral circuit region 1B, the top surface of the insulation film IF5 is covered with the ONO film ON and the polysilicon film PS2. Further, respective top surfaces of the element isolation regions EI and the semiconductor substrate SB in the memory cell region 1A and the peripheral circuit region 1B are covered with the ONO film ON and the polysilicon film PS2.

Whereas, in the capacitor element region 1C, the top surface of each element isolation region EI, and the top surface of the semiconductor substrate SB including the sidewall and the bottom surface of each trench D2 are covered with the ONO film ON and the polysilicon film PS2. The ONO film ON does not fully fill the trench D2. The ONO film ON and the polysilicon film PS2 fully fill the trench D2. In other words, as distinct from Comparative Example described by reference to FIG. 38, the polysilicon film PS2 has a film thickness of ½ the open width of the trench D, or more.

For this reason, the concave formed in the top surface of the polysilicon film PS2 immediately over each trench D2 is smaller and shallower than when the polysilicon film PS2 cannot fully fill the trench D2.

Figure 35:
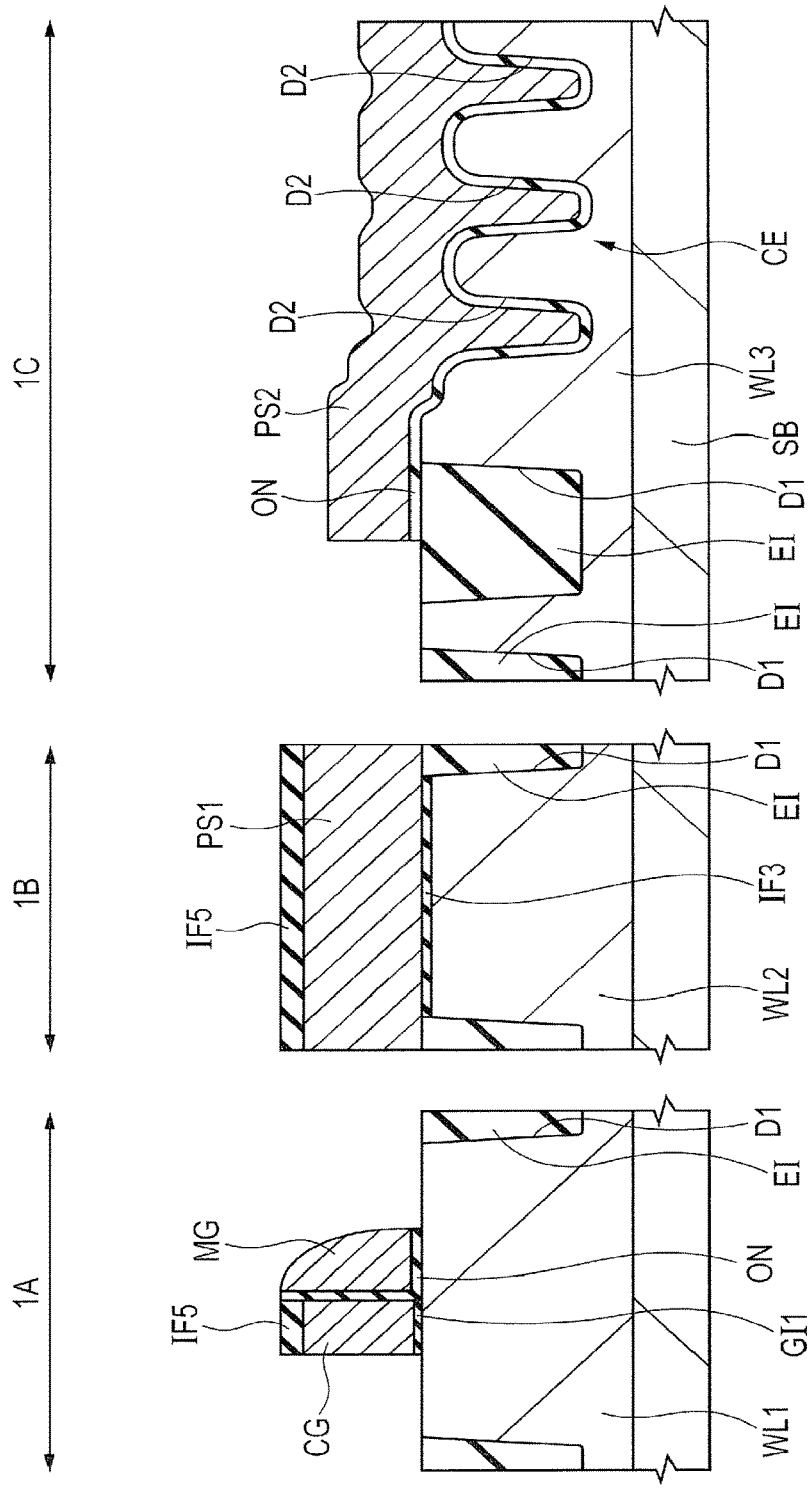
FIG. 35 is a cross sectional view of the semiconductor device during a manufacturing step following FIG. 34.

Then, as shown in FIG. 35, using a photolithography technology and a dry etching method, respective portions of the polysilicon film PS2 and the ONO film ON are removed, respectively. As a result, in the memory cell region 1A, a memory gate electrode MG is formed as with the structure described by reference to FIG. 9. In the peripheral circuit region 1B, the polysilicon film PS2 and the ONO film ON are removed, so that the top surface of the insulation film IF5 is exposed.

In the capacitor element region 1C, an upper electrode UE formed of the polysilicon film PS2 partially embedded in a plurality of trenches D2 is formed. As a result, in the capacitor element region 1C, a capacitor element CE including the upper electrode UE, and the lower electrode formed of the semiconductor substrate SB (well WL3) immediately thereunder is formed. In other words, in the capacitor element region 1C, the ONO film ON and the polysilicon film PS2 (see FIG. 34) immediately over the region in which the trenches D2 are arranged are left; and the ONO film ON and the polysilicon film PS2 in other regions are removed. As a result, the top surface of the element isolation region EI and the top surface of the semiconductor substrate SB are partially exposed from the ONO film ON and the polysilicon film PS2.

In the capacitor element region 1C, the lamination film formed of the ONO film ON and the upper electrode UE is terminated immediately over the element isolation region EI adjacent to the trench D2. The sidewall and the bottom surface of each trench D2 remains covered with the lamination film. Between the element isolation region EI, and another element isolation region EI adjacent to the element isolation region EI, the main surface of the semiconductor substrate SB is exposed from the lamination film.

Figure 36:
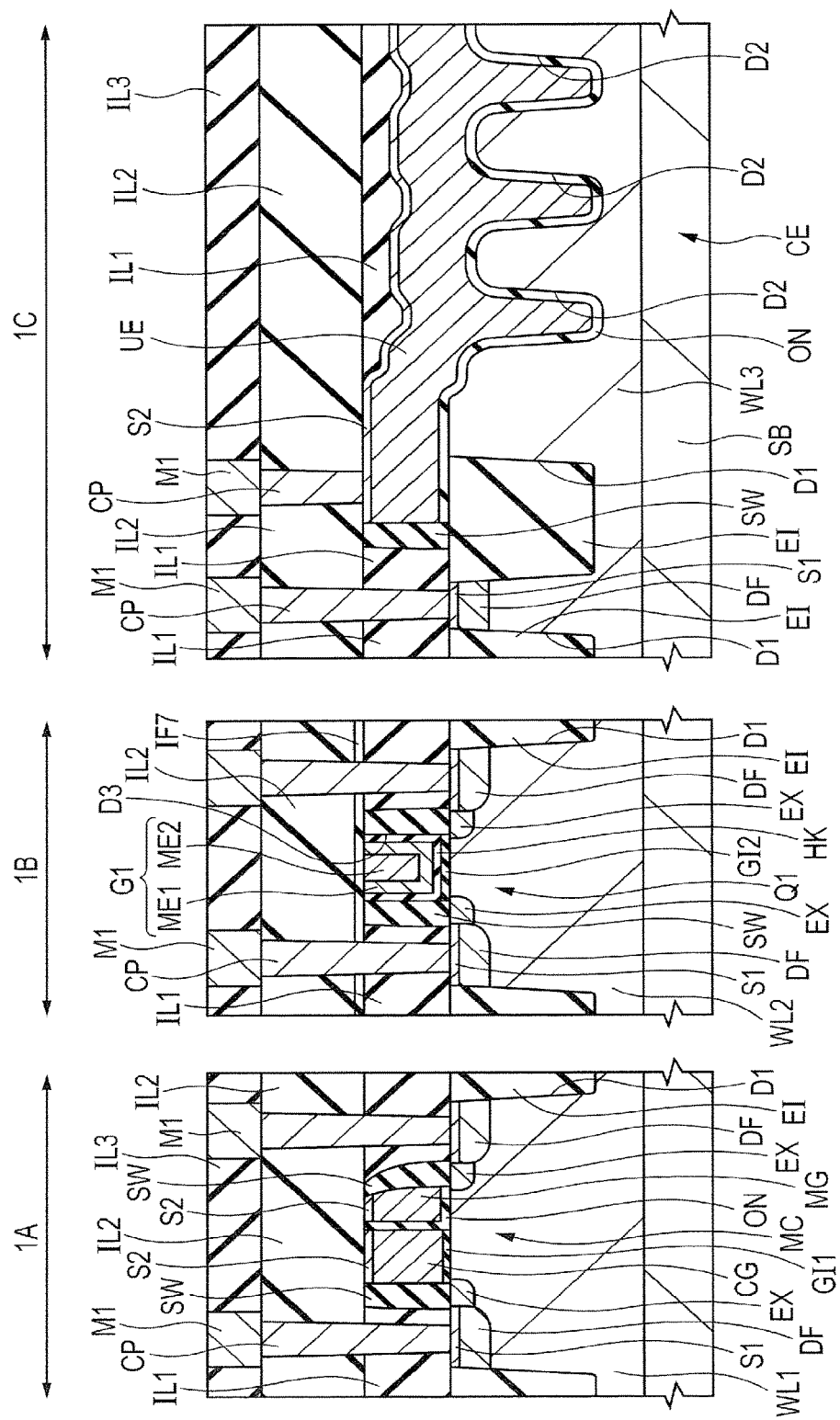
FIG. 36 is a cross sectional view of the semiconductor device during a manufacturing step following FIG. 35.

Then, as shown in FIG. 36, using a photolithography technology and an etching method, the lamination film formed of the insulation film IF3, the polysilicon film PS1, and the insulation film IF5 in the peripheral circuit region 1B is processed. This results in the formation of a dummy gate electrode formed of the gate insulation film GI2 formed of the insulation film IF3, and the polysilicon film PS1. Then, the same steps as the steps described by reference to FIGS. 11 to 17 are performed, thereby to complete the semiconductor device of the present embodiment. In other words, the MISFET Q1 in the peripheral circuit region 1B is formed using the gate-last process.

When the polishing step is performed in the same manner as with the step described by reference to FIG. 13 of the steps described up to this point, respective top surfaces of the control gate electrode CG, the dummy gate electrode, and the upper electrode UE are polished and exposed. Herein, in the present embodiment, the film thickness of the polysilicon film PS2 (see FIG. 34) is relatively larger. For this reason, the upper electrode UE formed of the polysilicon film PS2 has a film thickness enough to be exposed from the interlayer insulation film IL1 by the polishing step. This can prevent the following: in the polishing step, the upper electrode UE is not exposed from the interlayer insulation film IL1; and a silicide layer S2 is not formed at the top surface of the upper electrode UE.

Herein, the upper electrode UE is exposed from the element isolation region EI immediately over the element isolation region EI. In other words, a silicide layer S2 is formed at the surface of the upper electrode UE immediately over the element isolation region EI. The silicide layer S2 is coupled with the contact plug CP. In contrast, in the active region of the capacitor element CE, i.e., the region in which the trenches D2 are arranged, the top surface of the semiconductor substrate SB is reduced in height by the dry etching step described by reference to FIG. 33, and, small concave parts are formed in the top surface of the upper electrode UE embedded in the trench D2. As a result, the top surface of the upper electrode UE immediately over the region is covered with the interlayer insulation film IL1.

Namely, immediately over the region, the interlayer insulation film IL1 is interposed between the upper electrode UE and the interlayer insulation film IL2. In other words, in the polishing step described by reference to FIG. 13, the top surface of the upper electrode UE in the region is not exposed from the interlayer insulation film IL1. Accordingly, a silicide layer S2 is not formed at the top surface of the upper electrode UE in the region. However, the top surface of the upper electrode UE immediately over the region in which the trenches D2 are arranged is not the site for ensuring a coupling with the contact plug CP. For this reason, it does not matter if the silicide layer S2 is not formed.

As described up to this point, in the case where the film thickness of the polysilicon film PS2 to be used for forming the memory gate electrode MG (see FIG. 34) can be increased, or in other cases, even when the upper electrode UE is formed of the polysilicon film PS2, the trench D2 can be fully filled, and a silicide layer S2 can be formed at at least a part of the top surface over the upper electrode UE. Accordingly, the flatness of the top surface of the upper electrode UE can be improved. Further, the concave parts are increased in depth, which can prevent the formation of a residue or a cavity in each of the concave parts. Therefore, roughly the same effects as those of the First Embodiment can be obtained. This can prevent the reduction of the reliability of the semiconductor device.

Regarding Modified Example

Figure 37:
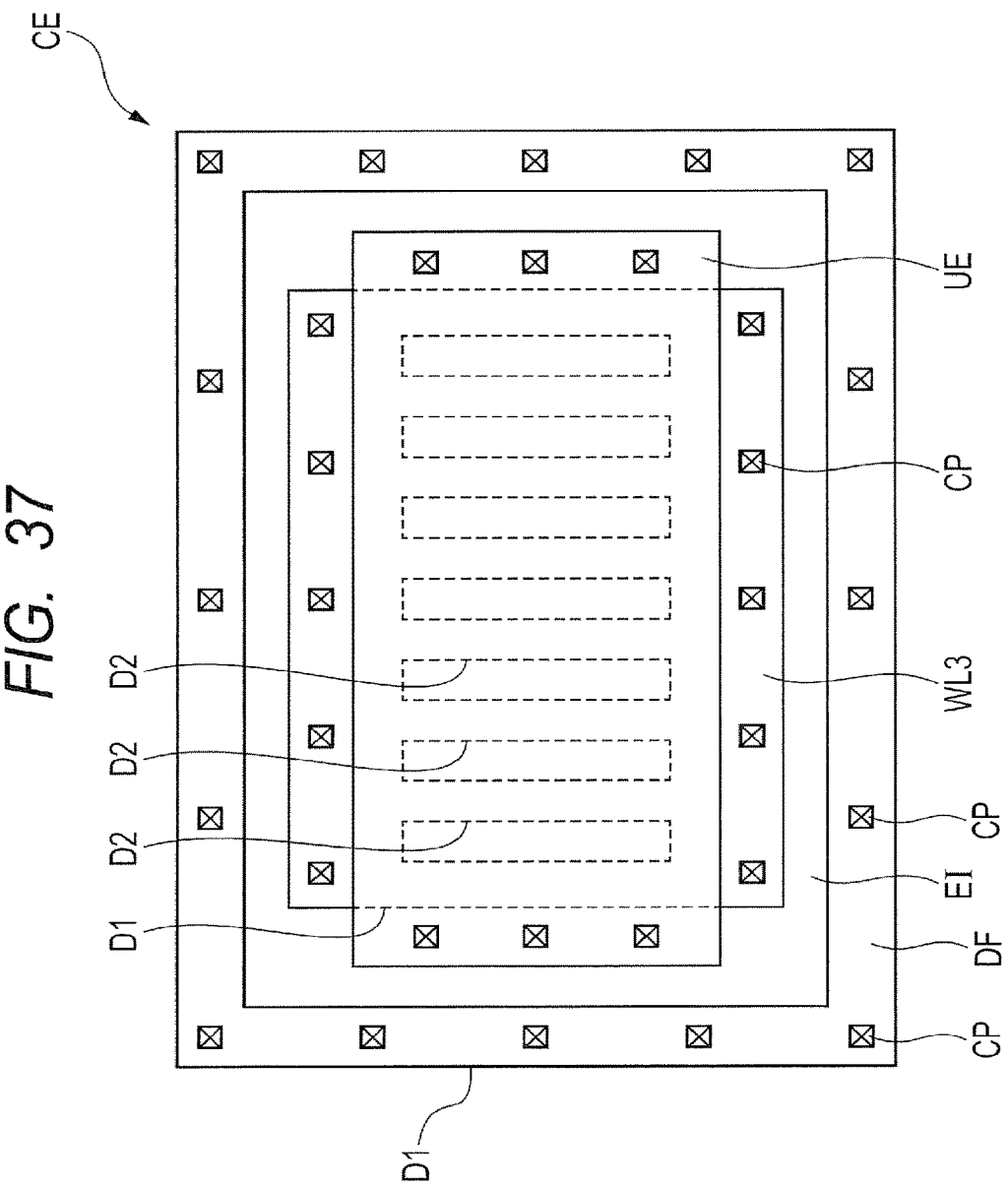
FIG. 37 is a planar layout of Modified Example of the semiconductor device of Fourth Embodiment during a manufacturing step.

FIG. 37 shows a planar layout of a capacitor element CE as Modified Example of the present embodiment. The layout shown in FIG. 37 is different from the layout shown in FIG. 16, particularly, in that the layout of the region in which the trenches D2 are arrayed, i.e., the active region of the capacitor element CE has a larger width in the transverse direction (the longitudinal direction of the drawing) than the width of the upper electrode UE.

In other words, the top surfaces of the portions of the active region surrounded by the annular element isolation region EI are exposed from the upper electrode UE. The top surfaces of the exposed portions of the well WL3 formed in the active region are coupled with a plurality of contact plugs CP for feeding a current to the lower electrode. Incidentally, in a plan view, the top surface of the $n^+$ type semiconductor region DF outside the annular element isolation region EI is also coupled with a plurality of contact plugs CP for feeding a current to the lower electrode.

Thus, not limited to the layout shown in FIG. 16, as shown in FIG. 37, the active region surrounded by the annular element isolation region EI can also be coupled with the contact plugs CP. This layout is also applicable to the First to Third Embodiments. When this layout is applied to the Third Embodiment, the coupling region of the contact plugs CP to the active region surrounded by the annular element isolation region EI is provided in the region not overlying any of the first upper electrode UE1 and the second upper electrode UE2 (see FIG. 29) in a plan view.

Up to this point, the present invention completed by the present inventors was specifically described by way of the embodiments. However, it is naturally understood that the present invention is not limited to the embodiments, and may be variously changed within the scope not departing from the gist thereof.

Besides, a part of the contents described in the embodiments will be described below.

(1) A method for manufacturing a semiconductor device, includes the steps of:

(a) providing a semiconductor substrate having a first region and a second region arranged along a main surface, (b) forming a first trench in the main surface of the semiconductor substrate in the second region, (c) covering the sidewall and the bottom surface of the first trench with a first insulation film, (d) after the step (c), forming a first conductor film over the main surface of the semiconductor substrate in the first region and the second region, and thereby embedding the first conductor film in the first trench via the first insulation film, (e) processing the first conductor film, and thereby forming a control gate electrode formed of the first conductor film over the main surface of the semiconductor substrate in the first region, (f) forming a memory gate electrode at the sidewall of the control gate electrode via a second insulation film having a charge accumulation part in the inside thereof, (g) processing the first conductor film, and thereby forming a first electrode formed of the first conductor film filling the first trench in the second region, and (h) after the step (f), forming a pair of first source/drain regions in the main surface of the semiconductor substrate in the first region.

In the method, the control gate electrode, the memory gate electrode, and the pair of first source/drain regions form a memory cell of a nonvolatile memory, and the first electrode and the semiconductor substrate under the first electrode form a capacitor element.

(2) In the method for manufacturing a semiconductor device according to the item (1), in the step (c), the sidewall and the bottom surface of the first trench are covered with a first insulation film formed by an oxidation method.

(3) In the method for manufacturing a semiconductor device according to the item (1), in the step (c), the sidewall and the bottom surface of the first trench are covered with a first insulation film formed by a deposition method.

(4) In the method for manufacturing a semiconductor device according to the item (1), the step (c) includes the steps of:

(c1) oxidizing the sidewall and the bottom surface of the first trench, and forming a sixth insulation film, and (c2) depositing a seventh insulation film over the sidewall and the bottom surface of the first trench, and thereby covering the sidewall and the bottom surface of the first trench with the first insulation film formed of the sixth insulation film and the seventh insulation film.

(5) The method for manufacturing a semiconductor device according to the item (1), further includes the steps of:

(b1) after the step (b), embedding a third insulation film in the first trench, and (b2) before the step (c), removing the third insulation film in the first trench by isotropic etching.

What is claimed is:
1. A method for manufacturing a semiconductor device, comprising:
(a) providing a semiconductor substrate having a main surface, the main surface including a memory cell forming region and a capacitor element forming region;
(b) forming a first conductor film over the main surface of the semiconductor substrate via a first insulation film in the memory cell forming region;
(c) patterning the first conductor film to form a control gate electrode formed of the first conductor film over the main surface of the semiconductor substrate via the first insulation film in the memory cell forming region;
(d) after (c), forming a trench in the main surface of the semiconductor substrate in the capacitor element forming region;
(e) forming a second insulation film, having a charge accumulation film, on an upper surface of the trench and the control gate electrode;
(f) after (e), forming a second conductor film on the second insulation film to cover the trench and the control gate electrode;
(g) subjecting the second conductor film to an etching process, to form a memory gate electrode formed of the second conductor film in the memory cell forming region and a first electrode formed of the second conductor film in the capacitor element forming region;
(h) after (g), forming a pair of first source and drain regions in the main surface of the semiconductor substrate defined by the control gate electrode and the memory gate electrode in the memory cell forming region; and
(i) forming a first plug over the first electrode and a second plug over the main surface of the semiconductor substrate, the first and second plug electrically coupled with the first electrode and the main surface of the semiconductor substrate, respectively,
wherein the control gate electrode, the memory gate electrode and the pair of first source and drain regions form a memory cell of a nonvolatile memory, and
wherein the first electrode, the second insulation film and the semiconductor substrate under the first electrode form a capacitor element.

2. The method of manufacturing a semiconductor device according to claim 1, wherein the second conductor film has a film thickness that is at least half of a dimension of an open width of the trench.

3. The method of manufacturing a semiconductor device according to claim 1,
wherein a film thickness of the second conductor film is smaller than a film thickness of the first conductor film.

4. The method of manufacturing a semiconductor device according to claim 1,
wherein (f) includes embedding a part of the second conductor film in the trench.

* * * * *